US012745460B2

(12) United States Patent
Xiao et al.

(10) Patent No.: US 12,745,460 B2
(45) Date of Patent: Sep. 22, 2026

(54) DISPLAY SUBSTRATE WITH MULTIPLE DIFFERENT CIRCUIT REGIONS AND PREPARATION METHOD THEREFOR, AND DISPLAY APPARATUS

(71) Applicant: BOE Technology Group Co., Ltd., Beijing (CN)

(72) Inventors: Li Xiao, Beijing (CN); Yan Qu, Beijing (CN); Haoliang Zheng, Beijing (CN); Jiao Zhao, Beijing (CN); Yuzhen Guo, Beijing (CN); Xiaorong Cui, Beijing (CN); Chenyang Zhang, Beijing (CN); Minghua Xuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 367 days.

(21) Appl. No.: 18/555,548

(22) PCT Filed: Dec. 22, 2022

(86) PCT No.: PCT/CN2022/141002

§ 371 (c)(1),
(2) Date: Oct. 16, 2023

(87) PCT Pub. No.: WO2024/130634

PCT Pub. Date: Jun. 27, 2024

(65) Prior Publication Data

US 2025/0081610 A1 Mar. 6, 2025

(51) Int. Cl.
*H10D 86/60* (2025.01)
*G09G 3/32* (2016.01)
(Continued)

(52) U.S. Cl.
CPC ............... *H10D 86/60* (2025.01); *G09G 3/32* (2013.01); *H10D 86/021* (2025.01); *H10D 86/441* (2025.01); *G09G 2300/0426* (2013.01)

(58) Field of Classification Search
None
See application file for complete search history.

(56) References Cited

U.S. PATENT DOCUMENTS

2017/0345373 A1 11/2017 Kang et al.
2018/0011504 A1 1/2018 Tanaka et al.
(Continued)

FOREIGN PATENT DOCUMENTS

CN 104269428 A 1/2015
CN 110706599 A 1/2020
(Continued)

OTHER PUBLICATIONS

European Search Report for 22968932.8 Mailed Apr. 8, 2025.

*Primary Examiner* — Daniel Whalen

(57) ABSTRACT

Disclosed are a display substrate and a preparation method therefor, and a display apparatus. The display substrate includes a plurality of first circuit regions and a plurality of second circuit regions alternately disposed along a second direction, a first circuit region includes a plurality of repeat units (RU) and a plurality of blank units (KB) alternately disposed along a first direction, a repeat unit (RU) includes a plurality of circuit units (Q), a circuit unit (Q) includes a pixel drive circuit and a data signal line (DataI) connected with the pixel drive circuit, a second circuit region includes at least one gate unit (G), the gate unit includes at least one gate drive circuit, and an orthographic projection of the gate drive circuit on a plane of the display substrate is not overlapped with an orthographic projection of the data signal line (DataI) on the plane of the display substrate.

18 Claims, 28 Drawing Sheets

(51) Int. Cl.

| | |
|---|---|
| ***H10D 86/01*** | (2025.01) |
| ***H10D 86/40*** | (2025.01) |

(56) References Cited

U.S. PATENT DOCUMENTS

| | | | | |
|---|---|---|---|---|
| 2018/0138256 | A1 | 5/2018 | Han et al. | |
| 2021/0375197 | A1 | 12/2021 | Dai et al. | |
| 2022/0180816 | A1 | 6/2022 | Yuan et al. | |
| 2022/0199735 | A1 | 6/2022 | Wang et al. | |
| 2022/0208130 | A1* | 6/2022 | Park | G09G 3/3291 |
| 2022/0351683 | A1 | 11/2022 | Xiao et al. | |
| 2023/0351943 | A1 | 11/2023 | Xiao et al. | |
| 2023/0360586 | A1 | 11/2023 | Xiao et al. | |

FOREIGN PATENT DOCUMENTS

| | | | |
|---|---|---|---|
| CN | 111816123 | A | 10/2020 |
| CN | 113223420 | A | 8/2021 |
| CN | 113362770 | A | 9/2021 |
| CN | 113936584 | A | 1/2022 |
| CN | 114120905 | A | 3/2022 |
| CN | 115440747 | A | 12/2022 |
| CN | 115668344 | A | 1/2023 |
| CN | 114766048 | B | 8/2023 |
| CN | 115485763 | B | 3/2024 |
| EP | 3196941 | A1 | 7/2017 |
| KR | 10-2017-0051797 | A | 5/2017 |
| WO | 2021217413 | A1 | 11/2021 |
| WO | 2021253344 | A1 | 12/2021 |
| WO | 2022183343 | A1 | 9/2022 |

* cited by examiner

DISPLAY SUBSTRATE WITH MULTIPLE DIFFERENT CIRCUIT REGIONS AND PREPARATION METHOD THEREFOR, AND DISPLAY APPARATUS

CROSS-REFERENCE TO RELATED APPLICATION

The present application is a U.S. National Phase Entry of International Application No. PCT/CN2022/141002 having an international filing date of Dec. 22, 2022, contents of which are hereby incorporated by reference.

TECHNICAL FIELD

The present disclosure relates to, but is not limited to, the field of display technologies, and particularly to a display substrate and a preparation method therefor, and a display apparatus.

BACKGROUND

A semiconductor Light Emitting Diode (LED) technology has developed for nearly 30 years, from an initial solid-state lighting power supply to a backlight in the display field, and then to an LED display screen, providing a solid foundation for its wider applications. With development of chip manufacturing and encapsulation technologies, Mini Light Emitting Diode (Mini LED) display and Micro Light Emitting Diode (Micro LED) display have gradually become a hot spot in a display panel, and may be used in fields such as Augmented Reality/Virtual Reality (AR/VR), Television (TV), and outdoor display.

At present, although a display market is dominated by two technologies of Liquid Crystal Display (LCD) and Organic Light Emitting Diode (OLED) display, due to limitations of a substrate size, a preparation device, and a process, etc., it is difficult for LCD and OLED to achieve large-size display, especially large-size display above 110 inches. In contrast, Micro LED display/Mini LED display may achieve large-size display by means of splicing, which can break a size limitation. Since LED has advantages of self-luminescence, a wide viewing angle, fast response, a simple structure, a small volume, lightness and thinness, energy saving, high efficiency, long life, and clear light, etc., it is easier to achieve high Pixels Per Inch (PPI), so it is considered as the most competitive next-generation display technology.

SUMMARY

The following is a summary of subject matters described herein in detail. The summary is not intended to limit the protection scope of claims.

In one aspect, an embodiment of the present disclosure provides a display substrate including a plurality of first circuit regions and a plurality of second circuit regions alternately disposed along a second direction, wherein a first circuit region includes a plurality of repeat units and a plurality of blank units alternately disposed along a first direction, the first direction and the second direction intersect; a repeat unit includes a plurality of circuit units, wherein a circuit unit includes a pixel drive circuit, and a data signal line and a drive signal line connected with the pixel drive circuit; a second circuit region includes at least one gate unit, the gate unit includes at least one gate drive circuit connected with a drive signal line in an adjacent circuit unit, an orthographic projection of the gate drive circuit on a plane of the display substrate is not overlapped with an orthographic projection of the data signal line on the plane of the display substrate.

In an exemplary implementation mode, at least one second circuit region has a reference line that is a straight line bisecting the second circuit region in the second direction and extending along the first direction; an orthographic projection of at least one gate drive circuit on the reference line is at least partially overlapped with an orthographic projection of at least one blank unit on the reference line.

In an exemplary implementation mode, at least one gate drive circuit is further connected with a clock signal line, a high voltage line, and a low voltage line; in the first direction, the clock signal line is disposed between the high voltage line and the low voltage line, and an orthographic projection of the clock signal line on the plane of the display substrate is not overlapped with the orthographic projection of the data signal line on the plane of the display substrate.

In an exemplary implementation mode, in the first direction, the data signal line is disposed on a side of the high voltage line away from the clock signal line, or the data signal line is disposed on a side of the low voltage line away from the clock signal line.

In an exemplary implementation mode, in the first direction, there is a first distance between an edge on a side of the high voltage line close to the data signal line and an edge on a side of the data signal line close to the high voltage line, and there is a second distance between an edge on a side of the low voltage line close to the data signal line and an edge on a side of the data signal line close to the low voltage line, and the second distance is greater than the first distance.

In an exemplary implementation mode, the first distance is greater than or equal to 25 μm and the second distance is greater than or equal to 25 μm.

In an exemplary implementation mode, the clock signal line includes a first clock signal line and a second clock signal line, the second clock signal line is disposed on a side of the first clock signal line away from the low voltage line; there is a third distance between an edge on a side of the first clock signal line close to the low voltage line and an edge on a side of the low voltage line close to the first clock signal line, and there is a fourth distance between an edge on a side of the second clock signal line close to the high voltage line and an edge on a side of the high voltage line close to the second clock signal line, and the third distance is greater than the fourth distance.

In an exemplary implementation mode, at least one drive signal line is connected with one gate drive circuit, the gate drive circuit is disposed in a first midline region of the second circuit region, and is connected with a first midpoint region of the drive signal line through an output line; the first midline region is a region containing a first midline, the first midpoint region is a region containing a first midpoint, widths of the first midline region and the first midpoint region in the first direction are 1% to 10% of a width of the display substrate, the first midline is a straight line bisecting the second circuit region in the first direction and extending along the second direction, the first midpoint is a point bisecting the drive signal line in the first direction, and the width of the display substrate is a size of the display substrate in the first direction.

In an exemplary implementation mode, at least one drive signal line is respectively connected with a first gate drive circuit and a second gate drive circuit, the first gate drive circuit is disposed in a second midline region of the second circuit region and connected with a second midpoint region of the drive signal line through an output line, the second gate drive circuit is disposed in a third midline region of the second circuit region and connected with a third midpoint region of the drive signal line through an output line; the second midline region is a region containing a second midline, the third midline region is a region containing a third midline, the second midpoint region is a region containing a second midpoint, the third midpoint region is a region containing a third midpoint, and widths of the second midline region, the third midline region, the second midpoint region, and the third midpoint region in the first direction X are 1% to 10% of a width of the display substrate; the second circuit region includes a first midline bisecting the second circuit region in the first direction and extending along the second direction, the first midline divides the second circuit region into a first region and a second region, the second midline is a straight line bisecting the first region in the first direction and extending along the second direction, and the third midline is a straight line bisecting the second region in the first direction and extending along the second direction; the drive signal line includes a first midpoint bisecting the drive signal line in the first direction, the first midpoint divides the drive signal line into a first line segment and a second line segment, the second midpoint is a point bisecting the first line segment in the first direction, and the third midpoint is a point bisecting the second line segment in the first direction.

In an exemplary implementation mode, at least one second circuit region has a reference line that is a straight line bisecting the second circuit region in the second direction and extending along the first direction, and pixel drive circuits in first circuit regions on both sides of the second circuit region in the second direction are mirror-symmetrical with respect to the reference line.

In an exemplary implementation mode, at least one second circuit region further includes at least one first mark, and an orthographic projection of at least one first mark on the reference line is at least partially overlapped with an orthographic projection of at least one blank unit on the reference line.

In an exemplary implementation mode, at least one second circuit region further includes at least one second mark, and an orthographic projection of at least one second mark on the reference line is at least partially overlapped with an orthographic projection of at least one blank unit on the reference line.

In an exemplary implementation mode, an orthographic projection of the second mark on the plane of the display substrate is not overlapped with orthographic projections of the data signal line, the drive signal line, and the clock signal line on the plane of the display substrate.

In an exemplary implementation mode, on a plane perpendicular to the display substrate, the display substrate includes a first gate metal layer, a second gate metal layer, a first source-drain metal layer, and a second source-drain metal layer that are sequentially disposed on a base substrate, the drive signal line is disposed in the second gate metal layer, and the data signal line and the clock signal line are disposed in the first source-drain metal layer.

In an exemplary implementation mode, at least one second circuit region further includes at least one first mark and at least one second mark, the first mark is disposed in the first source-drain metal layer, and the second mark is disposed in the second source-drain metal layer.

In an exemplary implementation mode, the display substrate further includes a first planarization layer and a first passivation layer, the first planarization layer is disposed on a side of the first source-drain metal layer away from the base substrate, and the first passivation layer is disposed on a side of the first planarization layer away from the base substrate, and the second source-drain metal layer is disposed on a side of the first passivation layer away from the base substrate; the first planarization layer is provided with a first mark hole exposing the first mark, an orthographic projection of the first mark hole on a plane of a base substrate contains an orthographic projection of the first mark on the plane of the base substrate, and the first passivation layer covers the first mark in the first mark hole.

In an exemplary implementation mode, the display substrate further includes a second passivation layer and a second planarization layer, the second passivation layer is disposed on a side of the second source-drain metal layer away from the base substrate, and the second planarization layer is disposed on a side of the second passivation layer away from the base substrate; the second planarization layer is provided with a second mark hole and a third mark hole, the second mark hole exposes the second passivation layer covering the second mark, an orthographic projection of the second mark hole on the plane of the base substrate contains an orthographic projection of the second mark on the plane of the base substrate, the third mark in hole exposes the second passivation layer covering the first mark, and an orthographic projection of the third mark hole on the plane of the base substrate contains an orthographic projection of the first mark on the plane of the base substrate.

In another aspect, the present disclosure also provides a display apparatus including the display substrate described above.

In yet another aspect, the present disclosure also provides a preparation method of a display substrate, the display substrate includes a plurality of first circuit regions and a plurality of second circuit regions alternately disposed along a second direction, a first circuit region includes a plurality of repeat units and a plurality of blank units alternately disposed along a first direction, a repeat unit includes a plurality of circuit units, a second circuit region includes at least one gate unit, the first direction and the second direction intersect; the preparation method includes: forming a pixel drive circuit, and a data signal line and a drive signal line connected with the pixel drive circuit in a circuit unit, and forming at least one gate drive circuit and a clock signal line connected with the gate drive circuit in the gate unit, wherein the gate drive circuit is connected with a drive signal line in an adjacent circuit unit, and an orthographic projection of the data signal line on a plane of the display substrate is not overlapped with an orthographic projection of the clock signal line on the plane of the display substrate.

Other aspects may be understood upon reading and understanding drawings and detailed description.

BRIEF DESCRIPTION OF DRAWINGS

Accompanying drawings are used for providing further understanding of technical solutions of the present disclosure, constitute a part of the specification, and are used for explaining the technical solutions of the present disclosure together with embodiments of the present disclosure, but do not constitute limitations on the technical solutions of the present disclosure. Shapes and sizes of one or more components in the drawings do not reflect actual scales, and are only intended to schematically describe contents of the present disclosure.

Reference signs are described as follows.

| | | |
|---|---|---|
| AT1-first active layer; | AT2-second active layer; | AT3-third active layer; |
| AT4-fourth active layer; | AT5-fifth active layer; | AT6-sixth active layer; |
| AT7-seventh active layer; | AT8-eighth active layer; | AT9-ninth active layer; |
| AT10-tenth active layer; | AT11-eleventh active layer; | AT21-twenty-first active layer; |
| AT22-twenty-second active layer; | AT23-twenty-third active layer; | AT24-twenty-fourth active layer; |
| AT25-twenty-fifth active layer; | AT26-twenty-sixth active layer; | AT27-twenty-seventh active layer; |
| AT28-twenty-eighth active layer; | CF1-first electrode plate; | CF2-second electrode plate; |
| CF3-third electrode plate; | CF4-fourth electrode plate; | CF5-fifth electrode plate; |
| CF6-sixth electrode plate; | CF7-seventh electrode plate; | CF8-eighth electrode plate; |
| CF9-ninth electrode plate; | CF11-eleventh electrode plate; | CF12-twelfth electrode plate; |
| CF13-thirteenth electrode plate; | CF14-fourteenth electrode plate; | Cs-storage capacitor; |
| C1-first capacitor; | C2-second capacitor; | CT1-first control line; |
| CT2-second control line; | CLK-first clock signal line; | CLKB-second clock signal line; |
| DataI-data signal line; | DataT-time-length signal line; | EM-light emitting signal line; |
| Gate1-first gate electrode; | Gate2-second gate electrode; | Gate3-B-third bottom gate electrode; |
| Gate3-T-third top gate electrode; | Gate4-fourth gate electrode; | Gate5-fifth gate electrode; |
| Gate6-sixth gate electrode; | Gate7-seventh gate electrode; | Gate8-eighth gate electrode; |
| Gate9-ninth gate electrode; | Gate10-tenth gate electrode; | Gate11-eleventh gate electrode; |
| Gate21-twenty-first gate electrode; | Gate22-twenty-second gate electrode; | Gate23-twenty-third gate electrode; |
| Gate24-twenty-fourth gate electrode; | Gate25-twenty-fifth gate electrode; | Gate26-twenty-sixth gate electrode; |
| Gate27-twenty-seventh gate electrode; | Gate28-twenty-eighth gate electrode; | Hf-high-frequency signal line; |
| Hf-C-high-frequency connection line; | MARK1-first mark; | MARK2-second mark; |
| S1-first scan signal line; | S2-second scan signal line; | VDD-high voltage power supply line; |
| VDD-C-high voltage connection line; | VSS-low voltage power supply line; | VSS-C-low voltage connection line; |
| Vint-initial signal line; | VGH-high voltage line; | VGL-low voltage line; |
| 10-base substrate; | 11-first anode connection line; | 12-second anode connection line; |
| 13-anode connection block; | 14-anode connection electrode; | 20-drive structure layer; |
| 30-light emitting structure layer; | 40-light emitting diode; | 100-motherboard; |
| 200-display substrate; | 210-first circuit region; | 220-second circuit region. |

Figure 9:
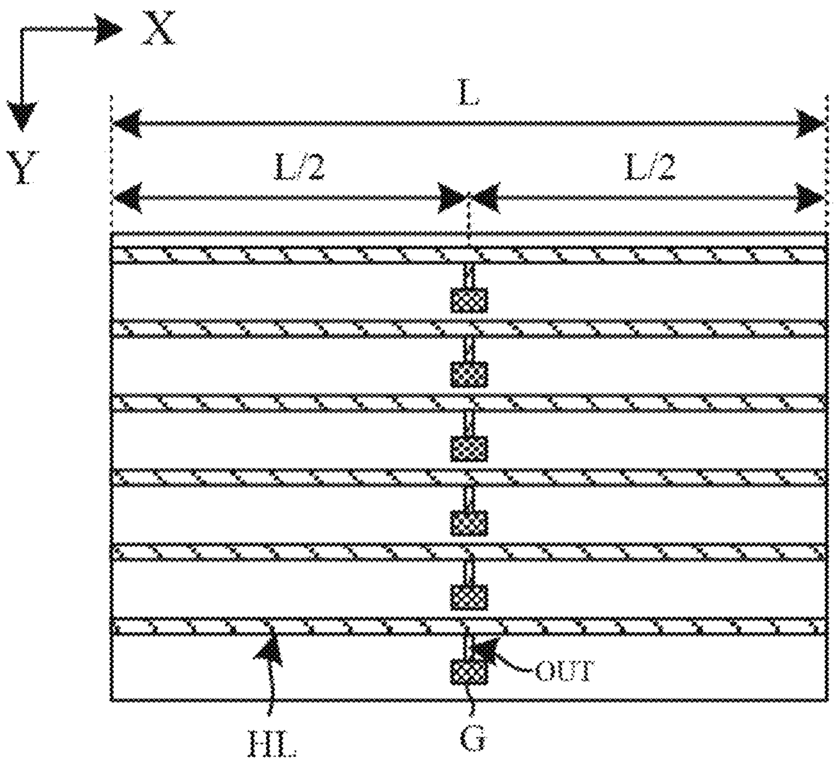

FIG. 9 is a schematic diagram of an arrangement of gate units according to an exemplary embodiment of the present disclosure.

Figure 10:
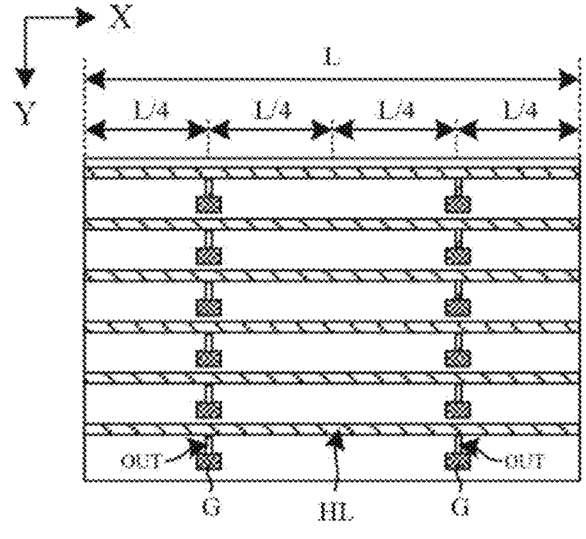

FIG. 10 is a schematic diagram of another arrangement of gate units according to an exemplary embodiment of the present disclosure.

Figure 11:
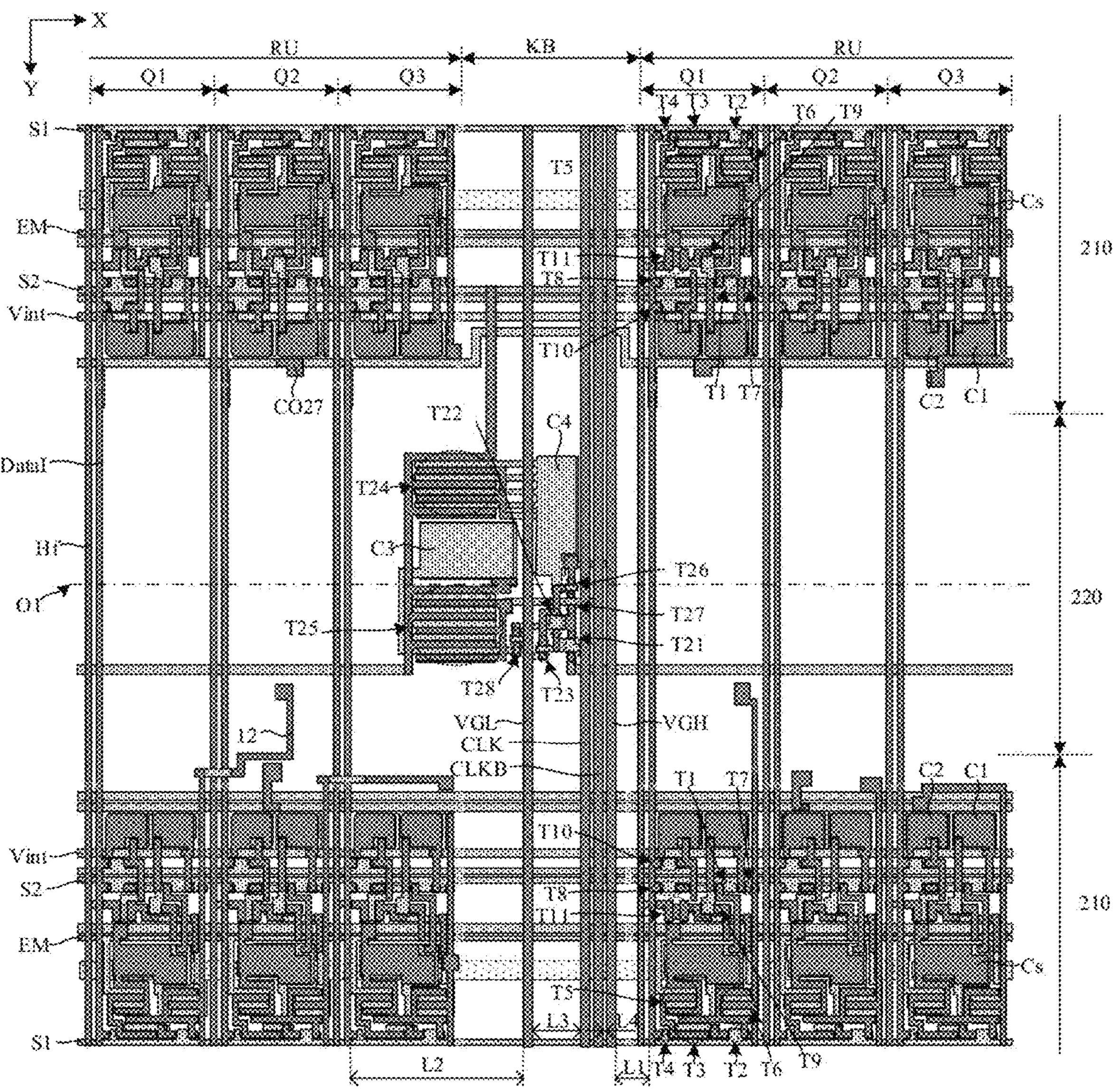
Figure 12:
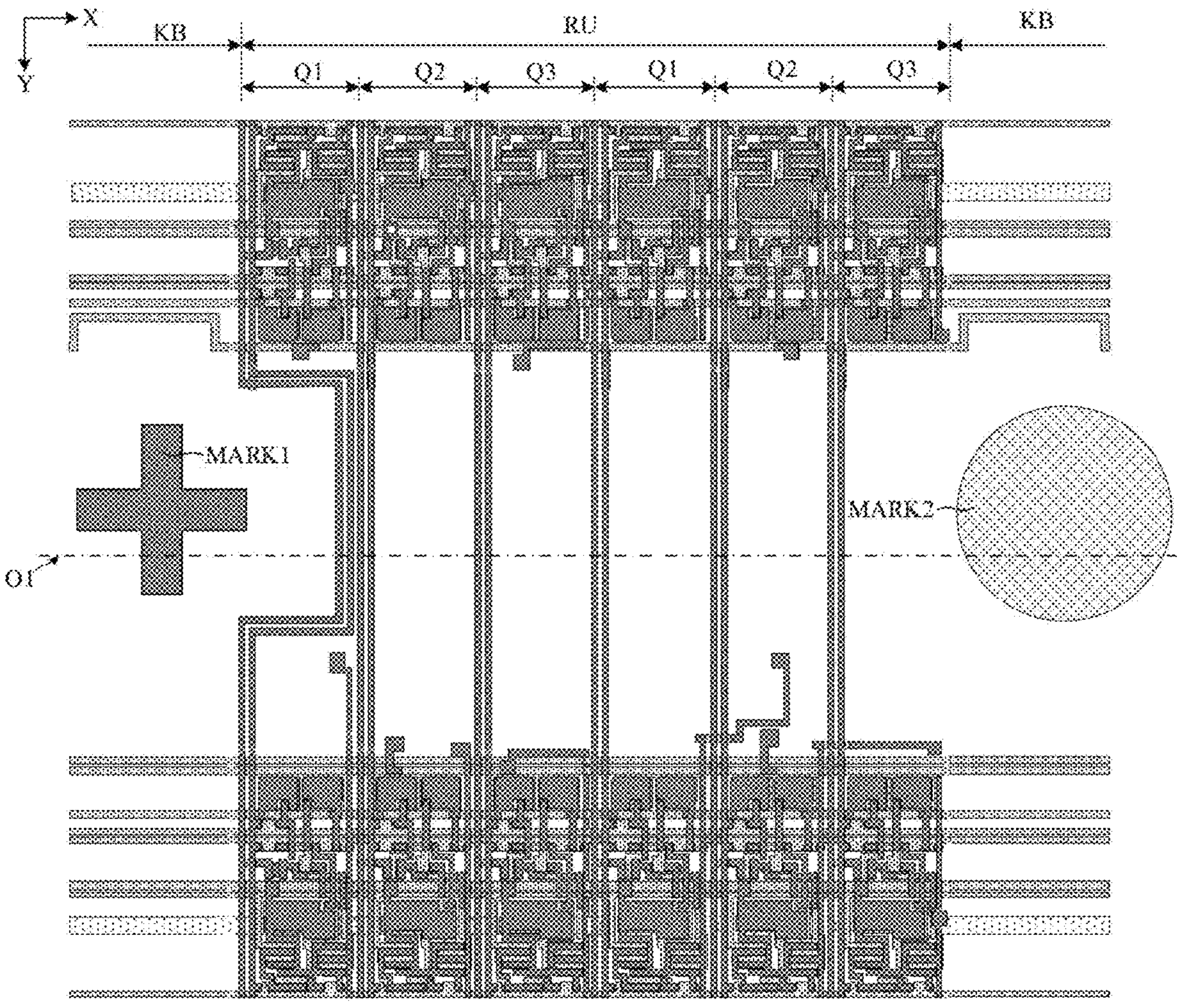

FIGS. 11 and 12 are schematic diagrams of a planar structure of a display substrate according to an exemplary embodiment of the present disclosure.

Figure 13:
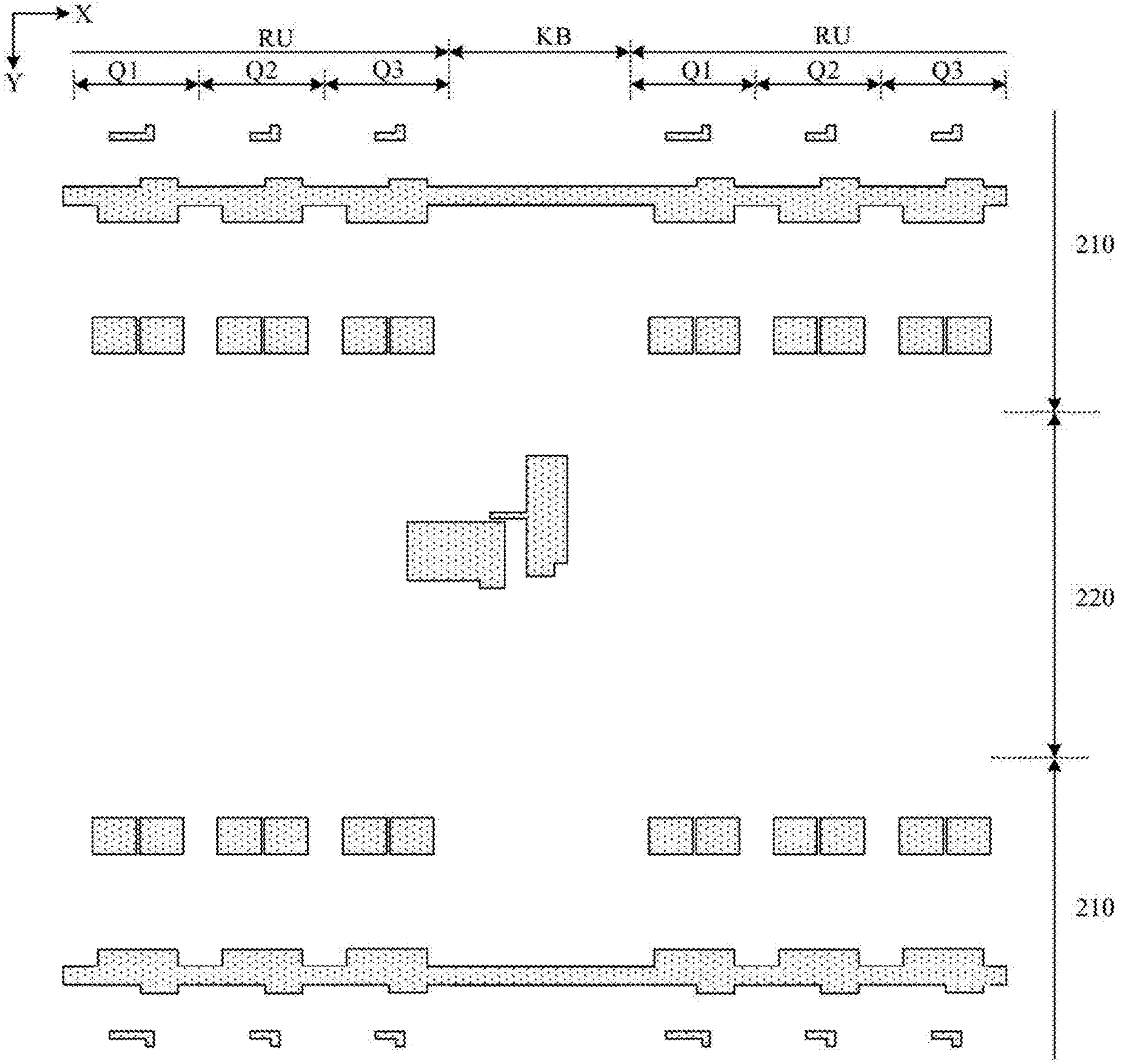
Figure 14:
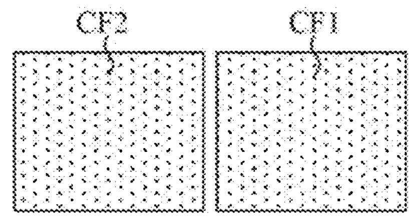
Figure 14:
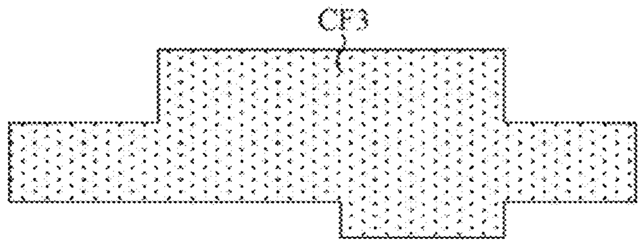
Figure 14:
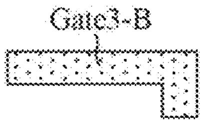
Figure 15:
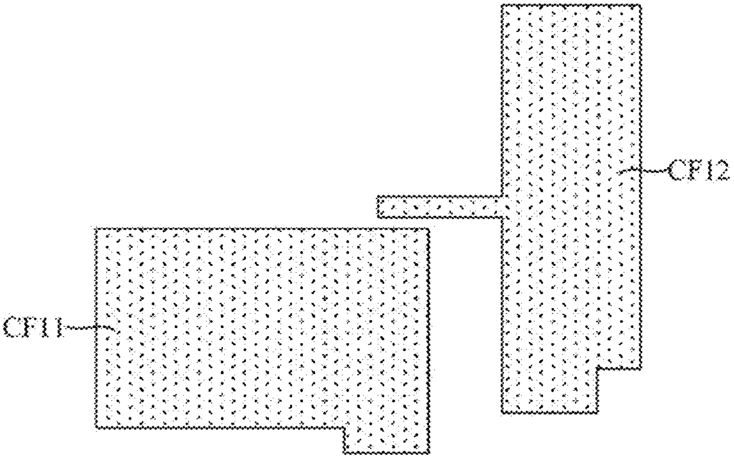

FIGS. 13 to 15 are schematic diagrams of a display substrate after formation of a pattern of a first conductive layer according to the present disclosure.

Figure 16:
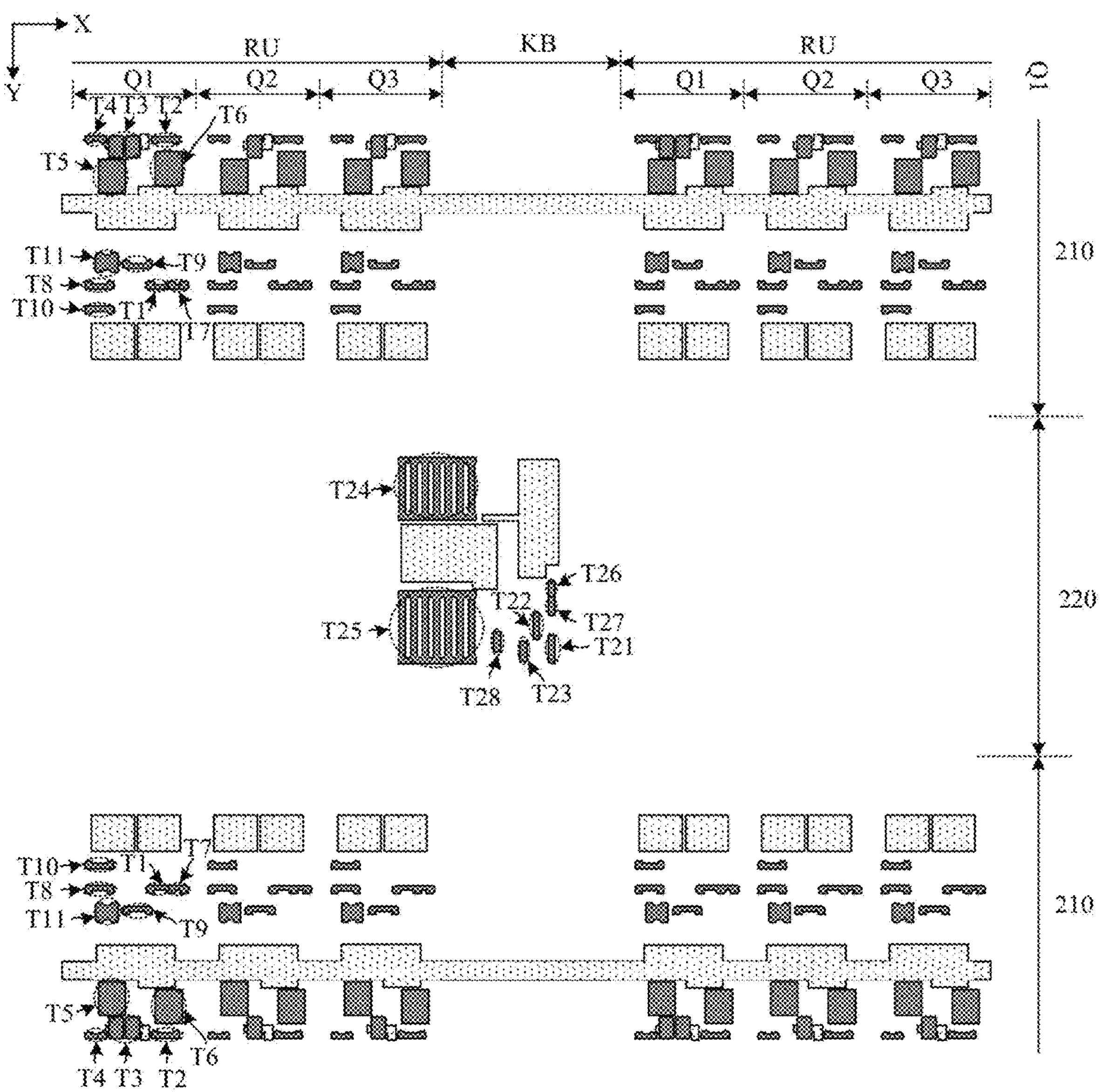
Figure 17:
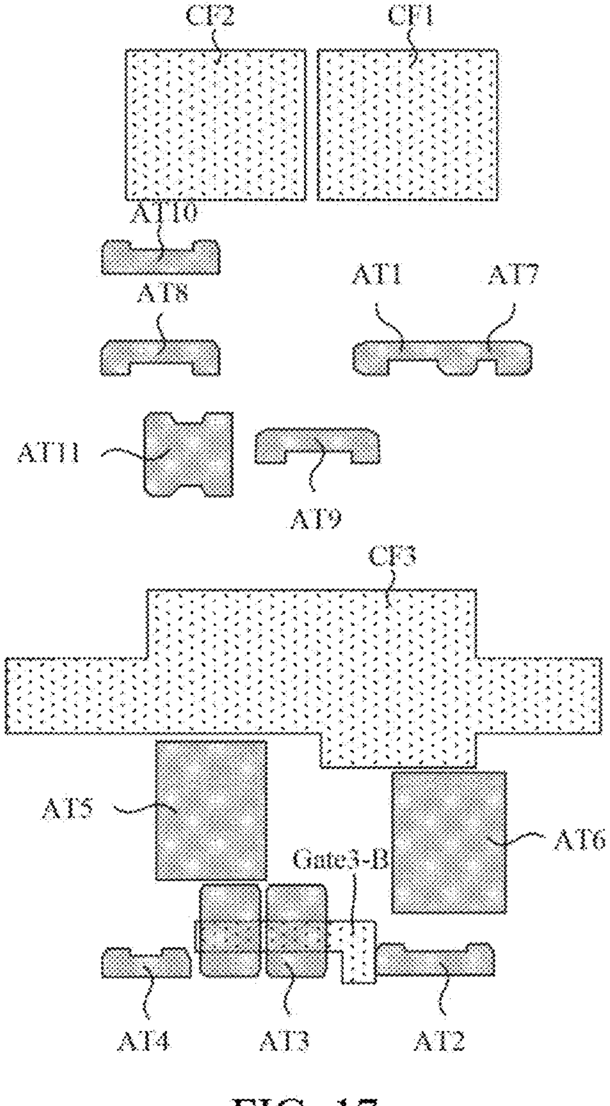
Figure 18:
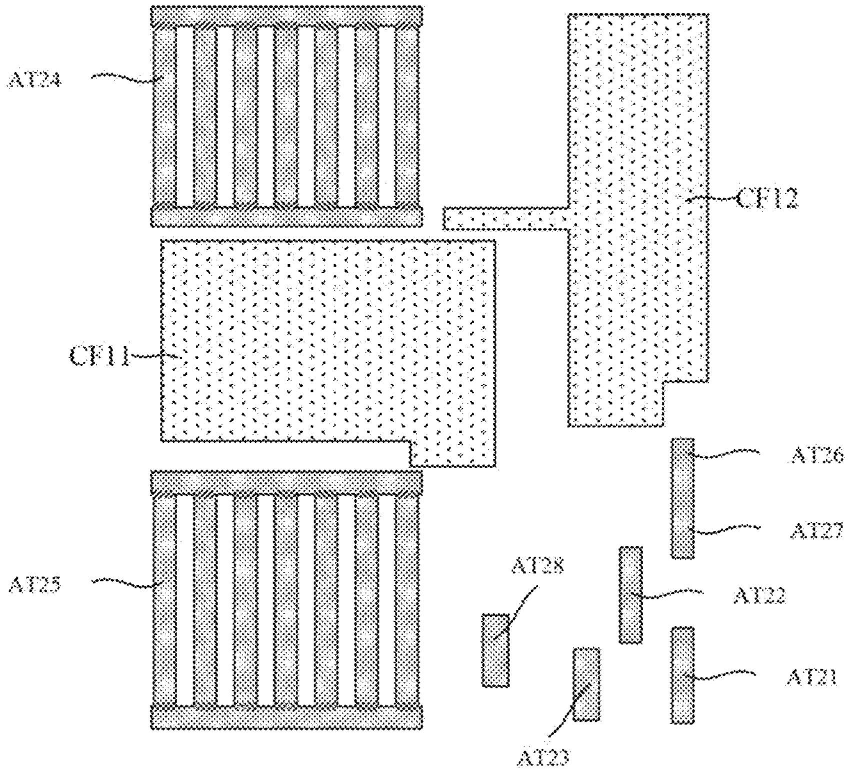

FIGS. 16 to 18 are schematic diagrams of a display substrate after formation of a pattern of a semiconductor layer according to the present disclosure.

Figure 19:
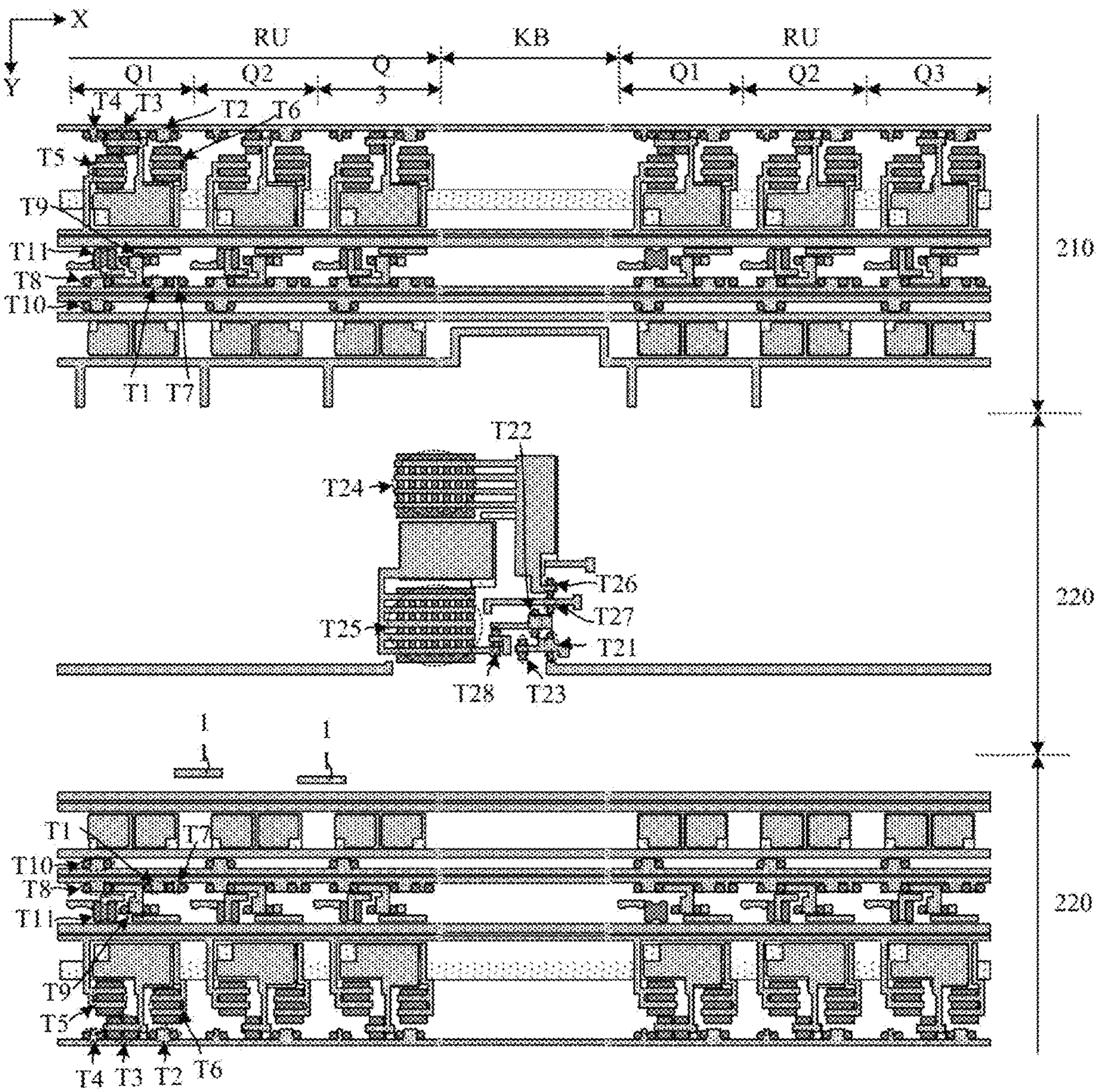
Figure 20:
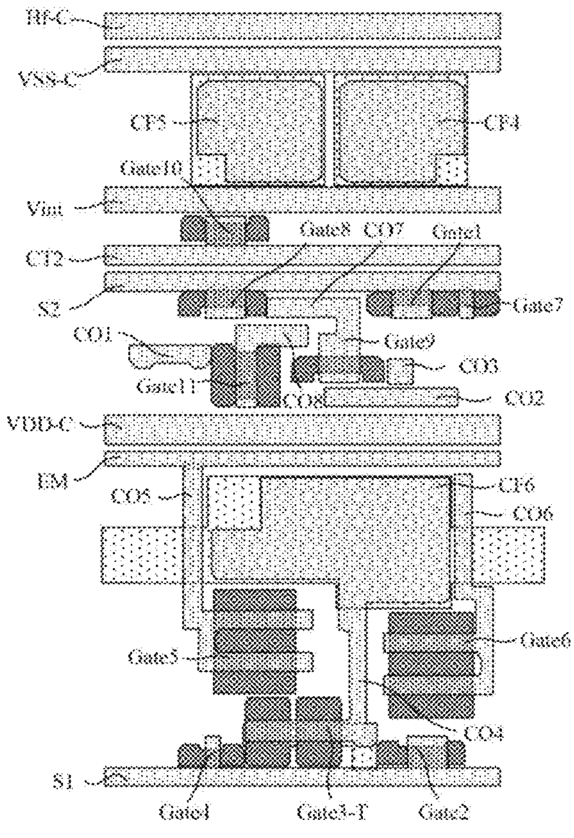
Figure 21:
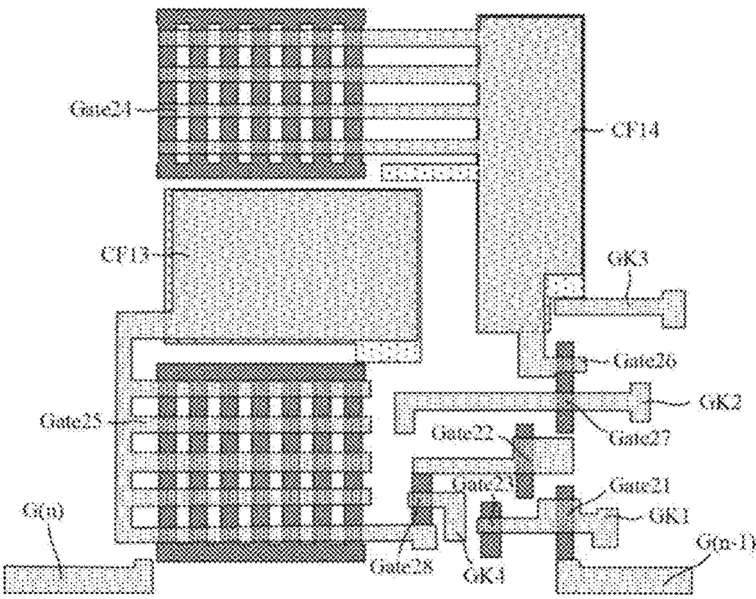

FIGS. 19 to 21 are schematic diagrams of a display substrate after formation of a pattern of a second conductive layer according to the present disclosure.

Figure 22:
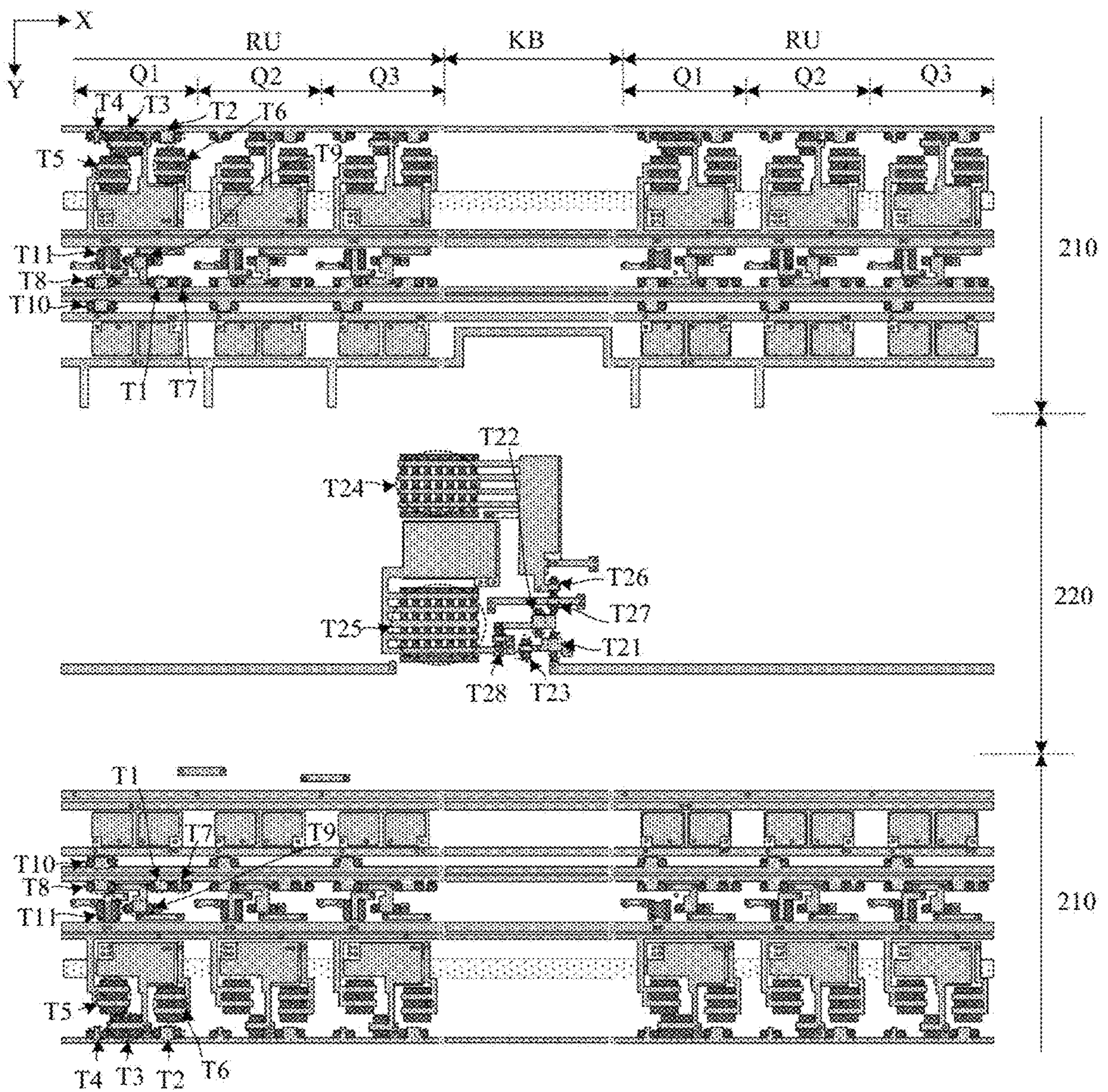
Figure 23:
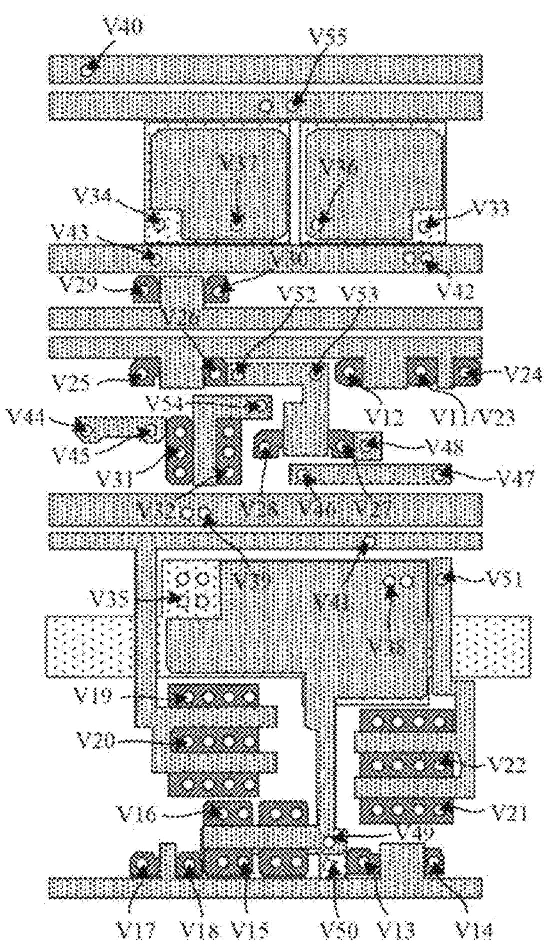
Figure 24:
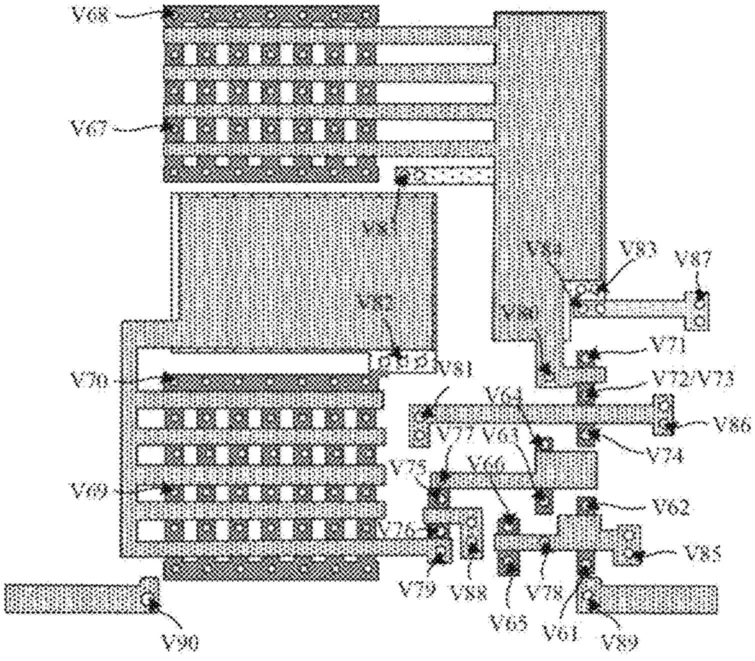

FIGS. 22 to 24 are schematic diagrams of a display substrate after formation of a pattern of a third insulation layer according to the present disclosure.

DETAILED DESCRIPTION

To make objectives, technical solutions, and advantages of the present disclosure clearer, the embodiments of the present disclosure will be described in detail with reference to the accompanying drawings. It is to be noted that implementation modes may be practiced in a plurality of different forms. Those of ordinary skills in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

A Scale of the drawings in the present disclosure may be used as a reference in actual processes, but it is not limited thereto. For example, a width-to-length ratio of a channel, a thickness and spacing of each film layer, and a width and spacing of each signal line may be adjusted according to actual needs. A quantity of pixels in the display substrate and a quantity of sub-pixels in each pixel are not limited to numbers shown in the drawings. The drawings described in the present disclosure are schematic structural diagrams only, and one mode of the present disclosure is not limited to shapes, numerical values, or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to directions for describing various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, a detachable connection, or an integrated connection; it may be a mechanical connection or a connection; it may be a direct connection, an indirect connection through a middleware, or internal communication between two elements. Those of ordinary skills in the art may understand specific meanings of these terms in the present disclosure according to specific situations.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode; or, the first electrode may be a source electrode, and the second electrode may be a drain electrode. In a case that transistors with opposite polarities are used, in a case that a direction of a current changes during operation of a circuit, or the like, functions of the "source electrode" and the "drain electrode" are sometimes interchanged. Therefore, the "source electrode" and the "drain electrode", as well as the "source terminal" and the "drain terminal", are interchangeable in the specification.

In the specification, a "connection" includes a case where constitute elements are connected together through an element with some kind of electrical action. The "element with some kind of electrical action" is not particularly limited as long as electrical signals may be sent and received between the connected constituent elements. Examples of the "element with some kind of electrical action" not only include an electrode and a wiring, but also include a switching element such as a transistor, a resistor, an inductor, a capacitor, another element with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, a "thickness" and a "height" refer to a vertical distance between a surface of a side of a film layer away from a base substrate and a surface of a side close to the base substrate.

A triangle, rectangle, trapezoid, pentagon, or hexagon, etc. in the specification is not strictly defined, and it may be an approximate triangle, rectangle, trapezoid, pentagon, or hexagon, etc. There may be some small deformations caused by tolerance, and there may be a chamfer, an arc edge, and deformation, etc.

In the present disclosure, "about" refers to that a boundary is not defined so strictly and numerical values within process and measurement error ranges are allowed.

Figure 1:
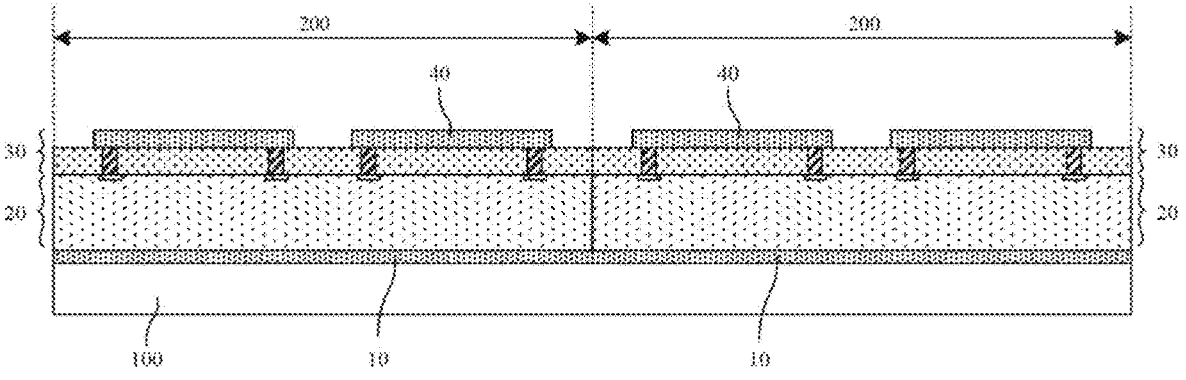
FIG. 1 is a schematic diagram of a structure of a display apparatus.

FIG. 1 is a schematic diagram of a structure of a display apparatus. As shown in FIG. 1, a main body structure of a large-size display apparatus may include a plurality of display substrates 200 disposed on a motherboard 100, the plurality of display substrates 200 being tightly spliced together for image display. On a plane perpendicular to the display substrate, at least one display substrate may at least include a drive structure layer 20 disposed on a base substrate 10 and a light emitting structure layer 30 disposed on a side of the drive structure layer 20 away from the base substrate 10. On a plane parallel to the display substrate, the drive structure layer 20 may include a plurality of circuit units, at least one of the circuit units may include a pixel drive circuit and a plurality of signal lines connected with the pixel drive circuit, and the pixel drive circuit is configured to receive a data voltage under control of the signal lines and output a corresponding current. The light emitting structure layer 30 may include a plurality of light emitting units, at least one of the light emitting units may include a light emitting diode 40, light emitting diodes 40 in the plurality of light emitting units are correspondingly connected with pixel drive circuits in the plurality of circuit units, and the light emitting diode 40 is configured to emit light with corresponding brightness under drive of a current output by a corresponding pixel drive circuit.

In an exemplary implementation mode, the circuit units mentioned in the present disclosure refer to regions divided according to pixel drive circuits, and light emitting units mentioned in the present disclosure refer to regions divided according to light emitting diodes. In an exemplary implementation mode, positions of the light emitting units may correspond to positions of the circuit units, or positions of the light emitting units may not correspond to positions of the circuit units, which is not limited here in the present disclosure.

Figure 2:
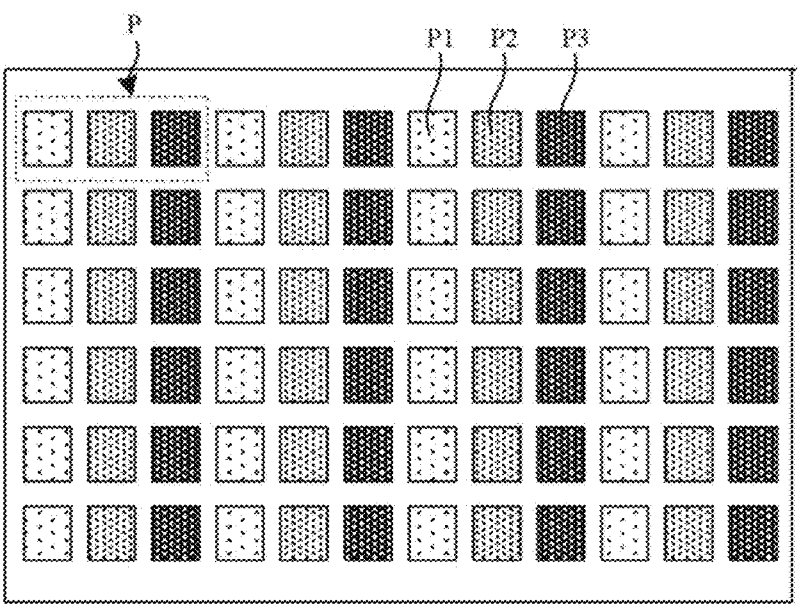
FIG. 2 is a schematic diagram of a planar structure of a light emitting structure layer in a display substrate.

FIG. 2 is a schematic diagram of a planar structure of a light emitting structure layer in a display substrate. As shown in FIG. 2, in a plane parallel to the display substrate, the light emitting structure layer may include a first light emitting unit P1 that emits light of a first color, a second light emitting unit P2 that emits light of a second color, and a third light emitting unit P3 that emits light of a third color. In an exemplary implementation mode, the first light emitting unit P1 may be a red light emitting unit emitting red light, forming a red (R) sub-pixel, the second light emitting unit P2 may be a green light emitting unit emitting green light, forming a green (G) sub-pixel, and the third light emitting unit P3 may be a blue light emitting unit emitting blue light, forming a blue (B) sub-pixel.

In an exemplary implementation mode, the red sub-pixel, the blue sub-pixel, and the green sub-pixel may form one pixel unit P. A sub-pixel may be in a shape of a rectangle, a rhombus, a pentagon, or a hexagon. Three sub-pixels in one pixel unit P may be arranged side by side horizontally, side by side vertically, or in a manner like a Chinese character "品", etc., which is not limited here in the present disclosure.

In an exemplary implementation mode, the pixel unit may include four sub-pixels, and the four sub-pixels may be arranged side by side horizontally, side by side vertically, in a square, in a diamond shape, or the like.

In an exemplary implementation mode, the light emitting diode 40 may be a Mini Light Emitting Diode (Mini LED) or a Micro Light Emitting Diode (Micro LED).

Figure 3:
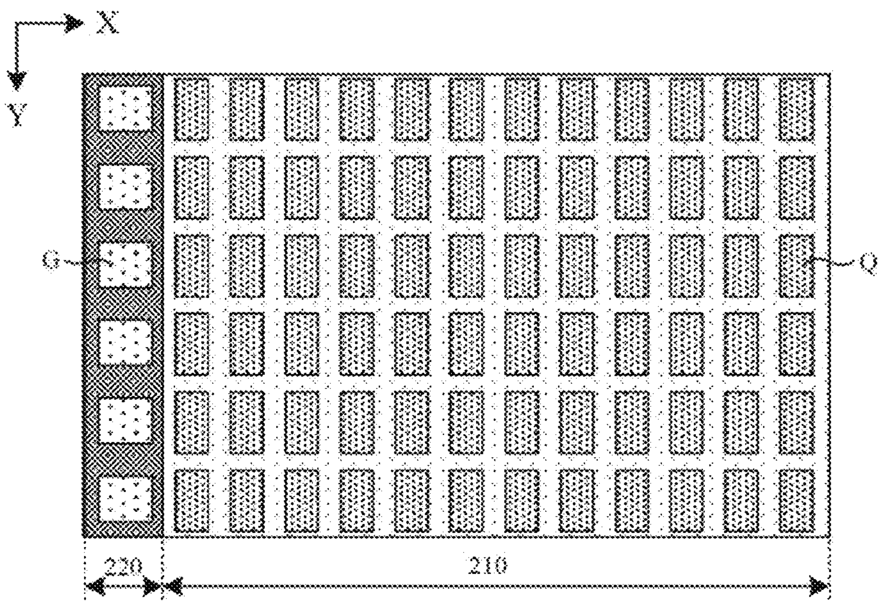
FIG. 3 is a schematic diagram of a planar structure of a drive structure layer in a display substrate.

FIG. 3 is a schematic diagram of a planar structure of a drive structure layer in a display substrate, illustrating a structure in which a gate drive circuit is disposed in a display region (Gate Driver In AA, GIA for short). As shown in FIG. 3, in a plane parallel to the display substrate, the drive structure layer may at least include a first circuit region 210 and a second circuit region 220, a shape of the second circuit region 220 may be a strip shape extending along a second direction Y, and the second circuit region 220 may be disposed on a side of the first circuit region 210 in a first direction X or on a side of the first circuit region 210 in a direction opposite to the first direction X, and the first direction X and the second direction Y intersect.

In an exemplary implementation mode, the first circuit region 210 may include a plurality of circuit units Q forming a plurality of unit rows and a plurality of unit columns, a unit row may include a plurality of circuit units Q sequentially disposed along the first direction X, and a unit column may include a plurality of circuit units Q sequentially disposed along the second direction Y. At least one circuit unit Q may at least include a pixel drive circuit, a plurality of pixel drive circuits in a unit row are connected with a drive signal line in the unit row, and a pixel drive circuit is configured to receive a data voltage and output a corresponding current to a connected light emitting diode under control of a drive signal line.

In an exemplary implementation mode, the second circuit region 220 may at least include a gate drive apparatus that may at least include a plurality of gate units G sequentially disposed and cascaded along the second direction Y, at least one gate unit G may at least include one gate drive circuit connected with a drive signal line in a corresponding unit row, and the gate drive circuit is configured to output a row drive signal to the drive signal line in the corresponding unit row.

In an exemplary implementation mode, the drive signal line may at least include a scan signal line and a light emitting signal line, the gate unit G may at least include a first gate drive circuit (Gate Driver On Array (GOA) circuit) and a second gate drive circuit (Emission Driver On Array (EOA) circuit), the first gate drive circuit may be connected with the scan signal line, and the second gate drive circuit may be connected with the light emitting signal line.

Figure 4:
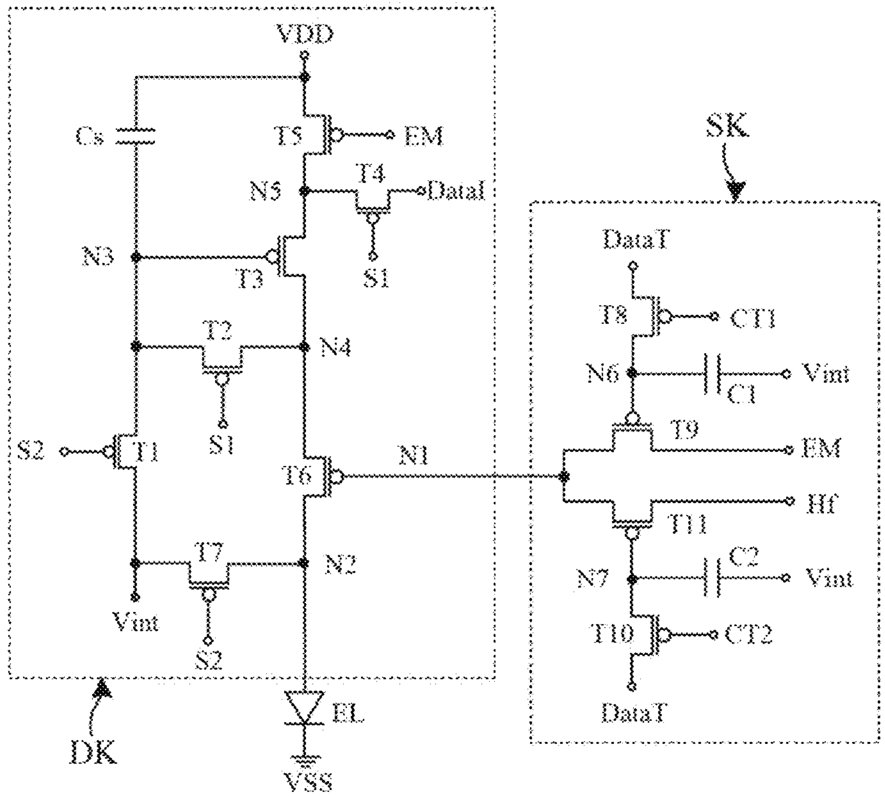
FIG. 4 is a diagram of an equivalent circuit of a pixel drive circuit.

FIG. 4 is a diagram of an equivalent circuit of a pixel drive circuit, illustrating a structure of a pixel drive circuit of 11T3C. In an exemplary implementation mode, a plurality of light emitting diodes in a display substrate may be driven by a current mode. Due to problems of color coordinate drift and low external quantum efficiency of a current-mode light emitting diode driven at a relatively low current density, brightness uniformity is relatively poor, so it is difficult to accurately represent low gray scale only by controlling amplitude of a current. In a pixel drive circuit for a display substrate, the pixel drive circuit includes at least two types of data terminals: a current data terminal and a time length data terminal, the current data terminal is configured to provide current signals with different amplitudes to a light emitting diode, and the time length data terminal is configured to provide time lengths of the above current signals to the light emitting diode.

As shown in FIG. 4, the pixel drive circuit may at least include a current control sub-circuit DK and a time-length control sub-circuit SK. The current control sub-circuit DK may at least include a first transistor T1, a second transistor T2, a third transistor T3, a fourth transistor T4, a fifth transistor T5, a sixth transistor T6, a seventh transistor T7, and a storage capacitor Cs, and the time-length control sub-circuit SK may at least include an eighth transistor T8, a ninth transistor T9, a tenth transistor T10, an eleventh transistor T11, a first capacitor C1, and a second capacitor C2.

In an exemplary implementation mode, the pixel drive circuit may at least include a first node N1, a second node N2, a third node N3, a fourth node N4, a fifth node N5, a sixth node N6, and a seventh node N7. The first node N1 is respectively connected with a gate electrode of the sixth transistor T6, a second electrode of the ninth transistor T9, and a second electrode of the eleventh transistor T11; the second node N2 is respectively connected with a second electrode of the sixth transistor T6, a second electrode of the seventh transistor T7, and an anode of a light emitting diode EL; the third node N3 is respectively connected with a second electrode of the first transistor T1, a first electrode of the second transistor T2, a gate electrode of the third transistor T3, and a first end of the storage capacitor Cs; the fourth node N4 is respectively connected with a second electrode of the second transistor T2, a second electrode of the third transistor T3, and a first electrode of the sixth transistor T6; the fifth node N5 is respectively connected with a first electrode of the third transistor T3, a second electrode of the fourth transistor T4, and a second electrode of the fifth transistor T5; the sixth node N6 is respectively connected with a second electrode of the eighth transistor T8, a gate electrode of the ninth transistor T9, and a first end of the first capacitor C1; and the seventh node N7 is respectively connected with a second electrode of the tenth transistor T10, a gate electrode of the eleventh transistor T11, and a first end of the second capacitor C2.

In an exemplary implementation mode, a gate electrode of the first transistor T1 is connected with a second scan signal line S2, a first electrode of the first transistor T1 is connected with an initial signal line Vint, and the second electrode of the first transistor T1 is connected with the third node N3.

In an exemplary implementation mode, a gate electrode of the second transistor T2 is connected with a first scan signal line S1, the first electrode of the second transistor T2 is connected with the third node N3, and the second electrode of the second transistor T2 is connected with the fourth node N4.

In an exemplary implementation mode, the gate electrode of the third transistor T3 is connected with the third node N3, the first electrode of the third transistor T3 is connected with the fifth node N5, and the second electrode of the third transistor T3 is connected with the fourth node N4.

In an exemplary implementation mode, a gate electrode of the fourth transistor T4 is connected with the first scan signal line S1, a first electrode of the fourth transistor T4 is connected with a data signal line DataI, and the second electrode of the fourth transistor T4 is connected with the fifth node N5.

In an exemplary implementation mode, a gate electrode of the fifth transistor T5 is connected with a light emitting signal line EM, a first electrode of the fifth transistor T5 is connected with a first power supply line VDD, and the second electrode of the fifth transistor T5 is connected with the fifth node N5.

In an exemplary implementation mode, the gate electrode of the sixth transistor T6 is connected with the first node N1, the first electrode of the sixth transistor T6 is connected with the fourth node N4, and the second electrode of the sixth transistor T6 is connected with the second node N2.

In an exemplary implementation mode, a gate electrode of the seventh transistor T7 is connected with the second scan signal line S2, a first electrode of the seventh transistor T7 is connected with the initial signal line Vint, and the second electrode of the seventh transistor T7 is connected with the second node N2.

In an exemplary implementation mode, a gate electrode of the eighth transistor T8 is connected with a first control line CT1, a first electrode of the eighth transistor T8 is connected with a time-length signal line DataT, and the second electrode of the eighth transistor T8 is connected with the sixth node N6.

In an exemplary implementation mode, the gate electrode of the ninth transistor T9 is connected with the sixth node N6, a first electrode of the ninth transistor T9 is connected with the light emitting signal line EM, and the second electrode of the ninth transistor T9 is connected with the first node N1.

In an exemplary implementation mode, a gate electrode of the tenth transistor T10 is connected with a second control line CT2, a first electrode of the tenth transistor T10 is connected with the time-length signal line DataT, and the second electrode of the tenth transistor T10 is connected with the seventh node N7.

In an exemplary implementation mode, the gate electrode of the eleventh transistor T11 is connected with the seventh node N7, a first electrode of the eleventh transistor T11 is connected with a high-frequency signal line Hf, and the second electrode of the eleventh transistor T11 is connected with the first node N1.

In an exemplary implementation mode, the first end of the storage capacitor Cs is connected with the third node N3, and a second end of the storage capacitor Cs is connected with the first power supply line VDD.

In an exemplary implementation mode, the first end of the first capacitor C1 is connected with the sixth node N6, and a second end of the first capacitor C1 is connected with the initial signal line Vint.

In an exemplary implementation mode, the first end of the second capacitor C2 is connected with the seventh node N7, and a second end of the second capacitor C2 is connected with the initial signal line Vint.

In an exemplary implementation mode, the first transistor T1, the second transistor T2, and the fourth transistor T4 to the eleventh transistor T11 may be switching transistors, and the third transistor T3 may be a drive transistor.

In an exemplary implementation mode, the light emitting diode EL may be a Mini LED or a Micro LED. A first electrode of the light emitting diode EL is connected with the second node N2, a second electrode of the light emitting diode EL is connected with a second power supply line VSS, and a signal of the second power supply line VSS is a continuously supplied low-level signal, such as a Direct Current (DC) low voltage. A signal of the first power supply line VDD is a continuously supplied high-level signal, such as a DC high voltage.

In an exemplary implementation mode, the first transistor T1 to the seventh transistor T11 may be P-type transistors or may be N-type transistors. Use of a same type of transistors in a pixel drive circuit may simplify a process flow, reduce a process difficulty of a display panel, and improve a product yield. In some possible implementation modes, the first transistor T1 to the eleventh transistor T11 may include a P-type transistor and an N-type transistor.

In an exemplary implementation mode, for the transistor T1 to the eleventh transistor T11, a low temperature poly silicon transistor may be adopted, or an oxide transistor may be adopted, or a low temperature poly silicon transistor and a metal oxide transistor may be adopted. Low Temperature Poly Silicon (LTPS for short) is adopted for an active layer of a low temperature poly silicon transistor and a metal oxide semiconductor (Oxide) is adopted for an active layer of a metal oxide transistor. A low temperature poly silicon transistor has advantages such as a high migration rate and fast charging, and an oxide transistor has advantages such as a low drain current. The low temperature poly silicon transistor and the metal oxide transistor are integrated on one display substrate to form a Low Temperature Polycrystalline Oxide (LTPO for short) display substrate, such that advantages of the low temperature poly silicon transistor and the metal oxide transistor may be utilized, low-frequency drive may be achieved, power consumption may be reduced, and display quality may be improved.

In an exemplary implementation mode, taking a case that the first transistor T1 and the eleventh transistor T11 in the pixel drive circuit shown in FIG. 4 are both P-type transistors as an example, a working process of the pixel drive circuit may include following contents.

In an exemplary implementation mode, when a gray scale displayed by a light emitting diode with which the pixel drive circuit is connected is greater than a threshold gray scale, the working process of the pixel drive circuit may include an initialization stage, a writing stage, and a light emitting stage, wherein the initialization stage may include a first sub-stage and a second sub-stage.

In the first sub-stage and the second sub-stage, signals of the first scan signal line S1 and the light emitting signal line EM are high-level signals, a signal of the second scan signal line S2 is a low-level signal, and the first transistor T1 and the seventh transistor T7 are turned on. The first transistor T1 is turned on such that a signal of the initial signal line Vint is written into the third node N3, the storage capacitor Cs is initialized (reset), and an original charge in the storage capacitor Cs is cleared. Since the first end of the storage capacitor C is at a low level, the third transistor T3 is turned on. The seventh transistor T7 is turned on such that the signal of the initial signal line Vint is written into the second node N2, the first electrode of the light emitting diode EL is initialized (reset), a pre-stored voltage therein is emptied, and initialization is completed, thereby ensuring that the light emitting diode EL does not emit light.

In the first sub-stage, a signal of the time-length signal line DataT is a high-level signal, a signal of the second control line CT2 is a low-level signal, the tenth transistor T10 is turned on, so that the signal of the time-length signal line DataT is written into the seventh node N7 and the second capacitor C2 is charged. Since at this time the signal of the time-length signal line DataT is the high-level signal, the eleventh transistor T11 is turned off, and a signal of the high-frequency signal line Hf cannot be written into the first node N1.

In the second sub-stage, a signal of the time-length signal line DataT is a low-level signal, a signal of the first control line CT1 is a low-level signal, the eighth transistor T8 is turned on such that the signal of the time-length signal line DataT is written into the sixth node N6, and the first capacitor C1 is charged. Since at this time the signal of the time-length signal line DataT is the low-level signal, the ninth transistor T9 is turned on, and a signal of the light emitting signal line EM is written to the first node N1.

In the writing stage, the data signal line DataI outputs a data voltage, signals of the second scan signal line S2 and the light emitting signal line EM are high-level signals, a signal of the first scan signal line S1 is a low-level signal, and the second transistor T2 and the fourth transistor T4 are turned on. The second transistor T2 and the fourth transistor T4 are turned on such that a data voltage output by the data signal line DataI is supplied to the third node N3 through the fifth node N5, the turned-on third transistor T3, the fourth node N4, and the turned-on second transistor T2, a difference between the data voltage Vd output by the data signal line DataI and a threshold voltage Vth of the third transistor T3 is charged into the storage capacitor Cs, a voltage at the first end (third node N3) of the storage capacitor Cs is Vd−|Vth|. The first capacitor C1 keeps a potential of a signal of the sixth node N6 unchanged, the ninth transistor T9 remains on, and a signal of the light emitting signal line EM is written into the first node N1.

In the light emitting stage, a signal of the light emitting signal line EM is a low-level signal, the fifth transistor T5 is turned on, the first capacitor C1 keeps the potential of the signal of the sixth node N6, the ninth transistor T9 remains on, the signal of the light emitting signal line EM is written into the first node N1, and the sixth transistor T6 is turned on. A power supply voltage output by the first power supply line VDD provides a drive voltage to the first electrode of the light emitting diode EL through the turned-on fifth transistor T5, the third transistor T3, and the sixth transistor T6, to drive the light emitting diode EL to emit light.

In an exemplary implementation mode, when a gray scale displayed by a light emitting diode with which the pixel drive circuit is connected is less than a threshold gray scale, the working process of the pixel drive circuit includes an initialization stage, a writing stage, and a light emitting stage, wherein the initialization stage may include a first sub-stage and a second sub-stage.

In the first sub-stage and the second sub-stage, signals of the first scan signal line S1 and the light emitting signal line EM are high-level signals, a signal of the second scan signal line S2 is a low-level signal, and the first transistor T1 and the seventh transistor T7 are turned on. The first transistor T1 is turned on such that a signal of the initial signal line Vint is written into the third node N3, the storage capacitor Cs is initialized (reset), and an original charge in the storage capacitor Cs is cleared. Since the first end of the storage capacitor C is at a low level, the third transistor T3 is turned on. The seventh transistor T7 is turned on such that the signal of the initial signal line Vint is written into the second node N2, the first electrode of the light emitting diode EL is initialized (reset), a pre-stored voltage therein is emptied, and initialization is completed, thereby ensuring that the light emitting diode EL does not emit light.

In the first sub-stage, a signal of the time-length signal line DataT is a low-level signal, a signal of the second control line CT2 is a low-level signal, the tenth transistor T10 is turned on, so that the signal of the time-length signal line DataT is written into the seventh node N7 and the second capacitor C2 is charged. Since at this time the signal of the time-length data terminal DataT is the low-level signal, the eleventh transistor T11 is turned on, and a signal of the high-frequency signal line Hf is written into the first node N1.

In the second sub-stage, a signal of the time-length signal line DataT is a high-level signal, a signal of the first control line CT1 is a low-level signal, the eighth transistor T8 is turned on such that the signal of the time-length signal line DataT is written into the sixth node N6, and the first capacitor C1 is charged. Since at this time the signal of the time-length signal line DataT is the high-level signal, the ninth transistor T9 is turned off, and a signal of the light emitting signal line EM cannot be written into the first node N1.

In the writing stage, the data signal line DataI outputs a data voltage, signals of the second scan signal line S2 and the light emitting signal line EM are high-level signals, a signal of the first scan signal line S1 is a low-level signal, and the second transistor T2 and the fourth transistor T4 are turned on. The second transistor T2 and the fourth transistor T4 are turned on such that the data voltage output by the data signal line DataI is supplied to the third node N3 through the fifth node N5, the turned-on third transistor T3, the fourth node N4, and the turned-on second transistor T2, a difference between the data voltage Vd output by the data signal line DataI and a threshold voltage Vth of the third transistor T3 is charged into the storage capacitor Cs, a voltage at the first end (third node N3) of the storage capacitor Cs is Vd−|Vth|. The second capacitor C2 keeps a potential of a signal of the seventh node N7 unchanged, the eleventh transistor T11 is always on, and a signal of the high-frequency signal line Hf is written into the first node N1.

In the light emitting stage, a signal of the light emitting signal line EM is a low-level signal, the fifth transistor T5 is turned on, the second capacitor C2 keeps a potential of a signal of the seventh node N7 unchanged, the eleventh transistor T11 is always on, a signal of the high-frequency signal line Hf is written into the first node N1, and the sixth transistor T6 is turned on. A power supply voltage output by the first power supply line VDD provides a drive voltage to the first electrode of the light emitting diode EL through the turned-on fifth transistor T5, the third transistor T3, and the sixth transistor T6, to drive the light emitting diode EL to emit light.

In an exemplary implementation mode, in the light emitting stage, a drive current output by the third transistor T3 in the pixel drive circuit is not affected by the threshold voltage of the third transistor T3, but only related to a voltage of the data signal line and a voltage of the first power supply line, thereby eliminating an influence of the threshold voltage of the third transistor T3 on the drive current, ensuring uniform display brightness of a display product and improving a display effect.

In an exemplary implementation mode, when a gray scale displayed by the light emitting diode connected with the pixel drive circuit is greater than a threshold gray scale, a control signal is provided to the first node through the light emitting signal line such that the gray scale of the light emitting diode is controlled through a drive current. When the gray scale displayed by the light emitting diode connected with the pixel drive circuit is less than the threshold gray scale, a control signal is provided to the first node N1 through the high-frequency signal line such that the gray scale of the light emitting diode is controlled through a drive current and a light emitting time length.

In an exemplary implementation mode, a signal of the high-frequency signal line Hf is a pulse signal. In an image frame, the signal of the high-frequency signal line Hf has multiple pulses. In an exemplary implementation mode, a frequency of the signal of the high-frequency signal line Hf may be greater than a frequency of a signal of the light emitting signal line EM. For example, the frequency of the signal of the high-frequency signal line Hf may be between 3000 Hz and 60000 Hz, and the frequency of the light emitting signal line EM may be between 60 Hz and 120 Hz. In the present disclosure, a light emitting time length is controlled through a high-frequency pulse signal of the high-frequency signal line, and a short light emitting time length is dispersed to one frame of time, such that flicker when the gray scale displayed by the light emitting diode connected with the pixel drive circuit is less than the threshold gray scale is reduced, and a display effect of the display product is improved.

Figure 5:
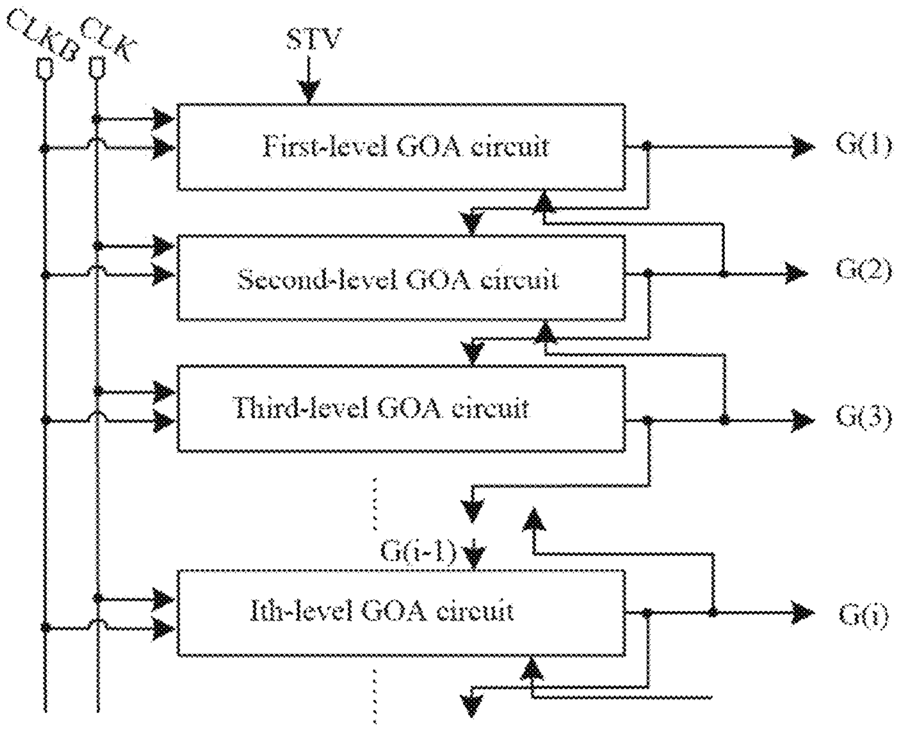
FIG. 5 is a schematic diagram of a structure of a gate drive apparatus.

FIG. 5 is a schematic diagram of a structure of a gate drive apparatus. In an exemplary implementation mode, the gate drive apparatus may at least include a plurality of cascaded GOA circuits (first gate drive circuits). As shown in FIG. 5, the plurality of GOA circuits may include a first-level GOA circuit, a second-level GOA circuit, a third-level GOA circuit, . . . an ith-level GOA circuit, . . . . The first-level GOA circuit may generate a scan signal G(1) of a pixel drive circuit in a first unit row according to an initial signal provided by an initial signal line STV, clock signals provided by a first clock signal line CLK and a second clock signal line CLKB, etc. The ith-level GOA circuit may generate a scan signal G(i) provided to a pixel drive circuit in an ith-level unit row according to a scan signal G(i−1) generated by an (i−1)th-level GOA circuit, a scan signal G(i+1) generated by an (i+1)th-level GOA circuit, and clock signals provided by the first clock signal line CLK and the second clock signal line CLKB, etc., wherein i is a positive integer greater than 1.

Figure 6:
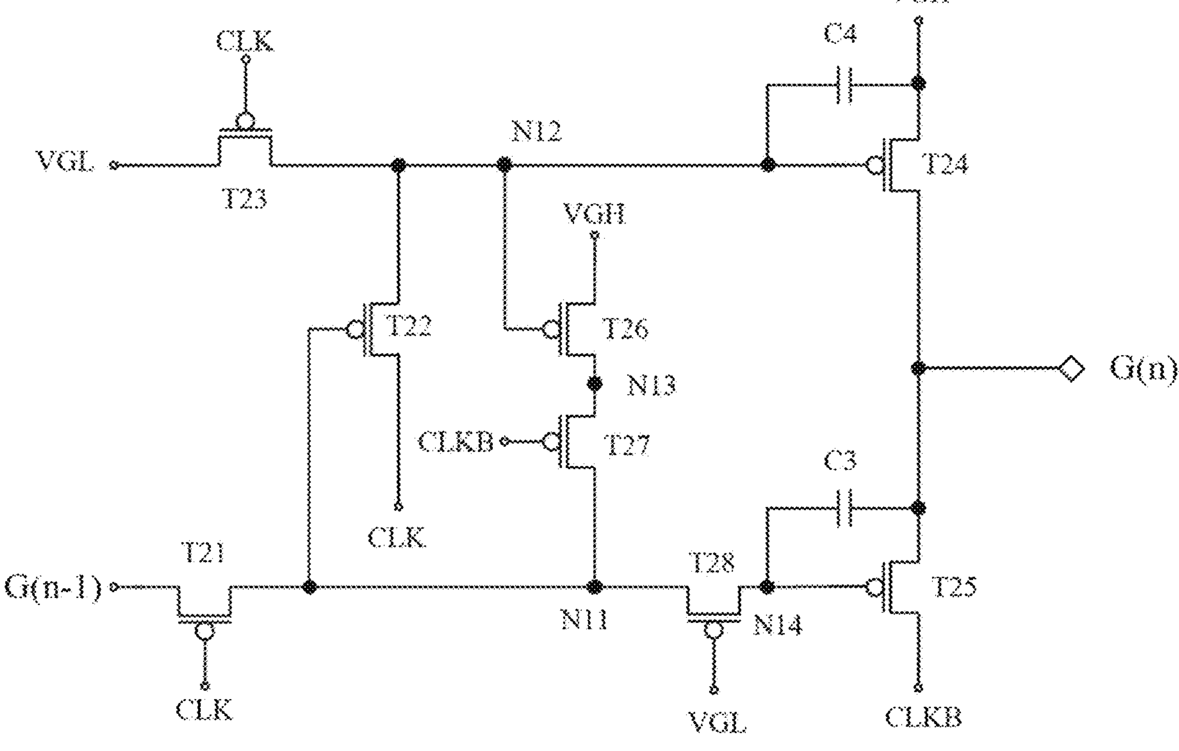
FIG. 6 is a diagram of an equivalent circuit of a gate drive circuit.

FIG. 6 is a diagram of an equivalent circuit of a pixel drive circuit, illustrating a structure of a GOA circuit of 8T2C. As shown in FIG. 6, in an exemplary implementation mode, the gate drive circuit may include eight transistors (a twenty-first transistor T21 to a twenty-eighth transistor T28) and two capacitors (a third capacitor C3 and a fourth capacitor C4), and the gate drive circuit is connected with six signal lines (a first clock signal line CLK, a second clock signal line CLKB, a high voltage line VGH, a low voltage line VGL, a signal output line G(n−1) of a previous level, and a signal output line G(n) of a present level) respectively.

In an exemplary implementation mode, the gate drive circuit may at least include an eleventh node N11, a twelfth node N12, a thirteenth node N13, and a fourteenth node N14. The eleventh node N11 is respectively connected with a second electrode of the twenty-first transistor T21, a gate electrode of the twenty-second transistor T22, a second electrode of the twenty-seventh transistor T27, and a first electrode of the twenty-eighth transistor T28. The twelfth node N12 is respectively connected with a second electrode of the twenty-third transistor T23, a second electrode of the twenty-second transistor T22, a gate electrode of the twenty-fourth transistor T24, a gate electrode of the twenty-sixth transistor T26, and a first end of the fourth capacitor C4. The thirteenth node N13 is respectively connected with a second electrode of the twenty-sixth transistor T26 and a first electrode of the twenty-seventh transistor T27. The fourteenth node N14 is respectively connected with a gate electrode of the twenty-fifth transistor T25, a second electrode of the twenty-eighth transistor T28, and a first end of the third capacitor C3.

In an exemplary implementation mode, a gate electrode of the twenty-first transistor T21 is connected with the first clock signal line CLK, a first electrode of the twenty-first transistor T21 is connected with the signal output line G(n−1) of a previous level, and the second electrode of the twenty-first transistor T21 is connected with the eleventh node N11.

In an exemplary implementation mode, the gate electrode of the twenty-second transistor T22 is connected with the eleventh node N11, a first electrode of the twenty-second transistor T22 is connected with the first clock signal line CLK, and the second electrode of the twenty-second transistor T22 is connected with the twelfth node N12.

In an exemplary implementation mode, a gate electrode of the twenty-third transistor T23 is connected with the first clock signal line CLK, a first electrode of the twenty-third transistor T23 is connected with the low voltage line VGL, and the second electrode of the twenty-third transistor T23 is connected with the twelfth node N12.

In an exemplary implementation mode, the gate electrode of the twenty-fourth transistor T24 is connected with the twelfth node N12, a first electrode of the twenty-fourth transistor T24 is connected with the high voltage line VGH, and a second electrode of the twenty-fourth transistor T24 is connected with the signal output line G(n) of the present level.

In an exemplary implementation mode, the gate electrode of the twenty-fifth transistor T25 is connected with the fourteenth node N14, a first electrode of the twenty-fifth transistor T25 is connected with the second clock signal line CLKB, and a second electrode of the twenty-fifth transistor T25 is connected with the signal output line G(n) of the present level.

In an exemplary implementation mode, the gate electrode of the twenty-sixth transistor T26 is connected with the twelfth node N12, a first electrode of the twenty-sixth transistor T26 is connected with the high voltage line VGH, and the second electrode of the twenty-sixth transistor T26 is connected with the thirteenth node N13.

In an exemplary implementation mode, a gate electrode of the twenty-seventh transistor T27 is connected with the second clock signal line CLKB, the first electrode of the twenty-seventh transistor T27 is connected with the thirteenth node N13, and the second electrode of the twenty-seventh transistor T27 is connected with the eleventh node N11.

In an exemplary implementation mode, a gate electrode of the twenty-eighth transistor T28 is connected with the low voltage line VGL, the first electrode of the twenty-eighth transistor T28 is connected with the eleventh node N11, and the second electrode of the twenty-eighth transistor T28 is connected with the fourteenth node N14.

In an exemplary implementation mode, the first end of the third capacitor C3 is connected with the fourteenth node N14, and a second end of the third capacitor C3 is connected with the signal output line G(n) of the present level. The first end of the fourth capacitor C4 is connected with the twelfth node N12, and a second end of the fourth capacitor C4 is connected with the high voltage line VGH.

In an exemplary implementation mode, when a level of the first clock signal line CLK is a valid level, a level of the second clock signal line CLKB is an invalid level, and when the level of the second clock signal line CLKB is a valid level, the level of the first clock signal line CLK is an invalid level. The high voltage line VGH continuously provides a high-level signal, and the low voltage line VGL continuously provides a low-level signal.

In an exemplary implementation mode, a pulse duration of a valid level signal of the first clock signal line CLK and a pulse duration of a valid level signal of the second clock signal line CLKB may be substantially equal.

In an exemplary implementation mode, the twenty-first transistor T21 to the twenty-eighth transistor T28 may all be N-type thin film transistors, or may all be P-type thin film transistors, so that process flows may be unified and process preparation procedures can be reduced, which is conducive to improving a yield of products. Considering that a leakage current of a low temperature poly silicon thin film transistor is relatively small, the twenty-first transistor T21 to the twenty-eighth transistor T28 may be low temperature poly silicon thin film transistors, and a bottom gate structure or a top gate structure may be adopted for the thin film transistors.

An exemplary embodiment of the present disclosure provides a display substrate. In an exemplary implementation mode, the display substrate includes a plurality of first circuit regions and a plurality of second circuit regions alternately disposed in a second direction, wherein a first circuit region includes a plurality of repeat units and a plurality of blank units alternately disposed in a first direction, the first direction and the second direction intersect; a repeat unit includes a plurality of circuit units, wherein a circuit unit includes a pixel drive circuit, and a data signal line and a drive signal line connected with the pixel drive circuit; a second circuit region includes at least one gate unit, the gate unit includes at least one gate drive circuit, the gate drive circuit is connected with a drive signal line in an adjacent circuit unit, an orthographic projection of the gate drive circuit on a plane of the display substrate is not overlapped with an orthographic projection of the data signal line on the plane of the display substrate.

In an exemplary implementation mode, at least one second circuit region has a reference line that is a straight line bisecting the second circuit region in the second direction and extending along the first direction; an orthographic projection of at least one gate drive circuit on the reference line is at least partially overlapped with an orthographic projection of at least one blank unit on the reference line.

In an exemplary implementation mode, at least one gate drive circuit is further connected with a clock signal line, a high voltage line, and a low voltage line; in the first direction, the clock signal line is disposed between the high voltage line and the low voltage line, and an orthographic projection of the clock signal line on the plane of the display substrate is not overlapped with an orthographic projection of the data signal line on the plane of the display substrate.

In an exemplary implementation mode, in the first direction, the data signal line is disposed on a side of the high voltage line away from the low voltage line, or the data signal line is disposed on a side of the low voltage line away from the high voltage line.

In an exemplary implementation mode, at least one second circuit region further includes at least one first mark, and a setting position of the at least one first mark in the second circuit region corresponds to a setting position of at least one blank unit in the first circuit region.

In an exemplary implementation mode, at least one second circuit region further includes at least one second mark, and a setting position of the at least one second mark in the second circuit region corresponds to a setting position of at least one blank unit in the first circuit region.

In an exemplary implementation mode, on a plane perpendicular to the display substrate, the display substrate includes a first gate metal layer, a second gate metal layer, a first source-drain metal layer, and a second source-drain metal layer that are sequentially disposed on a base substrate, the drive signal line is disposed in the second gate metal layer, and the data signal line and the clock signal line are disposed in the first source-drain metal layer.

In an exemplary implementation mode, at least one second circuit region further includes at least one first mark disposed in the first source-drain metal layer and at least one second mark disposed in the second source-drain metal layer.

Figure 7:
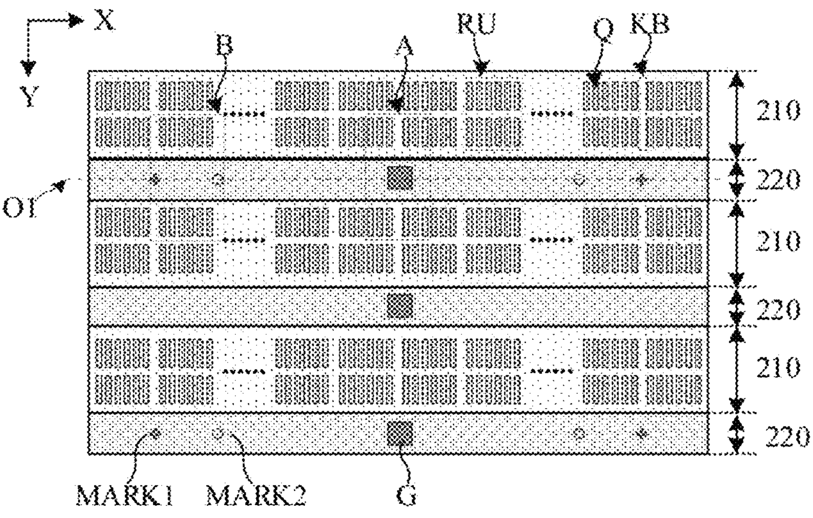
FIG. 7 is a schematic diagram of a planar structure of a display substrate according to an exemplary embodiment of the present disclosure.

FIG. 7 is a schematic diagram of a planar structure of a display substrate according to an exemplary embodiment of the present disclosure, illustrating a planar structure of a drive structure layer in the display substrate. On a plane perpendicular to the display substrate, a display substrate 200 may at least include a drive structure layer disposed on a base substrate and a light emitting structure layer disposed on a side of the drive structure layer away from the base substrate. On a plane parallel to the display substrate, the drive structure layer may at least include a plurality of first circuit regions 210 and a plurality of second circuit regions 220. As shown in FIG. 7, a shape of each of the first circuit regions 210 and the second circuit regions 220 may be a strip shape extending along a first direction X, and the plurality of first circuit regions 210 and the plurality of second circuit regions 220 may be alternately disposed along a second direction Y. In an exemplary implementation mode, a first circuit region may be referred to as a pixel circuit region and a second circuit region may be referred to as a gate circuit region.

In an exemplary implementation mode, a first circuit region 210 may include a plurality of repeat units RU and a plurality of blank units KB, and the plurality of repeat units RU and the plurality of blank units KB may be alternately disposed along the first direction X. At least one repeat unit RU may include m1*m2 circuit units Q, m1 may be a quantity of unit rows that the repeat unit RU includes, m2 may be a quantity of unit columns that the repeat unit RU includes, and m1 and m2 may be positive integers greater than or equal to 2. For example, the repeat unit RU may include 2 unit rows and 3 unit columns, and the repeat unit RU forms an array of 2*3 circuit units. For another example, the repeat unit RU may include 2 unit rows and 6 unit columns, and the repeat unit RU forms an array of 2*6 circuit units.

In an exemplary implementation mode, a repeat unit RU may be a region where a pixel drive circuit is disposed, and a blank unit KB may be a region where no pixel drive circuit is disposed. In an exemplary implementation mode, part of the blank unit KB may serve as a trace region of a gate drive apparatus to reduce interference between signal lines. Part of the blank unit KB may be used as a light transmitting region of the display substrate, such that external light may pass through the display substrate to form transparent display. In an exemplary implementation mode, a width of a blank unit KB may be greater than a width between adjacent circuit units Q within a repeat unit RU in the first direction X, and the width may be a size in the first direction X.

In an exemplary implementation mode, at least one circuit unit Q may at least include a pixel drive circuit, a drive signal line extending along the first direction X, and a data signal line extending along the second direction Y, wherein the pixel drive circuit is connected with the drive signal line and the data signal line, respectively. The pixel drive circuit is configured to receive a data voltage of the data signal line and output a corresponding current to a connected light emitting diode under control of the drive signal line. The light emitting structure layer may include a plurality of light emitting units, a light emitting unit may at least include a light emitting diode, light emitting diodes in the plurality of light emitting units are correspondingly connected with pixel drive circuits in a plurality of circuit units, such that a light emitting diode emits light with corresponding brightness under drive of a current output by a corresponding pixel drive circuit.

In an exemplary implementation mode, a second circuit region 220 may include at least one gate unit G that may include a gate drive circuit. The gate drive circuit is connected with a drive signal line in an adjacent first circuit region 210, and is configured to output a row drive signal to the connected drive signal line.

In an exemplary implementation mode, at least one second circuit region 220 may have a reference line O1 which may be a straight line bisecting the second circuit region 220 in the second direction Y and extending along the first direction X. In an exemplary implementation mode, a setting position of the at least one gate drive circuit in a second circuit region 220 may substantially correspond to a setting position of at least one blank unit KB in a first circuit region 210, and an orthographic projection of at least one gate drive circuit on the reference line O1 is at least partially overlapped with an orthographic projection of at least one blank unit KB on the reference line O1.

In an exemplary implementation mode, the at least one second circuit region 220 may further include at least one first mark MARK1, which may be located at one side edge or both side edges of the second circuit region 220 in the first direction X. The first mark MARK1 is configured as a splicing mark, and positioning is performed through the first mark MARK1 when the display substrate is spliced.

In an exemplary implementation mode, a shape of the first mark MARK1 may be a cross, a setting position of at least one first mark MARK1 in a second circuit region 220 may substantially correspond to a setting position of at least one blank unit KB in a first circuit region 210, and an orthographic projection of at least one first mark MARK1 on the reference line O1 is at least partially overlapped with an orthographic projection of at least one blank unit KB on the reference line O1.

In an exemplary implementation mode, the at least one second circuit region 220 may further include at least one second mark MARK2, which may be located at one side edge or both side edges of the second circuit region 220 in the first direction X and located on a side of a first mark MARK1 close to a gate unit G. The second mark MARK2 is configured as a bonding mark, and positioning is performed through the second mark MARK2 when a light emitting diode is bonded and connected.

In an exemplary implementation mode, a shape of the second mark MARK2 may be a circular shape, a setting position of at least one second mark MARK2 in a second circuit region 220 may substantially correspond to a setting position of at least one blank unit KB in a first circuit region 210, and an orthographic projection of at least one second mark MARK2 on the reference line O1 is at least partially overlapped with an orthographic projection of at least one blank unit KB on the reference line O1.

Figure 8:
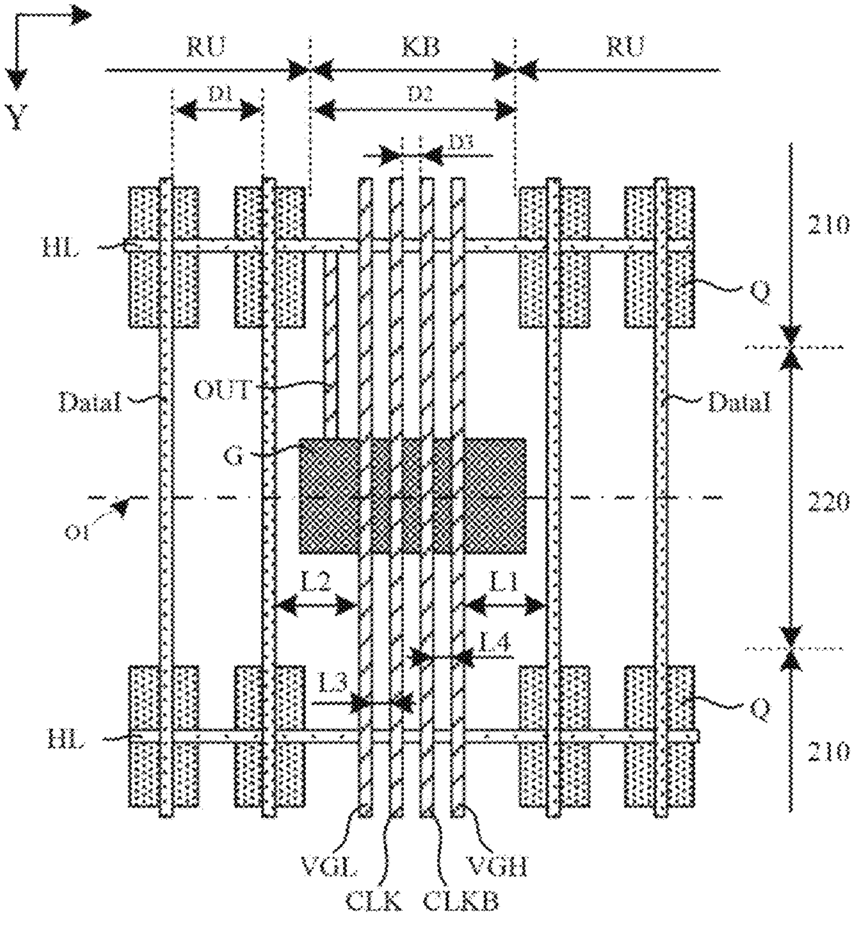
FIG. 8 is a schematic diagram of a gate drive circuit trace according to an exemplary embodiment of the present disclosure.

FIG. 8 is a schematic diagram of a gate drive circuit trace according to an exemplary embodiment of the present disclosure. As shown in FIG. 8, a pixel drive circuit in a circuit unit Q is connected with a drive signal line HL and a data signal line DataI. A shape of the drive signal line HL may be a line shape extending along a first direction X, and the drive signal line HL is configured to be connected with a plurality of pixel drive circuits in one unit row. A shape of the data signal line DataI may be a line shape extending along a second direction Y, and the data signal line DataI is configured to be connected with a plurality of pixel drive circuits in one unit column. A gate drive circuit in a gate unit G is connected with a first clock signal line CLK, a second clock signal line CLKB, a high voltage line VGH, and a low voltage line VGL, and the gate drive circuit is connected with a drive signal line HL in an adjacent unit row through an output line OUT.

In an exemplary implementation mode, the first clock signal line CLK, the second clock signal line CLKB, the high voltage line VGH, and the low voltage line VGL may have a line shape extending along the second direction Y and are sequentially disposed along the first direction X. The first clock signal line CLK, the second clock signal line CLKB, the high voltage line VGH, and the low voltage line VGL are configured to provide a first clock signal, a second clock signal, a high voltage signal, and a low voltage signal to a connected gate drive circuit, respectively. The first clock signal line CLK and the second clock signal line CLKB constitute a clock signal line of the present disclosure.

In an exemplary implementation mode, an orthographic projection of the gate drive circuit in the gate unit G on a plane of the display substrate is not overlapped with an orthographic projection of the data signal line DataI on the plane of the display substrate, and the gate drive circuit may include a twenty-first transistor to a twenty-eighth transistor, a third capacitor, and a fourth capacitor.

In an exemplary implementation mode, an orthographic projection of the first clock signal line CLK on the plane of the display substrate is not overlapped with the orthographic projection of the data signal line DataI on the plane of the display substrate, and an orthographic projection of the second clock signal line CLKB on the plane of the display substrate is not overlapped with the orthographic projection of the data signal line DataI on the plane of the display substrate.

In an exemplary implementation mode, the first clock signal line CLK may be substantially parallel to the data signal line DataI, the second clock signal line CLKB may be substantially parallel to the data signal line DataI, or the orthographic projection of the first clock signal line CLK on the plane of the display substrate may be substantially parallel to the orthographic projection of the data signal line DataI on the plane of the display substrate, and an orthographic projection of the second clock signal line CLKB on the plane of the display substrate may be substantially parallel to the orthographic projection of the data signal line DataI on the plane of the display substrate.

In an exemplary implementation mode, along the second direction Y, repeat units RU of a plurality of first circuit regions 210 may form a repeat unit column extending along the second direction Y, blank units KB of the plurality of first circuit regions 210 may form a blank column extending along the second direction Y, the data signal line DataI may be disposed in a region where the repeat unit column is located, and the first clock signal line CLK and the second clock signal line CLKB may be disposed in a region where the blank column is located, such that the data signal line DataI is not overlapped with the first clock signal line CLK or the second clock signal line CLKB.

In an exemplary implementation mode, along the first direction X, the first clock signal line CLK and the second clock signal line CLKB may be disposed between the high voltage line VGH and the low voltage line VGL such that the data signal line DataI is located on a side of the high voltage line VGH away from the first clock signal line CLK and the data signal line DataI is located on a side of the low voltage line VGL away from the second clock signal line CLKB. The high voltage line VGH and the low voltage line VGL transmitting a constant voltage signal may play a shielding role to effectively reduce a coupling capacitance between a clock signal line and a data signal line.

In an exemplary implementation mode, there is a first distance L1 between an edge on a side of the high voltage line VGH close to the data signal line DataI and an edge on a side of the data signal line DataI close to the high voltage line VGH, there is a second distance L2 between an edge on a side of the low voltage line VGL close to the data signal line DataI and an edge on a side of the data signal line DataI close to the low voltage line VGL, the second distance L2 may be greater than the first distance L1, and the first distance L1 and the second distance L2 may be sizes in the first direction X.

In an exemplary implementation mode, the first distance L1 may be greater than or equal to 25 μm, and the second distance L2 may be greater than or equal to 25 μm.

In an exemplary implementation mode, the second clock signal line CLKB may be disposed on a side of the first clock signal line CLK away from the low voltage line VGL, that is, the low voltage line VGL, the first clock signal line CLK, the second clock signal line CLKB, and the high voltage line VGH may be sequentially disposed along the first direction X. There is a third distance L3 between an edge on a side of the first clock signal line CLK close to the low voltage line VGL and an edge on a side of the low voltage line VGL close to the first clock signal line CLK, there is a fourth distance L4 between an edge on a side of the second clock signal line CLKB close to the high voltage line VGH and an edge on a side of the high voltage line VGH close to the second clock signal line CLKB, the third distance L3 may be greater than the fourth distance L4, and the third distance L3 and the fourth distance L4 may be sizes in the first direction X.

In an exemplary implementation mode, in at least one repeat unit RU, there may be a first width D1 between adjacent data signal lines DataI, at least one blank unit KB may have a second width D2, the second width D2 may be greater than the first width D1, and the first width D1 and the second width D2 may be sizes in the first direction X.

In an exemplary implementation mode, in at least one gate unit G, there may be a third width D3 between the first clock signal line CLK and the second clock signal line CLKB, the first width D1 may be greater than the third width D3, and the third width D3 may be a size in the first direction X.

FIG. 9 is a schematic diagram of an arrangement of gate units according to an exemplary embodiment of the present disclosure. As shown in FIG. 9, in an exemplary implementation mode, each gate circuit region may include one gate unit G, that is, a gate drive circuit in one gate unit G is connected with a drive signal line HL in one unit row through an output line OUT, and the gate unit G may be disposed in a middle position region of a display substrate.

In an exemplary implementation mode, the gate drive circuit in one gate unit G is connected with the drive signal line HL in one unit row through the output line OUT, which means that a drive signal line in a unit row includes a scan signal line and a light emitting signal line, a gate unit G includes a GOA circuit and an EOA circuit, a scan signal line in a unit row is connected with a GOA circuit through a scan output line, and a light emitting signal line in a unit row is connected with an EOA circuit through a light emitting output line.

In an exemplary implementation mode, at least one gate drive circuit may be disposed in a first midline region of a second circuit region 220, and the gate drive circuit is connected with a first midpoint region of a drive signal line HL through an output line OUT. Among them, the second circuit region 220 may have a first midline, the drive signal line HL may have a first midpoint, the first midline may be a straight line bisecting the second circuit region 220 in a first direction X and extending along a second direction Y, and the first midpoint may be a point bisecting the drive signal line HL in the first direction X. The first midline region may be a region including the first midline, a width of the first midline region in the first direction X may be about 1% to 10% of a width of the display substrate, the first midpoint region may be a region including the first midpoint, the width of the first midline region in the first direction X may be about 1% to 10% of the width of the display substrate, and the width of the display substrate may be a size of the display substrate in the first direction X.

Researches show that when a gate unit G is disposed on a side (for example, a left side) of a display substrate, a row drive signal is transmitted from the left side of the display substrate (a head end of a drive signal line) to a right side (a tail end of the drive signal line) of the display substrate. If a transmission distance of the row drive signal is L, Resistor-Capacitor (RC) delay of the tail end of the drive signal line is RC delay of a total length of the drive signal line. By disposing a gate unit G in a middle region of the display substrate in the present disclosure, a row drive signal is transmitted from a middle position (a head end of a drive signal line) of the display substrate to both sides (a tail end of the drive signal line) of the display substrate, and a transmission distance of the row drive signal is L/2, then RC delay of the tail end of the drive signal line may be reduced by half, relative to RC delay of a total length of the drive signal line, thereby effectively reducing RC delay and increasing charging time. In addition, by disposing the gate unit G in the middle region of the display substrate, a wiring pad and an anti-static circuit on both sides of the display substrate may be avoided, thereby effectively avoiding mutual interference between anti-static circuits of the gate drive circuit.

FIG. 10 is a schematic diagram of another arrangement of gate units according to an exemplary embodiment of the present disclosure. As shown in FIG. 10, in an exemplary implementation mode, each gate circuit region may include two gate units G, that is, gate drive circuits in two gate units G may be simultaneously connected with a drive signal line HL in one unit row through an output line OUT, respectively, and the two gate units G may be disposed in a ¼ position region and a ¾ position region of a display substrate, respectively.

In an exemplary implementation mode, the gate drive circuits in two gate units G are connected with the drive signal line HL in one unit row, which means that one gate unit G includes a first gate drive circuit and the other gate unit G includes a second gate drive circuit, and the drive signal line in one unit row is connected with the first gate drive circuit and the second gate drive circuit through the output line, respectively.

In an exemplary implementation mode, the first gate drive circuit may be disposed in a second midline region of a second circuit region 220, and is connected with a second midpoint region of the drive signal line HL through an output line. The second gate drive circuit may be disposed in a third midline region of the second circuit region 220, and is connected with a third midpoint region of the drive signal line HL through an output line. Among them, the second circuit region 220 may have a first midline bisecting the second circuit region 220 in a first direction X and extending along a second direction Y, the first midline divides the second circuit region 220 into a first region and a second region, a second midline may be a straight line bisecting the first region in the first direction X and extending along the second direction Y, and a third midline may be a straight line bisecting the second region in the first direction X and extending along the second direction Y. The second midline region may be a region including the second midline, a width of the second midline region in the first direction X may be about 1% to 10% of a width of the display substrate, and the third midline region may be a region including the third midline. A width of the third midline region in the first direction X may be about 1% to 10% of the width of the display substrate. The drive signal line HL may have a point bisecting the drive signal line HL in the first direction X, a first midpoint divides the drive signal line HL into a first line segment and a second line segment, a second midpoint may be a point bisecting the first line segment in the first direction X, and a third midpoint may be a point bisecting the second line segment in the first direction X. The second midpoint region may be a region including the second midpoint, a width of the second midpoint region in the first direction X may be about 1% to 10% of the width of the display substrate. The third midpoint region may be a region including the third midpoint, and a width of the third midpoint region in the first direction X may be about 1% to 10% of the width of the display substrate.

By disposing two gate units G in a ¼ position region and a ¾ position region of the display substrate in the present disclosure, a transmission distance of a row drive signal is L/4, then RC delay of a tail end of a drive signal line may be reduced to ¼, relative to RC delay of a total length of the drive signal line, thereby further reducing RC delay, and further increasing charging time.

FIGS. 11 and 12 are schematic diagrams of a planar structure of a display substrate according to an exemplary embodiment of the present disclosure. FIG. 11 illustrates a planar structure of a region A in FIG. 7, FIG. 12 illustrates a planar structure of a region B in FIG. 7, a circuit unit includes the pixel drive circuit shown in FIG. 4, and a gate unit includes the gate drive circuit shown in FIG. 6. As shown in FIGS. 11 and 12, a first circuit region 210 may include a plurality of repeat units RU and a plurality of blank units KB, and the plurality of repeat units RU and the plurality of blank units KB may be alternately disposed along a first direction X. A second circuit region 220 may at least include one gate drive circuit. At least one repeat unit RU includes 12 circuit units forming 2 unit rows and 6 unit columns, each unit row may include a first circuit unit Q1, a second circuit unit Q2, and a third circuit unit Q3 periodically disposed along the first direction X. The first circuit unit Q1 may at least include a first pixel drive circuit, the second circuit unit Q2 may at least include a second pixel drive circuit, and the third circuit unit Q3 may at least include a third pixel drive circuit. The first pixel drive circuit is configured to be connected with a red light emitting diode, the second pixel drive circuit is configured to be connected with a green light emitting diode, and the third pixel drive circuit is configured to be connected with a blue light emitting diode.

As shown in FIG. 11, in an exemplary implementation mode, a pixel drive circuit of at least one circuit unit may at least include a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, a storage capacitor Cs, a first capacitor C1, and a second capacitor C2. The pixel drive circuit may be connected with a first scan signal line S1, a second scan signal line S2, a light emitting signal line EM, an initial signal line Vint, a data signal line DataI, and a high-frequency signal line Hf, respectively. Shapes of the first scan signal line S1, the second scan signal line S2, the light emitting signal line EM, and the initial signal line Vint may be line shapes extending along the first direction X, and shapes of the data signal line DataI and the high-frequency signal line Hf may be line shapes extending along a second direction Y. The pixel drive circuit is configured to receive a data voltage of a data signal line and an initial voltage of the initial signal line Vint under control of the first scan signal line S1, the second scan signal line S2, the light emitting signal line EM, and the high-frequency signal line Hf, and output a corresponding current with a corresponding time length to a connected light emitting diode.

In an exemplary implementation mode, at least one second circuit region 220 may have a reference line O1 which is a straight line bisecting the second circuit region 220 in the second direction Y and extending along the first direction X. Pixel drive circuits in first circuit regions 210 on both sides of the second circuit region 220 in the second direction Y may be mirror-symmetrical with respect to the reference line O1.

In an exemplary implementation mode, the gate drive circuit may include a twenty-first transistor T21, a twenty-second transistor T22, a twenty-third transistor T23, a twenty-fourth transistor T24, a twenty-fifth transistor T25, a twenty-sixth transistor T26, a twenty-seventh transistor T27, a twenty-eighth transistor T28, a third capacitor C3, and a fourth capacitor C4, and the gate drive circuit may be connected with a first clock signal line CLK, a second clock signal line CLKB, a high voltage line VGH, and a low voltage line VGL, respectively. In an exemplary implementation mode, one gate unit may include a first GOA circuit, a second GOA circuit, and an EOA circuit, the first GOA circuit may be connected with the first scan signal line S1 through an output line, the second GOA circuit may be connected with the second scan signal line S2 through an output line, and the EOA circuit may be connected with the light emitting signal line EM through an output line. FIG. 12 illustrates only a structure of the second GOA circuit.

In an exemplary implementation mode, a setting position of the gate drive circuit may substantially correspond to a setting position of at least one blank unit KB in a first circuit region 210, and an orthographic projection of the gate drive circuit on the reference line O1 is at least partially overlapped with an orthographic projection of at least one blank unit KB on the reference line O1.

In an exemplary implementation mode, an orthographic projection of the gate drive circuit on a plane of the display substrate is not overlapped with an orthographic projection of the data signal line DataI on the plane of the display substrate.

In an exemplary implementation mode, the first clock signal line CLK, the second clock signal line CLKB, the high voltage line VGH, and the low voltage line VGL may have a line shape extending along the second direction Y, and are sequentially disposed along the first direction X.

In an exemplary implementation mode, orthographic projections of the first clock signal line CLK and the second clock signal line CLKB on the plane of the display substrate are not overlapped with the orthographic projection of the data signal line DataI on the plane of the display substrate.

In an exemplary implementation mode, the first clock signal line CLK may be substantially parallel to the data signal line DataI, the second clock signal line CLKB may be substantially parallel to the data signal line DataI, or the orthographic projection of the first clock signal line CLK on the plane of the display substrate may be substantially parallel to the orthographic projection of the data signal line DataI on the plane of the display substrate, and an orthographic projection of the second clock signal line CLKB on the plane of the display substrate may be substantially parallel to the orthographic projection of the data signal line DataI on the plane of the display substrate.

In an exemplary implementation mode, orthographic projections of the first clock signal line CLK and the second clock signal line CLKB on the plane of the display substrate are not overlapped with an orthographic projection of the gate drive circuit on the plane of the display substrate.

In an exemplary implementation mode, the first clock signal line CLK and the second clock signal line CLKB may be disposed between the high voltage line VGH and the low voltage line VGL, such that the high voltage line VGH and the low voltage line VGL transmitting a constant voltage signal may play a shielding role to effectively reduce a coupling capacitance between a clock signal line and a data signal line.

In an exemplary implementation mode, there is a first distance L1 between an edge on a side of the high voltage line VGH close to the data signal line DataI and an edge on a side of the data signal line DataI close to the high voltage line VGH, there is a second distance L2 between an edge on a side of the low voltage line VGL close to the data signal line DataI and an edge on a side of the data signal line DataI close to the low voltage line VGL, the second distance L2 may be greater than the first distance L1, and the first distance L1 and the second distance L2 may be sizes in the first direction X.

In an exemplary implementation mode, the first distance L1 may be greater than or equal to 25 μm, and the second distance L2 may be greater than or equal to 25 μm.

In an exemplary implementation mode, there is a third distance L3 between an edge on a side of the first clock signal line CLK close to the low voltage line VGL and an edge on a side of the low voltage line VGL close to the first clock signal line CLK, there is a fourth distance L4 between an edge on a side of the second clock signal line CLKB close to the high voltage line VGH and an edge on a side of the high voltage line VGH close to the second clock signal line CLKB, the third distance L3 may be greater than the fourth distance L4, and the third distance L3 and the fourth distance L4 may be sizes in the first direction X.

As shown in FIG. 12, in an exemplary implementation mode, the second circuit region 220 may further include at least one first mark MARK1 and at least one second mark MARK2. The first mark MARK1 may have a cross shape, and the second mark MARK2 may have a circular shape.

In an exemplary implementation mode, a setting position of the first mark MARK1 in the second circuit region 220 may substantially correspond to a setting position of at least one blank unit KB in a first circuit region 210, and an orthographic projection of the at least one first mark MARK1 on the reference line O1 is at least partially overlapped with an orthographic projection of at least one blank unit KB on the reference line O1.

In an exemplary implementation mode, a setting position of the second mark MARK2 in the second circuit region 220 may substantially correspond to a setting position of at least one blank unit KB in a first circuit region 210, and an orthographic projection of the at least one second mark MARK2 on the reference line O1 is at least partially overlapped with an orthographic projection of at least one blank unit KB on the reference line O1.

In an exemplary implementation mode, orthographic projections of the first mark MARK1 and the second mark MARK2 on the plane of the display substrate are not overlapped with orthographic projections of the first scan signal line S1, the second scan signal line S2, the light emitting signal line EM, the high-frequency signal line Hf, the initial signal line Vint, the data signal line DataI, the first clock signal line CLK, the second clock signal line CLKB, the high voltage line VGH, and the low voltage line VGL on the plane of the display substrate.

In an exemplary implementation mode, on a plane perpendicular to the display substrate, the display substrate may include a first gate metal layer, a second gate metal layer, a first source-drain metal layer, and a second source-drain metal layer that are sequentially disposed on a base substrate. One electrode plate of a plurality of capacitors may be disposed in the first gate metal layer. The first scan signal line S1, the second scan signal line S2, the light emitting signal line EM, and the other electrode plate of the plurality of capacitors may be disposed in the second gate metal layer. The data signal line DataI, the high-frequency signal line Hf, the first clock signal line CLK, the second clock signal line CLKB, the high voltage line VGH, and the low voltage line VGL may be disposed in the first source-drain metal layer, and a high voltage power supply line and a low voltage power supply line may be disposed in the second source-drain metal layer.

In an exemplary implementation mode, the first mark MARK1 may be disposed in the first source-drain metal layer and the second mark MARK2 may be disposed in the second source-drain metal layer.

In the present disclosure, a structure A extends along a direction B means that the structure A may include a main body portion and a secondary portion connected with the main body portion, the main body portion is substantially in a shape of a strip extending along one direction, a shape of the secondary portion is not limited, the main body portion is at least 60% of the structure A; the main body portion extends along the direction B, and a size of the main body portion extending along the direction B is larger than a size of the secondary portion extending along another direction. In following description, "a structure A extends along a direction B" means that a main body portion of the structure A extends along the direction B.

Exemplary description is made below through a preparation process of a display substrate. A "patterning process" mentioned in the present disclosure includes photoresist coating, mask exposure, development, etching, photoresist stripping, and another treatment for a metal material, an inorganic material, or transparent conductive material, and includes organic material coating, mask exposure, development, and another treatment for an organic material. Deposition may be any one or more of sputtering, evaporation, and chemical vapor deposition, coating may be any one or more of spray coating, spin coating, and inkjet printing, and etching may be any one or more of dry etching and wet etching, the present disclosure is not limited thereto. A "thin film" refers to a layer of thin film formed from a certain material on a base substrate using deposition, coating, or another process. If the "thin film" does not need a patterning process in an entire manufacturing process, the "thin film" may also be called a "layer". If the "thin film" needs the patterning process in the entire manufacturing process, the "thin film" is called a "thin film" before the patterning process and is called a "layer" after the patterning process. The "layer" after the patterning process contains at least one "pattern". "A and B are disposed in a same layer" in the present disclosure means that A and B are formed simultaneously through a same patterning process, and a "thickness" of a film layer is a size of the film layer in a direction perpendicular to the display substrate. In an exemplary embodiment of the present disclosure, "an orthographic projection of B is within a range of an orthographic projection of A" or "an orthographic projection of A contains an orthographic projection of B" refers to that a boundary of the orthographic projection of B falls within a range of a boundary of the orthographic projection of A, or the boundary of the orthographic projection of A is overlapped with the boundary of the orthographic projection of B.

In an exemplary implementation mode, the preparation process of the display substrate may include following operations.

(1) Forming a pattern of a first conductive layer. In an exemplary implementation mode, the forming the pattern of the first conductive layer may include: depositing a first conductive thin film on a base substrate, and patterning the first conductive thin film using a patterning process, to form the pattern of the first conductive layer disposed on the base substrate, as shown in FIGS. 13, 14, and 15, wherein FIG. 13 is a structure of a region A in FIG. 7, FIG. 14 is an enlarged view of a circuit unit in FIG. 13, and FIG. 15 is an enlarged view of a gate drive circuit in FIG. 13. In an exemplary implementation mode, the first conductive layer may be referred to as a first gate metal (GATE1) layer.

As shown in FIGS. 13 and 14, in an exemplary implementation mode, a pattern of a first conductive layer of each circuit unit may at least include a first electrode plate CF1, a second electrode plate CF2, a third electrode plate CF3, and a third bottom gate electrode Gate3-B.

In an exemplary implementation mode, shapes of the first electrode plate CF1, the second electrode plate CF2, and the third electrode plate CF3 may be rectangles, and corners of the rectangles may be chamfered. In the first direction X, the first electrode plate CF1 may be disposed on a side of the second electrode plate CF2 in the first direction X. In the second direction Y, the first electrode plate CF1 and the second electrode plate CF2 may be disposed on a side of the circuit unit in the second direction Y, and the third electrode plate CF3 may be disposed on the other side of the circuit unit in the second direction Y.

In an exemplary implementation mode, the first electrode plate CF1 may serve as an electrode plate of a first capacitor in a pixel drive circuit, the second electrode plate CF2 may serve as an electrode plate of a second capacitor in the pixel drive circuit, and the third electrode plate CF3 may serve as an electrode plate of a storage capacitor in the pixel drive circuit. Positions, shapes, and sizes of the first electrode plate CF1, the second electrode plate CF2, and the third electrode plate CF3 in the first circuit unit Q1, the second circuit unit Q2, and the third circuit unit Q3 may be substantially the same.

In an exemplary implementation mode, a side of the third electrode plate CF3 in the first direction X or a side of the third electrode plate CF3 in a direction opposite to the first direction X may be connected with an electrode plate connection line, and a shape of the electrode plate connection line may be a strip shape extending along the first direction X. A first end of the electrode plate connection line is connected with the third electrode plate CF3 of the present circuit unit, and a second end of the electrode plate connection line is connected with a third electrode plate CF3 of an adjacent circuit unit after extending along the first direction X or the direction opposite to the first direction X, so as to connect third electrode plates CF3 in a unit row.

In an exemplary implementation mode, a plurality of third electrode plates CF3 and a plurality of electrode plate connection lines in one unit row may be of an interconnected integral structure. In an exemplary implementation mode, since a third electrode plate CF3 in each circuit unit is connected with a high voltage power supply line formed subsequently, by forming third electrode plates CF3 in adjacent circuit units into an interconnected integral structure, the third electrode plates CF3 in the integral structure may be multiplexed as a high voltage power supply signal line, so as to ensure that a plurality of third electrode plates CF3 in one unit row have a same potential, which is beneficial to improving uniformity of a panel and avoiding poor display of the display substrate, thereby ensuring a display effect of the display substrate.

In an exemplary implementation mode, the third bottom gate electrode Gate3-B may serve as a bottom gate electrode of a third transistor (drive transistor). A shape of the third bottom gate electrode Gate3-B may be an "L" shape, and in the second direction Y, the third bottom gate electrode Gate3-B may be located on a side of the third electrode plate CF3 away from the first electrode plate CF1 and the second electrode plate CF2.

In an exemplary implementation mode, positions, shapes, and sizes of third bottom gate electrodes Gate3-B in the first circuit unit Q1, the second circuit unit Q2, and the third circuit unit Q3 may be substantially the same.

In an exemplary implementation mode, patterns of first conductive layers located on both sides of a second circuit region 220 in the second direction Y may be mirror symmetrical with respect to a reference line, and the reference line may be a straight line bisecting the second circuit region 220 in the second direction Y and extending along the first direction X.

As shown in FIGS. 13 and 15, in an exemplary implementation mode, a pattern of a first conductive layer of each gate drive circuit may at least include an eleventh electrode plate CF11 and a twelfth electrode plate CF12.

In an exemplary implementation mode, shapes of the eleventh electrode plate CF11 and the twelfth electrode plate CF12 may be rectangles, and corners of the rectangles may be chamfered. In the first direction X, the twelfth electrode plate CF12 may be disposed on a side of the eleventh electrode plate CF11 in the first direction X. The eleventh electrode plate CF11 may serve as an electrode plate of a third capacitor in the gate drive circuit, and the twelfth electrode plate CF12 may serve as an electrode plate of a fourth capacitor in the gate drive circuit.

(2) Forming a pattern of a semiconductor layer. In an exemplary implementation mode, the forming the pattern of the semiconductor layer may include: sequentially depositing a first insulation thin film and a semiconductor thin film on the base substrate, and patterning the semiconductor thin film using a patterning process, to form a first insulation layer covering the first conductive layer and the pattern of the semiconductor layer disposed on the first insulation layer, as shown in FIGS. 16, 17, and 18, wherein FIG. 16 is a structure of a region A in FIG. 7, FIG. 17 is an enlarged view of a circuit unit in FIG. 16, and FIG. 18 is an enlarged view of a gate drive circuit in FIG. 16.

As shown in FIGS. 16 and 17, in an exemplary implementation mode, a pattern of a semiconductor layer of each circuit unit may at least include a first active layer AT1 to an eleventh active layer AT11.

In an exemplary implementation mode, the first active layer AT1 may be an active layer of a first transistor T1, the second active layer AT2 may be an active layer of a second transistor T2, the third active layer AT3 may be an active layer of a third transistor T3, the fourth active layer AT4 may be an active layer of a fourth transistor T4, the fifth active layer AT5 may be an active layer of a fifth transistor T5, the sixth active layer AT6 may be an active layer of a sixth transistor T6, the seventh active layer AT7 may be an active layer of a seventh transistor T7, the eighth active layer AT8 may be an active layer of an eighth transistor T8, the ninth active layer AT9 may be an active layer of a ninth transistor T9, the tenth active layer AT10 may be an active layer of a tenth transistor T10, and the eleventh active layer AT11 may be an active layer of an eleventh transistor T11.

In an exemplary implementation mode, shapes of the first active layer AT1, the second active layer AT2, the fourth active layer AT4, the seventh active layer AT7, the eighth active layer AT8, the ninth active layer AT9, and the tenth active layer AT10 may be strip shapes extending along the first direction X, and shapes of the third active layer AT3, the fifth active layer AT5, the sixth active layer AT6, and the eleventh active layer AT11 may be rectangles.

In an exemplary implementation mode, the second active layer AT2 to the sixth active layer AT6 may be located on a side of the third electrode plate CF3 away from the first electrode plate CF1, and the first active layer AT1 and the seventh active layer AT7 to the eleventh active layer AT11 may be located between the first electrode plate CF1 and the third electrode plate CF3.

In an exemplary implementation mode, the third active layer AT3 may be located on a side of the third electrode plate CF3 away from the first electrode plate CF1, and an orthographic projection of the third active layer AT3 on the base substrate is at least partially overlapped with an orthographic projection of the third bottom gate electrode Gate3-B on the base substrate. The second active layer AT2 may be located on a side of the third active layer AT3 in the first direction X, and the fourth active layer AT4 may be located on a side of the third active layer AT3 in a direction opposite to the first direction X. The fifth active layer AT5 and the sixth active layer AT6 may be located between the third electrode plate CF3 and the third active layer AT3, and the sixth active layer AT6 may be located on a side of the fifth active layer AT5 in the first direction X.

In an exemplary implementation mode, the tenth active layer AT10 may be located on a side of the first electrode plate CF1 close to the third electrode plate CF3, the eighth active layer AT8 may be located on a side of the tenth active layer AT10 close to the third electrode plate CF3, the eleventh active layer AT11 may be located on a side of the tenth active layer AT10 close to the third electrode plate CF3, the first active layer AT1 and the seventh active layer AT7 may be located on a side of the eighth active layer AT8 in the first direction X, the first active layer AT1 and the seventh active layer AT7 may be of an interconnected integral structure, and the ninth active layer AT9 may be located on a side of the eleventh active layer AT11 in the first direction X.

In an exemplary implementation mode, a width of a third active layer AT3 in the first circuit unit Q1 may be greater than a width of a third active layer AT3 in the second circuit unit Q2 and the third circuit unit Q3, and the width may be a size in the first direction X, such that a width-to-length ratio of a drive transistor (the third transistor T3) in the first circuit unit Q1 is greater than a width-to-length ratio of a drive transistor in the second circuit unit Q2 and the third circuit unit Q3.

In an exemplary implementation mode, the first active layer AT1 to the eleventh active layer AT11 may each include a first region, a second region, and a channel region located between the first region and the second region, first regions and second regions of a plurality of active layers may be individually disposed, and a first region of the first active layer AT1 and a first region of the seventh active layer AT7 are connected with each other.

In an exemplary implementation mode, patterns of semiconductor layers located on both sides of a second circuit region 220 in the second direction Y may be mirror-symmetrical with respect to a reference line.

As shown in FIGS. 16 and 18, in an exemplary implementation mode, a pattern of a semiconductor layer of each gate drive circuit may at least include a twenty-first active layer AT21 to a twenty-eighth active layer AT28.

In an exemplary implementation mode, the twenty-first active layer AT21 may serve as an active layer of a twenty-first transistor T21, the twenty-second active layer AT22 may serve as an active layer of a twenty-second transistor T22, the twenty-third active layer AT23 may serve as an active layer of a twenty-third transistor T23, the twenty-fourth active layer AT24 may serve as an active layer of a twenty-fourth transistor T24, the twenty-fifth active layer AT25 may serve as an active layer of a twenty-fifth transistor T25, the twenty-sixth active layer AT26 may serve as an active layer of a twenty-sixth transistor T26, the twenty-seventh active layer AT27 may serve as an active layer of a twenty-seventh transistor T27, and the twenty-eighth active layer AT28 may serve as an active layer of a twenty-eighth transistor T28.

In an exemplary implementation mode, shapes of the twenty-first active layer AT21, the twenty-second active layer AT22, the twenty-third active layer AT23, the twenty-sixth active layer AT26, the twenty-seventh active layer AT27, and the twenty-eighth active layer AT28 may be strip shapes extending along the second direction Y, and shapes of the twenty-fourth active layer AT24 and the twenty-fifth active layer AT25 may be parallel structures of a plurality of strip shapes extending along the second direction Y.

In an exemplary implementation mode, the twenty-fourth active layer AT24 may be located on a side of the eleventh electrode plate CF11 in a direction opposite to the second direction Y, and the twenty-fifth active layer AT25 may be located on a side of the eleventh electrode plate CF11 in the second direction Y. The twenty-sixth active layer AT26 and the twenty-seventh active layer AT27 may be of an interconnected integral structure and may be located on a side of the twelfth electrode plate CF12 in the second direction Y, and the twenty-first active layer AT21 may be located on a side of the twenty-seventh active layer AT27 in the second direction Y. The twenty-eighth active layer AT28 may be located on a side of the eleventh electrode plate CF11 in the first direction X, the twenty-third active layer AT23 may be located on a side of the twenty-eighth active layer AT28 in the first direction X, and the twenty-second active layer AT22 may be located on a side of the twenty-third active layer AT23 in the first direction X.

In an exemplary implementation mode, the twenty-first active layer AT21 to the twenty-eighth active layer AT28 may each include a first region, a second region, and a channel region located between the first region and the second region, first regions and second regions of a plurality of active layers may be individually disposed, and a second region of the twenty-sixth active layer AT26 and a first region of the twenty-seventh active layer AT27 are connected with each other.

(3) Forming a pattern of a second conductive layer. In an exemplary implementation mode, the forming the pattern of the second conductive layer may include: sequentially depositing a second insulation thin film and a second conductive thin film on the base substrate on which the aforementioned patterns are formed, and patterning the second conductive thin film using a patterning process, to form a second insulation layer covering the semiconductor layer and the pattern of the second conductive layer disposed on the second insulation layer, as shown in FIGS. 19, 20, and 21, wherein FIG. 19 is a structure of a region A in FIG. 7, FIG. 20 is an enlarged view of a circuit unit in FIG. 19, and FIG. 21 is an enlarged view of a gate drive circuit in FIG. 19. In an exemplary implementation mode, the second conductive layer may be referred to as a second gate metal (GATE2) layer.

As shown in FIGS. 19 and 20, in an exemplary implementation mode, a pattern of a second conductive layer of each circuit unit at least includes a fourth electrode plate CF4, a fifth electrode plate CF5, a sixth electrode plate CF6, a first scan signal line S1, a second scan signal line S2, a light emitting signal line EM, a second control line CT2, an initial signal line Vint, a high-frequency connection line Hf-C, a high voltage connection line VDD-C, a low voltage connection line VSS-C, a plurality of gate electrodes, and a plurality of connection electrodes.

In an exemplary implementation mode, shapes of the fourth electrode plate CF4, the fifth electrode plate CF5, and the sixth electrode plate CF6 may be rectangles of which one corner is provided with a notch. An orthographic projection of the fourth electrode plate CF4 on the base substrate is at least partially overlapped with an orthographic projection of the first electrode plate CF1 on the base substrate. The fourth electrode plate CF4 may serve as the other electrode plate of the first capacitor, and the first electrode plate CF1 and the fourth electrode plate CF4 constitute one first capacitor of a pixel drive circuit. An orthographic projection of the fifth electrode plate CF5 on the base substrate is at least partially overlapped with an orthographic projection of the second electrode plate CF2 on the base substrate. The fifth electrode plate CF5 may serve as the other electrode plate of the second capacitor, the second electrode plate CF2 and the fifth electrode plate CF5 constitute one second capacitor of the pixel drive circuit. An orthographic projection of the sixth electrode plate CF6 on the base substrate is at least partially overlapped with an orthographic projection of the third electrode plate CF3 on the base substrate. The sixth electrode plate CF6 may serve as the other electrode plate of the storage capacitor, the third electrode plate CF3 and the sixth electrode plate CF6 constitute one storage capacitor of the pixel drive circuit.

In an exemplary implementation mode, positions, shapes, and sizes of the fourth electrode plate CF4, the fifth electrode plate CF5, and the sixth electrode plate CF6 in the first circuit unit Q1, the second circuit unit Q2, and the third circuit unit Q3 may be substantially the same.

In an exemplary implementation mode, shapes of the first scan signal line S1, the second scan signal line S2, the light emitting signal line EM, the second control line CT2, the initial signal line Vint, the high-frequency connection line Hf-C, the high voltage connection line VDD-C, and the low voltage connection line VSS-C may be a straight line or broken line in which a main body portion extends along the first direction X. The first scan signal line S1 may be located on a side of the sixth electrode plate CF6 away from the fourth electrode plate CF4 and the fifth electrode plate CF5, the high-frequency connection line Hf-C and the low voltage connection line VSS-C may be located on a side of the fourth electrode plate CF4 and the fifth electrode plate CF5 away from the sixth electrode plate CF6, and the second scan signal line S2, the light emitting signal line EM, the second control line CT2, the initial signal line Vint, and the high voltage connection line VDD-C may be located between the fourth electrode plate CF4 and the sixth electrode plate CF6.

In an exemplary implementation mode, the low voltage connection line VSS-C may be located on a side of the fourth electrode plate CF4 and the fifth electrode plate CF5 away from the sixth electrode plate CF6, and the high-frequency connection line Hf-C may be located on a side of the low voltage connection line VSS-C away from the fourth electrode plate CF4 and the fifth electrode plate CF5.

In an exemplary implementation mode, one of first circuit regions 210 located on both sides of a second circuit region 220 in the second direction Y may be provided with a high-frequency connection line Hf-C, and the other first circuit region 210 may not be provided with a high-frequency connection line Hf-C.

In an exemplary implementation mode, one of low voltage connection lines VSS-C located on both sides of the second circuit region 220 in the second direction Y may be provided with a bending section, which may be located in a region where a blank unit KB is located, and the bending section is bent toward a direction away from the second circuit region 220, so as to leave corresponding space for a gate drive circuit.

In an exemplary implementation mode, one of low voltage connection lines VSS-C located on both sides of the second circuit region 220 in the second direction Y may be provided with a plurality of connection bars, first ends of the plurality of connection bars are connected with a low voltage connection line VSS-C, and second ends of the plurality of connection bars extend along the second direction Y toward a direction of the second circuit region 220.

In an exemplary implementation mode, the initial signal line Vint may be located on a side of the fourth electrode plate CF4 and the fifth electrode plate CF5 close to the sixth electrode plate CF6, the second control line CT2 may be located on a side of the initial signal line Vint close to the sixth electrode plate CF6, the second scan signal line S2 may be located on a side of the second control line CT2 close to the sixth electrode plate CF6, the high voltage connection line VDD-C may be located on a side of the second scan signal line S2 close to the sixth electrode plate CF6, and the light emitting signal line EM may be located on a side of the high voltage connection line VDD-C close to the sixth electrode plate CF6.

In an exemplary implementation mode, the second scan signal line S2 may be multiplexed as a first control line to control turn-on and turn-off of an eighth transistor T8.

In an exemplary implementation mode, the high voltage connection line VDD-C is configured to connect to a subsequently formed high voltage power supply line to form a mesh-like communicated structure. The low voltage connection line VSS-C is configured to be connected with a subsequently formed low voltage power supply line to form a mesh-like communicated structure. The high-frequency connection line Hf-C is configured to be connected with a subsequently formed high-frequency signal line to form a mesh-like communicated structure.

In an exemplary implementation mode, a plurality of gate electrodes of each circuit unit may at least include a first gate electrode Gate1, a second gate electrode Gate2, a third top gate electrode Gate3-T, a fourth gate electrode Gate4, a fifth gate electrode Gate5, a sixth gate electrode Gate6, a seventh gate electrode Gate6, an eighth gate electrode Gate7, a ninth gate electrode Gate9, a tenth gate electrode Gate10, and an eleventh gate electrode Gate11.

In an exemplary implementation mode, the second gate electrode Gate2 and the fourth gate electrode Gate4 may be disposed on a side of the first scan signal line S1 close to the sixth electrode plate CF6. The second gate electrode Gate2 serves as a gate electrode of the second transistor T2, and an orthographic projection of the second gate electrode Gate2 on the base substrate is at least partially overlapped with an orthographic projection of a second active layer on the base substrate. The fourth gate electrode Gate4 serves as a gate electrode of the fourth transistor T4, and an orthographic projection of the fourth gate electrode Gate4 on the base substrate is at least partially overlapped with an orthographic projection of the fourth active layer on the base substrate. In an exemplary implementation mode, the first scan signal line S1, the second gate electrode Gate2, and the fourth gate electrode Gate4 may be of an interconnected integral structure.

In an exemplary implementation mode, the first gate electrode Gate1, the seventh gate electrode Gate7, and the eighth gate electrode Gate8 may be disposed on a side of the second scan signal line S2 away from the initial signal line Vint. The first gate electrode Gate1 serves as a gate electrode of the first transistor T1, and an orthographic projection of the first gate electrode Gate1 on the base substrate is at least partially overlapped with an orthographic projection of a first active layer on the base substrate. The seventh gate electrode Gate7 serves as a gate electrode of the seventh transistor T7, and an orthographic projection of the seventh gate electrode Gate7 on the base substrate is at least partially overlapped with an orthographic projection of a seventh active layer on the base substrate. The eighth gate electrode Gate 8 serves as a gate electrode of the eighth transistor T8, and an orthographic projection of the eighth gate electrode Gate 8 on the base substrate is at least partially overlapped with an orthographic projection of an eighth active layer on the base substrate. In an exemplary implementation mode, the second scan signal line S2, the first gate electrode Gate1, the seventh gate electrode Gate7, and the eighth gate electrode Gate8 may be of an interconnected integral structure.

In an exemplary implementation mode, the tenth gate electrode Gate 10 may be disposed on a side of the second control line CT2 close to the initial signal line Vint. The tenth gate electrode Gate 10 serves as a gate electrode of the tenth transistor T10, and an orthographic projection of the tenth gate electrode Gate 10 on the base substrate is at least partially overlapped with an orthographic projection of a tenth active layer on the base substrate. In an exemplary implementation mode, the second control line CT2 and the tenth gate electrode Gate 10 may be of an interconnected integral structure.

In an exemplary implementation mode, the third top gate electrode Gate3-T may serve as a top gate electrode of the third transistor T3, an orthographic projection of the third top gate electrode Gate3-T on the base substrate is at least partially overlapped with an orthographic projection of a third active layer on the substrate, and the orthographic projection of the third top gate electrode Gate3-T on the base substrate is at least partially overlapped with an orthographic projection of the third bottom gate electrode Gate3-B on the base substrate.

In an exemplary implementation mode, the fifth gate electrode Gate5 may serve as a gate electrode of the fifth transistor T5, and an orthographic projection of the fifth gate electrode Gate5 on the base substrate is at least partially overlapped with an orthographic projection of a fifth active layer on the base substrate. The fifth gate electrode Gate5 may be located between the light emitting signal line EM and the third top gate electrode Gate3-T, and a shape of the fifth gate electrode Gate5 may be a comb shape.

In an exemplary implementation mode, the sixth gate electrode Gate6 may serve as a gate electrode of the sixth transistor T6, and an orthographic projection of the sixth gate electrode Gate6 on the base substrate is at least partially overlapped with an orthographic projection of a sixth active layer on the base substrate. The sixth gate electrode Gate6 may be located between the light emitting signal line EM and the third top gate electrode Gate3-T, and a shape of the sixth gate electrode Gate6 may be a comb shape.

In an exemplary implementation mode, the ninth gate electrode Gate9 may serve as a gate electrode of the ninth transistor T9, and an orthographic projection of the ninth gate electrode Gate9 on the base substrate is at least partially overlapped with an orthographic projection of a ninth active layer on the base substrate. The ninth gate electrode Gate 9 may be located between the second scan signal line S2 and the high voltage connection line VDD-C, and a shape of the ninth gate electrode Gate 9 may be a rectangle.

In an exemplary implementation mode, the eleventh gate electrode Gate 11 may serve as a gate electrode of the eleventh transistor T11, and an orthographic projection of the eleventh gate electrode Gate 11 on the base substrate is at least partially overlapped with an orthographic projection of an eleventh active layer on the base substrate. The eleventh gate electrode Gate 11 may be between the second scan signal line S2 and the high voltage connection line VDD-C, and a shape of the eleventh gate electrode Gate 11 may be a strip shape.

In an exemplary implementation mode, a plurality of connection electrodes of each circuit unit at least include: a first connection electrode CO1, a second connection electrode CO2, a third connection electrode CO3, a fourth connection electrode CO4, a fifth connection electrode CO5, a sixth connection electrode CO6, a seventh connection electrode CO7, and an eighth connection electrode CO8.

In an exemplary implementation mode, a shape of the first connection electrode CO1 may be a strip shape extending along the first direction X. The first connection electrode CO1 may be disposed between the second scan signal line S2 and the high voltage connection line VDD-C, and is configured to be connected with a high-frequency signal line Hf and a twenty-fourth connection electrode that are formed subsequently.

In an exemplary implementation mode, a shape of the second connection electrode CO2 may be a strip shape extending along the first direction X. The second connection electrode CO2 may be disposed between the second scan signal line S2 and the high voltage connection line VDD-C, and is configured to be connected with a twenty-second connection electrode and a twenty-third connection electrode that are formed subsequently.

In an exemplary implementation mode, a shape of the third connection electrode CO3 may be a rectangular shape. The third connection electrode CO3 may be disposed on a side of the second connection electrode CO2 close to the second scan signal line S2, and is configured to be connected with a twenty-fifth connection electrode that is formed subsequently.

In an exemplary implementation mode, a shape of the fourth connection electrode CO4 may be a broken line extending along the second direction Y. The fourth connection electrode CO4 may be disposed on a side of the third top gate electrode Gate3-T close to the sixth electrode plate CF6, a first end of the fourth connection electrode CO4 is connected with the third top gate electrode Gate3-T, and a second end of the fourth connection electrode CO4 is connected with the sixth electrode plate CF6. In an exemplary implementation mode, the third top gate electrode Gate3-T, the sixth electrode plate CF6, and the fourth connection electrode CO4 may be of an interconnected integral structure.

In an exemplary implementation mode, a shape of the fifth connection electrode CO5 may be a strip shape extending along the second direction Y. The fifth connection electrode CO5 may be disposed on a side of the fifth gate electrode Gate5 close to the light emitting signal line EM, a first end of the fifth connection electrode CO5 is connected with the fifth gate electrode Gate5, and a second end of the fifth connection electrode CO5 is connected with the light emitting signal line EM, thereby achieving that the light emitting signal line EM may control turn-on or turn-off of a fifth transistor T5. In an exemplary implementation mode, the light emitting signal line EM, the fifth gate electrode Gate5, and the fifth connection electrode CO5 may be of an interconnected integral structure.

In an exemplary implementation mode, a shape of the sixth connection electrode CO6 may be a strip shape extending along the second direction Y. The sixth connection electrode CO6 may be disposed on a side of the sixth gate electrode Gate6 close to the light emitting signal line EM, a first end of the sixth connection electrode CO6 is connected with the sixth gate electrode Gate6, and a second end of the sixth connection electrode CO6 is close to the light emitting signal line EM. The sixth connection electrode CO6 is configured to be connected with a twenty-third connection electrode that is formed subsequently.

In an exemplary implementation mode, a shape of the seventh connection electrode CO7 may be a strip shape extending along the first direction X. The seventh connection electrode CO7 may be disposed between the second scan signal line S2 and the high voltage connection line VDD-C, and the seventh connection electrode CO7 and the ninth gate electrode Gate9 may be of an interconnected integral structure.

In an exemplary implementation mode, a shape of the eighth connection electrode CO8 may be a strip shape extending along the first direction X. The eighth connection electrode CO8 may be disposed between the second scan signal line S2 and the high voltage connection line VDD-C, and the eighth connection electrode CO8 and the eleventh gate electrode Gate 11 may be of an interconnected integral structure.

In an exemplary implementation mode, part of circuit units may further include a first anode connection line 11 configured to be connected with an anode connection block that is formed subsequently.

In an exemplary implementation mode, in addition to the low voltage connection line VSS-C, the high-frequency connection line Hf-C, and the first anode connection line 11, patterns of second conductive layers located on both sides of a second circuit region 220 in the second direction Y may be substantially mirror-symmetrical with respect to a reference line.

As shown in FIGS. 19 and 21, in an exemplary implementation mode, a pattern of a second conductive layer of each gate drive circuit may at least include a thirteenth electrode plate CF13, a fourteenth electrode plate CF14, an output signal line G(n−1) of a previous level, an output signal line G(n) of a present level, a plurality of gate electrodes, and a plurality of gate blocks.

In an exemplary implementation mode, shapes of the thirteenth electrode plate CF13 and the fourteenth electrode plate CF14 may be rectangles. An orthographic projection of the thirteenth electrode plate CF13 on the base substrate is at least partially overlapped with an orthographic projection of the eleventh electrode plate CF11 on the base substrate. The thirteenth electrode plate CF13 may serve as the other electrode plate of a third capacitor, and the eleventh electrode plate CF11 and the thirteenth electrode plate CF13 constitute the third capacitor of the gate drive circuit. An orthographic projection of the fourteenth electrode plate CF14 on the base substrate is at least partially overlapped with an orthographic projection of the twelfth electrode plate CF12 on the base substrate. The fourteenth electrode plate CF14 may serve as the other electrode plate of a fourth capacitor, and the twelfth electrode plate CF12 and the fourteenth electrode plate CF14 constitute the fourth capacitor of the gate drive circuit.

In an exemplary implementation mode, shapes of the output signal line G(n−1) of the previous level and the output signal line G(n) of the present level may be a straight line or a broken line of which a main body portion extends along the first direction X. The output signal line G(n−1) of the previous level is configured to be at least connected with a first scan signal line in an (n−1)th row, and the output signal line G(n) of the present level is configured to be at least connected with a first scan signal line in an nth row. In the first direction X, the output signal line G(n−1) of the previous level may be located on a side of the fourteenth electrode plate CF14 in the first direction X, and the output signal line G(n) of the present level may be located on a side of the thirteenth electrode plate CF13 in a direction opposite to the first direction X. In the second direction Y, the output signal line G(n−1) of the previous level and the output signal line G(n) of the present level may be located on a side of the thirteenth electrode plate CF13 and the fourteenth electrode plate CF14 in the second direction Y.

In an exemplary implementation mode, the plurality of gate electrodes of the gate drive circuit may include a twenty-first gate electrode Gate21, a twenty-second gate electrode Gate22, a twenty-third gate electrode Gate23, a twenty-fourth gate electrode Gate24, a twenty-fifth gate electrode Gate25, a twenty-sixth gate electrode Gate26, a twenty-seventh gate electrode Gate27, and a twenty-eighth gate electrode Gate28.

In an exemplary implementation mode, the twenty-fourth gate electrode Gate24 may be disposed on a side of the fourteenth electrode plate CF14 in a direction opposite to the first direction X, and the twenty-fourth gate electrode Gate24 serves as a gate electrode of a twenty-fourth transistor T24. An orthographic projection of the twenty-fourth gate electrode Gate24 on the base substrate is at least partially overlapped with an orthographic projection of a twenty-fourth active layer on the base substrate.

In an exemplary implementation mode, the twenty-fourth gate electrode Gate24 may include a plurality of sub-electrodes, each of the sub-electrodes may have a strip shape extending along the first direction X, and the plurality of sub-electrodes may be disposed at intervals along the second direction Y to form a comb structure and connected with the fourteenth electrode plate CF14.

In an exemplary implementation mode, the twenty-fourth gate electrode Gate24 and the fourteenth electrode plate CF14 may be of an interconnected integral structure.

In an exemplary implementation mode, the twenty-fifth gate electrode Gate25 may be disposed on a side of the thirteenth electrode plate CF13 in the second direction Y, and the twenty-fifth gate electrode Gate25 serves as a gate electrode of a twenty-fifth transistor T25. An orthographic projection of the twenty-fifth gate electrode Gate25 on the base substrate is at least partially overlapped with an orthographic projection of a twenty-fifth active layer on the base substrate.

In an exemplary implementation mode, the twenty-fifth gate electrode Gate25 may include a plurality of sub-electrodes, each of the sub-electrodes may have a strip shape extending along the first direction X, and the plurality of sub-electrodes may be disposed at intervals along the second direction Y to form a comb structure and connected with the thirteenth electrode plate CF13.

In an exemplary implementation mode, the twenty-fifth gate electrode Gate25 and the thirteenth electrode plate CF13 may be of an interconnected integral structure.

In an exemplary implementation mode, the twenty-sixth gate electrode Gate26 may be disposed on a side of the fourteenth electrode plate CF14 in the second direction Y and connected with the fourteenth electrode plate CF14. The twenty-sixth gate electrode Gate26 serves as a gate electrode of a twenty-sixth transistor T26, and an orthographic projection of the twenty-sixth gate electrode Gate26 on the base substrate is at least partially overlapped with an orthographic projection of a twenty-sixth active layer on the base substrate.

In an exemplary implementation mode, the twenty-fourth gate electrode Gate24, the twenty-sixth gate electrode Gate26, and the fourteenth electrode plate CF14 may be of an interconnected integral structure.

In an exemplary implementation mode, the twenty-seventh gate electrode Gate27 may be disposed on a side of the twenty-sixth gate electrode Gate26 in the second direction Y, and serves as a gate electrode of a twenty-seventh transistor T27. An orthographic projection of the twenty-seventh gate electrode Gate27 on the base substrate is at least partially overlapped with an orthographic projection of a twenty-seventh active layer on the base substrate.

In an exemplary implementation mode, the twenty-second gate electrode Gate22 may be disposed on a side of the twenty-seventh gate electrode Gate27 in the second direction Y, and serves as a gate electrode of a twenty-second transistor T22. An orthographic projection of the twenty-second gate electrode Gate22 on the base substrate is at least partially overlapped with an orthographic projection of a twenty-second active layer on the base substrate.

In an exemplary implementation mode, the twenty-first gate electrode Gate21 and the twenty-third gate electrode Gate23 may be disposed on a side of the twenty-second gate electrode Gate22 in the second direction Y, and they are of an interconnected integral structure. The twenty-first gate electrode Gate21 serves as a gate electrode of a twenty-first transistor T21, and an orthographic projection of the twenty-first gate electrode Gate21 on the base substrate is at least partially overlapped with an orthographic projection of a twenty-first active layer on the base substrate. The twenty-third gate electrode Gate23 serves as a gate electrode of a twenty-third transistor T23, and an orthographic projection of the twenty-third gate electrode Gate23 on the base substrate is at least partially overlapped with an orthographic projection of a twenty-third active layer on the base substrate.

In an exemplary implementation mode, the twenty-eighth gate electrode Gate28 may be disposed on a side of the twenty-second gate electrode Gate22 in the second direction Y, and serves as a gate electrode of a twenty-eighth transistor T28. An orthographic projection of the twenty-eighth gate electrode Gate28 on the base substrate is at least partially overlapped with an orthographic projection of a twenty-eighth active layer on the base substrate.

In an exemplary implementation mode, the plurality of gate blocks of the gate drive circuit may include a first gate block GK1, a second gate block GK2, a third gate block GK3, and a fourth gate block GK4.

In an exemplary implementation mode, the first gate block GK1 may have a rectangular shape and may be disposed on a side of the twenty-first gate electrode Gate21 in the first direction X, the first gate block GK1 and the twenty-first gate electrode Gate21 are of an interconnected integral structure, and the first gate block GK1 is configured to be connected with a first clock signal line formed subsequently.

In an exemplary implementation mode, the second gate block GK2 may have a rectangular shape and may be disposed on a side of the twenty-seventh gate electrode Gate27 in the first direction X, the second gate block GK2 and the twenty-seventh gate electrode Gate27 are of an interconnected integral structure, and the second gate block GK2 is configured to be connected with a second clock signal line formed subsequently.

In an exemplary implementation mode, the third gate block GK3 may have a strip shape extending along the first direction X and may be disposed on a side of the fourteenth electrode plate CF14 in the first direction X, and the third gate block GK3 is configured to be connected with a high voltage line formed subsequently.

In an exemplary implementation mode, the fourth gate block GK4 may have a rectangular shape and may be disposed on a side of the twenty-eighth gate electrode Gate28 in the first direction X, the fourth gate block GK4 and the twenty-eighth gate electrode Gate28 are of an interconnected integral structure, and the fourth gate block GK4 is configured to be connected with a low voltage line formed subsequently.

In an exemplary implementation mode, after the pattern of the second conductive layer is formed, the semiconductor layer may be subjected to a conductive treatment by using the second conductive layer as a shield. The semiconductor layer in a region shielded by the second conductive layer forms channel regions of the first transistor T1 to the eleventh transistor T11, and the semiconductor layer in a region not shielded by the second conductive layer is made to be conductive, that is, first regions and second regions of the first transistor T1 to the eleventh transistor T11 and the twenty-first transistor T21 to the twenty-eighth transistor T28 are all made to be conductive.

(4) Forming a pattern of a third insulation layer. In an exemplary implementation mode, the forming the pattern of the third insulation layer may include: depositing a third insulation thin film on the base substrate on which the aforementioned patterns are formed, and patterning the third insulation thin film using a patterning process, to form a third insulation layer covering the second conductive layer, wherein a plurality of vias are disposed on the third insulation layer, as shown in FIGS. 22, 23, and 24, FIG. 22 is a structure of a region A in FIG. 7, FIG. 23 is an enlarged view of a circuit unit in FIG. 22, and FIG. 24 is an enlarged view of a gate drive circuit in FIG. 22.

As shown in FIGS. 22 and 23, in an exemplary implementation mode, a plurality of vias of each circuit unit include at least an eleventh via V11 to a fifty-fourth via V54.

In an exemplary implementation mode, an orthographic projection of the eleventh via V11 on the base substrate is within a range of an orthographic projection of a first region of a first active layer on the base substrate, the third insulation layer and the second insulation layer in the eleventh via V11 are etched away to expose a surface of the first region of the first active layer, and the eleventh via V11 is configured such that an eleven connection electrode formed subsequently is connected with the first region of the first active layer through the via.

In an exemplary implementation mode, an orthographic projection of the twelfth via V12 on the base substrate is within a range of an orthographic projection of a second region of the first active layer on the base substrate, the third insulation layer and the second insulation layer in the twelfth via V12 are etched away to expose a surface of the second region of the first active layer, and the twelfth via V12 is configured such that an fourteenth connection electrode formed subsequently is connected with the second region of the first active layer through the via.

In an exemplary implementation mode, an orthographic projection of the thirteenth via V13 on the base substrate is within a range of an orthographic projection of a first region of the second active layer on the base substrate, the third insulation layer and the second insulation layer in the thirteenth via V13 are etched away to expose a surface of the first region of the second active layer, and the thirteenth via V13 is configured such that a fifteenth connection electrode formed subsequently is connected with the first region of the second active layer through the via.

In an exemplary implementation mode, an orthographic projection of the fourteenth via V14 on the base substrate is within a range of an orthographic projection of a second region of the second active layer on the base substrate, the third insulation layer and the second insulation layer in the fourteenth via V14 are etched away to expose a surface of the second region of the second active layer, and the fourteenth via V14 is configured such that a sixteenth connection electrode formed subsequently is connected with the second region of the second active layer through the via.

In an exemplary implementation mode, an orthographic projection of the fifteenth via V15 on the base substrate is within a range of an orthographic projection of a first region of the third active layer on the base substrate, the third insulation layer and the second insulation layer in the fifteenth via V15 are etched away to expose a surface of the first region of the third active layer, and the fifteenth via V15 is configured such that a seventeenth connection electrode formed subsequently is connected with the first region of the third active layer through the via.

In an exemplary implementation mode, an orthographic projection of the sixteenth via V16 on the base substrate is within a range of an orthographic projection of a second region of the third active layer on the base substrate, the third insulation layer and the second insulation layer in the sixteenth via V16 are etched away to expose a surface of the second region of the third active layer, and the sixteenth via V16 is configured such that a sixteenth connection electrode formed subsequently is connected with the second region of the thirteenth active layer through the via.

In an exemplary implementation mode, an orthographic projection of the seventeenth via V17 on the base substrate is within a range of an orthographic projection of a first region of the fourth active layer on the base substrate, the third insulation layer and the second insulation layer in the seventeenth via V17 are etched away to expose a surface of the first region of the fourth active layer, and the seventeenth via V17 is configured such that a data signal line formed subsequently is connected with the first region of the fourth active layer through the via.

In an exemplary implementation mode, an orthographic projection of the eighteenth via V18 on the base substrate is within a range of an orthographic projection of a second region of the fourth active layer on the base substrate, the third insulation layer and the second insulation layer in the eighteenth via V18 are etched away to expose a surface of the second region of the fourth active layer, and the eighteenth via V18 is configured such that a seventeenth connection electrode formed subsequently is connected with the second region of the fourth active layer through the eighteenth via.

In an exemplary implementation mode, an orthographic projection of the nineteenth via V19 on the base substrate is within a range of an orthographic projection of a first region of the fifth active layer on the base substrate, the third insulation layer and the second insulation layer in the nineteenth via V19 are etched away to expose a surface of the first region of the fifth active layer, and the nineteenth via V19 is configured such that an eighteenth connection electrode formed subsequently is connected with the first region of the fifth active layer through the via.

In an exemplary implementation mode, an orthographic projection of the twentieth via V20 on the base substrate is within a range of an orthographic projection of a second region of the fifth active layer on the base substrate, the third insulation layer and the second insulation layer in the twentieth via V20 are etched away to expose a surface of the second region of the fifth active layer, and the twentieth via V20 is configured such that a seventeenth connection electrode formed subsequently is connected with the second region of the fifth active layer through the via.

In an exemplary implementation mode, there are a plurality of nineteenth vias V19 and a plurality of twentieth vias V20 which are alternately disposed in the second direction Y.

In an exemplary implementation mode, an orthographic projection of the twenty-first via V21 on the base substrate is within a range of an orthographic projection of a first region of the sixth active layer on the base substrate, the third insulation layer and the second insulation layer in the twenty-first via V21 are etched away to expose a surface of the first region of the sixth active layer, and the twenty-first via V21 is configured such that a sixteenth connection electrode formed subsequently is connected with the first region of the sixth active layer through the via.

In an exemplary implementation mode, an orthographic projection of the twenty-second via V22 on the base substrate is within a range of an orthographic projection of a second region of the sixth active layer on the base substrate, the third insulation layer and the second insulation layer in the twenty-second via V22 are etched away to expose a surface of the second region of the sixth active layer, and the twenty-second via V22 is configured such that a twenty-sixth connection electrode formed subsequently is connected with the second region of the sixth active layer through the via.

In an exemplary implementation mode, there are a plurality of twenty-first vias V21 and a plurality of twenty-second vias V22 which are alternately disposed in the second direction Y.

In an exemplary implementation mode, an orthographic projection of the twenty-third via V23 on the base substrate is within a range of an orthographic projection of a first region of the seventh active layer on the base substrate, the third insulation layer and the second insulation layer in the twenty-third via V23 are etched away to expose a surface of a seventh region of the seventh active layer, and the twenty-third via V23 is configured such that an eleventh connection electrode formed subsequently is connected with the first region of the seventh active layer through the via. Since the first region of the first active layer and the first region of the seventh active layer are connected with each other, the eleventh via V11 and the twenty-third via V23 are common vias.

In an exemplary implementation mode, an orthographic projection of the twenty-fourth via V24 on the base substrate is within a range of an orthographic projection of a second region of the seven active layer on the base substrate, the third insulation layer and the second insulation layer in the twenty-fourth via V24 are etched away to expose a surface of the second region of the seventh active layer, and the twenty-fourth via V24 is configured such that a twenty-sixth connection electrode formed subsequently is connected with the second region of the seventh active layer through the via.

In an exemplary implementation mode, an orthographic projection of the twenty-fifth via V25 on the base substrate is within a range of an orthographic projection of a first region of the eighth active layer on the base substrate, the third insulation layer and the second insulation layer in the twenty-fifth via V25 are etched away to expose a surface of the first region of the eighth active layer, and the twenty-fifth via V25 is configured such that a data signal line formed subsequently is connected with the first region of the eighth active layer through the via.

In an exemplary implementation mode, an orthographic projection of the twenty-sixth via V26 on the base substrate is within a range of an orthographic projection of a second region of the eighth active layer on the base substrate, the third insulation layer and the second insulation layer in the twenty-sixth via V26 are etched away to expose a surface of the second region of the eighth active layer, and the twenty-sixth via V26 is configured such that a twentieth connection electrode formed subsequently is connected with the second region of the eighth active layer through the via.

In an exemplary implementation mode, an orthographic projection of the twenty-seventh via V27 on the base substrate is within a range of an orthographic projection of a first region of the ninth active layer on the base substrate, the third insulation layer and the second insulation layer in the twenty-seventh via V27 are etched away to expose a surface of the first region of the ninth active layer, and the twenty-seventh via V27 is configured such that a twenty-fifth connection electrode formed subsequently is connected with the first region of the ninth active layer through the via.

In an exemplary implementation mode, an orthographic projection of the twenty-eighth via V28 on the base substrate is within a range of an orthographic projection of a second region of the ninth active layer on the base substrate, the third insulation layer and the second insulation layer in the twenty-eighth via V28 are etched away to expose a surface of the second region of the ninth active layer, and the twenty-eighth via V28 is configured such that a twenty-second connection electrode formed subsequently is connected with the second region of the ninth active layer through the via.

In an exemplary implementation mode, an orthographic projection of the twenty-ninth via V29 on the base substrate is within a range of an orthographic projection of a first region of the tenth active layer on the base substrate, the third insulation layer and the second insulation layer in the twenty-ninth via V29 are etched away to expose a surface of the first region of the tenth active layer, and the twenty-ninth via V29 is configured such that a data signal line formed subsequently is connected with the first region of the tenth active layer through the via.

In an exemplary implementation mode, an orthographic projection of the thirtieth via V30 on the base substrate is within a range of an orthographic projection of a second region of the tenth active layer on the base substrate, the third insulation layer and the second insulation layer in the thirtieth via V30 are etched away to expose a surface of the second region of the tenth active layer, and the thirtieth via V30 is configured such that a twenty-first connection electrode formed subsequently is connected with the second region of the tenth active layer through the via.

In an exemplary implementation mode, an orthographic projection of the thirty-first via V31 on the base substrate is within a range of an orthographic projection of a first region of the eleventh active layer on the base substrate, the third insulation layer and the second insulation layer in the thirty-first via V31 are etched away to expose a surface of the first region of the eleventh active layer, and the thirty-first via V31 is configured such that a twenty-fourth connection electrode formed subsequently is connected with the first region of the eleventh active layer through the via.

In an exemplary implementation mode, an orthographic projection of the thirty-second via V32 on the base substrate is within a range of an orthographic projection of a second region of the eleventh active layer on the base substrate, the third insulation layer and the second insulation layer within the thirty-second via V32 are etched away to expose a surface of the second region of the eleventh active layer, and the thirty-second via V32 is configured such that a twenty-second connection electrode formed subsequently is connected with the second region of the eleventh active layer through the via.

In an exemplary implementation mode, an orthographic projection of the thirty-third via V33 on the base substrate is within a range of an orthographic projection of a first electrode plate CF1 on the base substrate, the third insulation layer, the second insulation layer, and the first insulation layer in the thirty-third via V33 are etched away to expose a surface of the first electrode plate CF1, and the thirty-third via V33 is configured such that a seventh electrode plate formed subsequently is connected with the first electrode plate CF1 through the via.

In an exemplary implementation mode, an orthographic projection of the thirty-fourth via V34 on the base substrate is within a range of an orthographic projection of a second electrode plate CF2 on the base substrate, the third insulation layer, the second insulation layer, and the first insulation layer in the thirty-fourth via V34 are etched away to expose a surface of the second electrode plate CF2, and the thirty-fourth via V34 is configured such that an eighth electrode plate formed subsequently is connected with the second electrode plate CF2 through the via.

In an exemplary implementation mode, an orthographic projection of the thirty-fifth via V35 on the base substrate is within a range of an orthographic projection of a third electrode plate CF3 of the third active layer on the base substrate, the third insulation layer, the second insulation layer, and the first insulation layer in the thirty-fifth via V35 are etched away to expose a surface of the third electrode plate CF3, and the thirty-fifth via V35 is configured such that a ninth electrode plate formed subsequently is connected with the third electrode plate CF3 through the via.

In an exemplary implementation mode, an orthographic projection of the thirty-sixth via V36 on the base substrate is within a range of an orthographic projection of a fourth electrode plate CF4 on the base substrate, the third insulation layer in the thirty-sixth via V36 is etched away to expose a surface of the fourth electrode plate CF4, and the thirty-sixth via V36 is configured such that a nineteenth connection electrode subsequently formed is connected with the fourth electrode plate CF4 through the via.

In an exemplary implementation mode, an orthographic projection of the thirty-seventh via V37 on the base substrate is within a range of an orthographic projection of a fifth electrode plate CF5 on the base substrate, the third insulation layer in the thirty-seventh via V37 is etched away to expose a surface of the fifth electrode plate CF5, and the thirty-seventh via V37 is configured such that a twenty-first connection electrode subsequently formed is connected with the fifth electrode plate CF5 through the via.

In an exemplary implementation mode, an orthographic projection of the thirty-eighth via V38 on the base substrate is within a range of an orthographic projection of a sixth electrode plate CF6 on the base substrate, the third insulation layer in the thirty-eighth via V38 is etched away to expose a surface of the sixth electrode plate CF6, and the thirty-eighth via V38 is configured such that a fourteenth connection electrode formed subsequently is connected with the sixth electrode plate CF6 through the via.

In an exemplary implementation mode, an orthographic projection of the thirty-ninth via V39 on the base substrate is within a range of an orthographic projection of a high voltage connection line VDD-C on the base substrate, the third insulation layer in the thirty-ninth via V39 is etched away to expose a surface of the high voltage connection line VDD-C, and the thirty-ninth via V39 is configured such that a thirteenth connection electrode formed subsequently is connected with the high voltage connection line VDD-C through the via.

In an exemplary implementation mode, an orthographic projection of the fortieth via V40 on the base substrate is within a range of an orthographic projection of a high-frequency connection line Hf-C on the base substrate, the third insulation layer in the fortieth via V40 is etched away to expose a surface of the high-frequency connection line Hf-C, and the fortieth via V40 is configured such that a high-frequency signal line formed subsequently is connected with the high-frequency connection line Hf-C through the via.

In an exemplary implementation mode, an orthographic projection of the forty-first via V41 on the base substrate is within a range of an orthographic projection of a light emitting signal line EM on the base substrate, the third insulation layer in the forty-first via V41 is etched away to expose a surface of the light emitting signal line EM, and the forty-first via V41 is configured such that a twenty-fifth connection electrode formed subsequently is connected with the light emitting signal line EM through the via.

In an exemplary implementation mode, orthographic projections of the forty-second via V42 and the forty-third via V43 on the base substrate are respectively within a range of an orthographic projection of an initial signal line Vint on the base substrate, the third insulation layers in the forty-second via V42 and the forty-third via V43 is etched away to respectively expose a surface of the initial signal line Vint, and the forty-second via V42 and the forty-third via V43 are configured such that an eleventh connection electrode and a twelfth connection electrode formed subsequently are respectively connected with the initial signal line Vint through the above vias.

In an exemplary implementation mode, an orthographic projection of the forty-fourth via V44 on the base substrate is within a range of an orthographic projection of a first end of a first connection electrode CO1 on the base substrate, the third insulation layer in the forty-fourth via V44 is etched away to expose a surface of the first end of the first connection electrode CO1, and the forty-fourth via V44 is configured such that a high-frequency connection line formed subsequently is connected with the first connection electrode CO1 through the via.

In an exemplary implementation mode, an orthographic projection of the forty-fifth via V45 on the base substrate is within a range of an orthographic projection of a second end of the first connection electrode CO1 on the base substrate, the third insulation layer in the forty-fifth via V45 is etched away to expose a surface of the second end of the first connection electrode CO1, and the forty-fifth via V45 is configured such that a twenty-fourth connection electrode formed subsequently is connected with the second end of the first connection electrode CO1 through the via.

In an exemplary implementation mode, an orthographic projection of the forty-sixth via V46 on the base substrate is within a range of an orthographic projection of a first end of a second connection electrode CO2 on the base substrate, the third insulation layer in the forty-sixth via V46 is etched away to expose a surface of the first end of the second connection electrode CO2, and the forty-sixth via V46 is configured such that a twenty-second connection electrode formed subsequently is connected with the first end of the second connection electrode CO2 through the via.

In an exemplary implementation mode, an orthographic projection of the forty-seventh via V47 on the base substrate is within a range of an orthographic projection of a second end of the second connection electrode CO2 on the base substrate, the third insulation layer in the forty-seventh via V47 is etched away to expose a surface of the second end of the second connection electrode CO2, and the forty-seventh via V47 is configured such that a twenty-third connection electrode formed subsequently is connected with the second end of the second connection electrode CO2 through the via.

In an exemplary implementation mode, an orthographic projection of the forty-eighth via V48 on the base substrate is within a range of an orthographic projection of a third connection electrode CO3 on the base substrate, the third insulation layer in the forty-eighth via V48 is etched away to expose a surface of the third connection electrode CO3, and the forty-eighth via V48 is configured such that a twenty-fifth connection electrode formed subsequently is connected with the third connection electrode CO3 through the via.

In an exemplary implementation mode, an orthographic projection of the forty-ninth via V49 on the base substrate is within a range of an orthographic projection of a fourth connection electrode CO4 on the base substrate, the third insulation layer in the forty-ninth via V49 is etched away to expose a surface of the fourth connection electrode CO4, and the forty-ninth via V49 is configured such that a fifteenth connection electrode formed subsequently is connected with the fourth connection electrode CO4 through the via.

In an exemplary implementation mode, an orthographic projection of the fiftieth via V50 on the base substrate is within a range of an orthographic projection of a third bottom gate electrode Gate3-B on the base substrate, the third insulation layer, the second insulation layer, and the first insulation layer in the fiftieth via V50 are etched away to expose a surface of the third bottom gate electrode Gate3-B, and the fiftieth via V50 is configured such that the fifteenth connection electrode formed subsequently is connected with the third bottom gate electrode Gate3-B through the via.

In an exemplary implementation mode, an orthographic projection of the fifty-first via V51 on the base substrate is within a range of an orthographic projection of a sixth connection electrode CO6 on the base substrate, the third insulation layer in the fifty-first via V51 is etched away to expose a surface of the sixth connection electrode CO6, and the fifty-first via V51 is configured such that a twenty-third connection electrode formed subsequently is connected with the sixth connection electrode CO6 through the via.

In an exemplary implementation mode, an orthographic projection of the fifty-second via V52 on the base substrate is within a range of an orthographic projection of a first end of a seventh connection electrode CO7 on the base substrate, the third insulation layer in the fifty-second via V52 is etched away to expose a surface of the first end of the seventh connection electrode CO7, and the fifty-second via V52 is configured such that a twentieth connection electrode formed subsequently is connected with the first end of the seventh connection electrode CO7 through the via.

In an exemplary implementation mode, an orthographic projection of the fifty-third via V53 on the base substrate is within a range of an orthographic projection of a second end of the seventh connection electrode CO7 on the base substrate, the third insulation layer in the fifty-third via V53 is etched away to expose a surface of the second end of the seventh connection electrode CO7, and the fifty-third via V53 is configured such that a nineteenth connection electrode formed subsequently is connected with the second end of the seventh connection electrode CO7 through the via.

In an exemplary implementation mode, an orthographic projection of the fifty-fourth via V54 on the base substrate is within a range of an orthographic projection of an eighth connection electrode CO8 on the base substrate, the third insulation layer in the fifty-fourth via V54 is etched away to expose a surface of the eighth connection electrode CO8, and the fifty-fourth via V54 is configured such that a twenty-first connection electrode formed subsequently is connected with the eighth connection electrode CO8 through the via.

In an exemplary implementation mode, part of the circuit units may further include a fifty-fifth via V55. An orthographic projection of the fifty-fifth via V55 on the base substrate is within a range of an orthographic projection of a low voltage connection line VSS-C on the base substrate, the third insulation layer in the fifty-fifth via V55 is etched away to expose a surface of the low voltage connection line VSS-C, and the fifty-fifth via V55 is configured such that a twenty-seventh connection electrode formed subsequently is connected with the low voltage connection line VSS-C through the via.

In an exemplary implementation mode, part of the circuit units may further include a plurality of connection line vias, which may be disposed at both ends of a first anode connection line 11, and a connection line via 11 is configured such that an anode connection block formed subsequently is connected with the first anode connection line 11 through the via.

In an exemplary implementation mode, the first scan signal line S1, the second scan signal line S2, and the light emitting signal line EM located in a region of a blank unit are further provided with a gate line via (not shown) configured to be connected with a corresponding output signal line formed subsequently.

As shown in FIGS. 22 and 24, in an exemplary implementation mode, a plurality of vias of each gate drive circuit may at least include a sixty-first via V61 to a ninetieth via V90.

In an exemplary implementation mode, an orthographic projection of the sixty-first via V61 on the base substrate is within a range of an orthographic projection of a first region of the twenty-first active layer on the base substrate, the third insulation layer and the second insulation layer in the sixty-first via V61 are etched away to expose a surface of the first region of the twenty-first active layer, and the sixty-first via V61 is configured such that a thirty-first connection electrode formed subsequently is connected with the first region of the twenty-first active layer through the via.

In an exemplary implementation mode, an orthographic projection of the sixty-second via V62 on the base substrate is within a range of an orthographic projection of a second region of the twenty-first active layer on the base substrate, the third insulation layer and the second insulation layer in the sixty-second via V62 are etched away to expose a surface of the second region of the twenty-first active layer, and the sixty-second via V62 is configured such that a thirty-second connection electrode formed subsequently is connected with the second region of the twenty-first active layer through the via.

In an exemplary implementation mode, an orthographic projection of the sixty-third via V63 on the base substrate is within a range of an orthographic projection of a first region of the twenty-second active layer on the base substrate, the third insulation layer and the second insulation layer in the sixty-third via V63 are etched away to expose a surface of the first region of the twenty-second active layer, and the sixty-third via V63 is configured such that a thirty-third connection electrode formed subsequently is connected with the first region of the twenty-second active layer through the via.

In an exemplary implementation mode, an orthographic projection of the sixty-fourth via V64 on the base substrate is within a range of an orthographic projection of a second region of the twenty-second active layer on the base substrate, the third insulation layer and the second insulation layer in the sixty-fourth via V64 are etched away to expose a surface of the second region of the twenty-second active layer, and the sixty-fourth via V64 is configured such that a thirty-fourth connection electrode formed subsequently is connected with the second region of the twenty-second active layer through the via.

In an exemplary implementation mode, an orthographic projection of the sixty-fifth via V65 on the base substrate is within a range of an orthographic projection of a first region of the twenty-third active layer on the base substrate, the third insulation layer and the second insulation layer in the sixty-fifth via V65 are etched away to expose a surface of the first region of the twenty-third active layer, and the sixty-fifth via V65 is configured such that a low voltage line formed subsequently is connected with the first region of the twenty-third active layer through the via.

In an exemplary implementation mode, an orthographic projection of the sixty-sixth via V66 on the base substrate is within a range of an orthographic projection of a second region of the twenty-third active layer on the base substrate, the third insulation layer and the second insulation layer in the sixty-sixth via V66 are etched away to expose a surface of the second region of the twenty-third active layer, and the sixty-sixth via V66 is configured such that a thirty-fourth connection electrode formed subsequently is connected with the second region of the twenty-third active layer through the via.

In an exemplary implementation mode, an orthographic projection of the sixty-seventh via V67 on the base substrate is within a range of an orthographic projection of a first region of the twenty-fourth active layer on the base substrate, the third insulation layer and the second insulation layer in the sixty-seventh via V67 are etched away to expose a surface of the first region of the twenty-fourth active layer, and the sixty-seventh via V67 is configured such that a thirty-seventh connection electrode formed subsequently is connected with the first region of the twenty-fourth active layer through the via.

In an exemplary implementation mode, an orthographic projection of the sixty-eighth via V68 on the base substrate is within a range of an orthographic projection of a second region of the twenty-fourth active layer on the base substrate, the third insulation layer and the second insulation layer in the sixty-eighth via V68 are etched away to expose a surface of the second region of the twenty-fourth active layer, and the sixty-eighth via V68 is configured such that a thirty-eighth connection electrode formed subsequently is connected with the second region of the twenty-fourth active layer through the via.

In an exemplary implementation mode, an orthographic projection of the sixty-ninth via V69 on the base substrate is within a range of an orthographic projection of a first region of the twenty-fifth active layer on the base substrate, the third insulation layer and the second insulation layer in the sixty-ninth via V69 are etched away to expose a surface of the first region of the twenty-fifth active layer, and the sixty-ninth via V69 is configured such that a thirty-ninth connection electrode formed subsequently is connected with the first region of the twenty-fifth active layer through the via.

In an exemplary implementation mode, an orthographic projection of the seventieth via V70 on the base substrate is within a range of an orthographic projection of a second region of the twenty-fifth active layer on the base substrate, the third insulation layer and the second insulation layer in the seventieth via V70 are etched away to expose a surface of the second region of the twenty-fifth active layer, and the seventieth via V70 is configured such that a thirty-eighth connection electrode formed subsequently is connected with the second region of the twenty-fifth active layer through the via.

In an exemplary implementation mode, an orthographic projection of the seventy-first via V71 on the base substrate is within a range of an orthographic projection of a first region of the twenty-sixth active layer on the base substrate, the third insulation layer and the second insulation layer in the seventy-first via V71 are etched away to expose a surface of the first region of the twenty-sixth active layer, and the seventy-first via V71 is configured such that a thirty-fifth connection electrode formed subsequently is connected with the first region of the twenty-sixth active layer through the via.

In an exemplary implementation mode, an orthographic projection of the seventy-second via V72 on the base substrate is within a range of an orthographic projection of a second region of the twenty-sixth active layer on the base substrate, the third insulation layer and the second insulation layer in the seventy-second via V72 are etched away to expose a surface of the second region of the twenty-sixth active layer, and the seventy-second via V72 is configured such that a thirty-sixth connection electrode formed subsequently is connected with the second region of the twenty-sixth active layer through the via.

In an exemplary implementation mode, an orthographic projection of the seventy-third via V73 on the base substrate is within a range of an orthographic projection of a first region of the twenty-seventh active layer on the base substrate, the third insulation layer and the second insulation layer in the seventy-third via V73 are etched away to expose a surface of the first region of the twenty-seventh active layer, and the seventy-third via V73 is configured such that a thirty-sixth connection electrode formed subsequently is connected with the first region of the twenty-seventh active layer through the via. Since the second region of the twenty-sixth active layer and the first region of the twenty-seventh active layer are connected with each other, the seventy-second via V72 and the seventy-third via V73 are shared.

In an exemplary implementation mode, an orthographic projection of the seventy-fourth via V74 on the base substrate is within a range of an orthographic projection of a second region of the twenty-seventh active layer on the base substrate, the third insulation layer and the second insulation layer in the seventy-fourth via V74 are etched away to expose a surface of the second region of the twenty-seventh active layer, and the seventy-fourth via V74 is configured such that a thirty-second connection electrode formed subsequently is connected with the second region of the twenty-seventh active layer through the via.

In an exemplary implementation mode, an orthographic projection of the seventy-fifth via V75 on the base substrate is within a range of an orthographic projection of a first region of the twenty-eighth active layer on the base substrate, the third insulation layer and the second insulation layer in the seventy-fifth via V75 are etched away to expose a surface of the first region of the twenty-eighth active layer, and the seventy-fifth via V75 is configured such that a fortieth connection electrode CO40 formed subsequently is connected with the first region of the twenty-eighth active layer through the via.

In an exemplary implementation mode, an orthographic projection of the seventy-sixth via V76 on the base substrate is within a range of an orthographic projection of a second region of the twenty-eighth active layer on the base substrate, the third insulation layer and the second insulation layer in the seventy-sixth via V76 are etched away to expose a surface of the second region of the twenty-eighth active layer, and the seventy-sixth via V76 is configured such that a forty-first connection electrode formed subsequently is connected with the second region of the twenty-eighth active layer through the via.

In an exemplary implementation mode, an orthographic projection of the seventy-seventh via V77 on the base substrate is within a range of an orthographic projection of a twenty-second gate electrode Gate22 on the base substrate, the third insulation layer in the seventy-seventh via V77 is etched away to expose a surface of the twenty-second gate electrode Gate22, and the seventy-seventh via V77 is configured such that a fortieth connection electrode formed subsequently is connected with the twenty-second gate electrode Gate22 through the via.

In an exemplary implementation mode, an orthographic projection of the seventy-eighth via V78 on the base substrate is within a range of an orthographic projection of a twenty-third gate electrode Gate23 on the base substrate, the third insulation layer in the seventy-eighth via V78 is etched away to expose a surface of the twenty-third gate electrode Gate23, and the seventy-eighth via V78 is configured such that a thirty-third connection electrode formed subsequently is connected with the twenty-third gate electrode Gate23 through the via.

In an exemplary implementation mode, an orthographic projection of the seventy-ninth via V79 on the base substrate is within a range of an orthographic projection of a twenty-fifth gate electrode Gate25 on the base substrate, the third insulation layer in the seventy-ninth via V79 is etched away to expose a surface of the twenty-fifth gate electrode Gate25, and the seventy-ninth via V79 is configured such that a forty-first connection electrode formed subsequently is connected with the twenty-fifth gate electrode Gate25 through the via.

In an exemplary implementation mode, an orthographic projection of the eightieth via V80 on the base substrate is within a range of an orthographic projection of a twenty-sixth gate electrode Gate26 on the base substrate, the third insulation layer in the eightieth via V80 is etched away to expose a surface of the twenty-sixth gate electrode Gate26, and the eightieth via V80 is configured such that a thirty-fourth connection electrode formed subsequently is connected with the twenty-sixth gate electrode Gate26 through the via.

In an exemplary implementation mode, an orthographic projection of the eighty-first via V81 on the base substrate is within a range of an orthographic projection of a twenty-seventh gate electrode Gate27 on the base substrate, the third insulation layer in the eighty-first via V81 is etched away to expose a surface of the twenty-seventh gate electrode Gate27, and the eighty-first via V81 is configured such that a thirty-ninth connection electrode formed subsequently is connected with the twenty-seventh gate electrode Gate27 through the via.

In an exemplary implementation mode, an orthographic projection of the eighty-second via V82 on the base substrate is within a range of an orthographic projection of an eleventh electrode plate CF11 on the base substrate, the third insulation layer, the second insulation layer, and the first insulation layer in the eighty-second via V82 are etched away to expose a surface of the eleventh electrode plate CF11, and the eighty-second via V82 is configured such that a thirty-eighth connection electrode formed subsequently is connected with the eleventh electrode plate CF11 through the via.

In an exemplary implementation mode, an orthographic projection of the eighty-third via V83 on the base substrate is within a range of an orthographic projection of a twelfth electrode plate CF12 on the base substrate, the third insulation layer, the second insulation layer, and the first insulation layer in the eighty-third via V83 are etched away to expose a surface of the twelfth electrode plate CF12. In an exemplary implementation mode, the eighty-third via V83 may be disposed in two positions, and the eighty-third via V83 in the two positions is configured such that a thirty-fifth connection electrode and a thirty-seventh connection electrode CO37 formed subsequently are respectively connected with the twelfth electrode plate CF12 through the via.

In an exemplary implementation mode, an orthographic projection of the eighty-fourth via V84 on the base substrate is within a range of an orthographic projection of a first end of a third gate block GK3 on the base substrate, the third insulation layer in the eighty-fourth via V84 is etched away to expose a surface of the first end of the third gate block GK3, and the eighty-fourth via V84 is configured such that a thirty-fifth connection electrode formed subsequently is connected with the first end of the third gate block GK3 through the via.

In an exemplary implementation mode, an orthographic projection of the eighty-fifth via V85 on the base substrate is within a range of an orthographic projection of a first gate block GK1 on the base substrate, the third insulation layer in the eighty-fifth via V85 is etched away to expose a surface of the first gate block GK1, and the eighty-fifth via V85 is configured such that a first clock signal line formed subsequently is connected with the first gate block GK1 through the via.

In an exemplary implementation mode, an orthographic projection of the eighty-sixth via V86 on the base substrate is within a range of an orthographic projection of a second gate block GK2 on the base substrate, the third insulation layer in the eighty-sixth via V86 is etched away to expose a surface of the second gate block GK2, and the eighty-sixth via V86 is configured such that a second clock signal line formed subsequently is connected with the second gate block GK2 through the via.

In an exemplary implementation mode, an orthographic projection of the eighty-seventh via V87 on the base substrate is within a range of an orthographic projection of a second end of the third gate block GK3 on the base substrate, the third insulation layer in the eighty-seventh via V87 is etched away to expose a surface of the second end of the third gate block GK3, and the eighty-seventh via V87 is configured such that a high voltage line formed subsequently is connected with the second end of the third gate block GK3 through the via.

In an exemplary implementation mode, an orthographic projection of the eighty-eighth via V88 on the base substrate is within a range of an orthographic projection of a fourth gate block GK4 on the base substrate, the third insulation layer in the eighty-eighth via V88 is etched away to expose a surface of the fourth gate block GK4, and the eighty-eighth via V88 is configured such that a low voltage line formed subsequently is connected with the fourth gate block GK4 through the via.

In an exemplary implementation mode, an orthographic projection of the eighty-ninth via V89 on the base substrate is within a range of an orthographic projection of an output signal line G(n−1) of a previous level on the base substrate, the third insulation layer in the eighty-ninth via V89 is etched away to expose a surface of the output signal line G(n−1) of the previous level, and the eighty-ninth via V89 is configured such that a thirty-first connection electrode formed subsequently is connected with the output signal line G(n−1) of the previous level through the via.

In an exemplary implementation mode, an orthographic projection of the ninetieth via V90 on the base substrate is within a range of an orthographic projection of an output signal line G(n) of a present level on the base substrate, the third insulation layer in the ninetieth via V90 is etched away to expose a surface of the output signal line G(n) of the present level, and the ninetieth via V90 is configured such that a thirty-eighth connection electrode formed subsequently is connected with the output signal line G(n) of the present level through the via.

Figure 25:
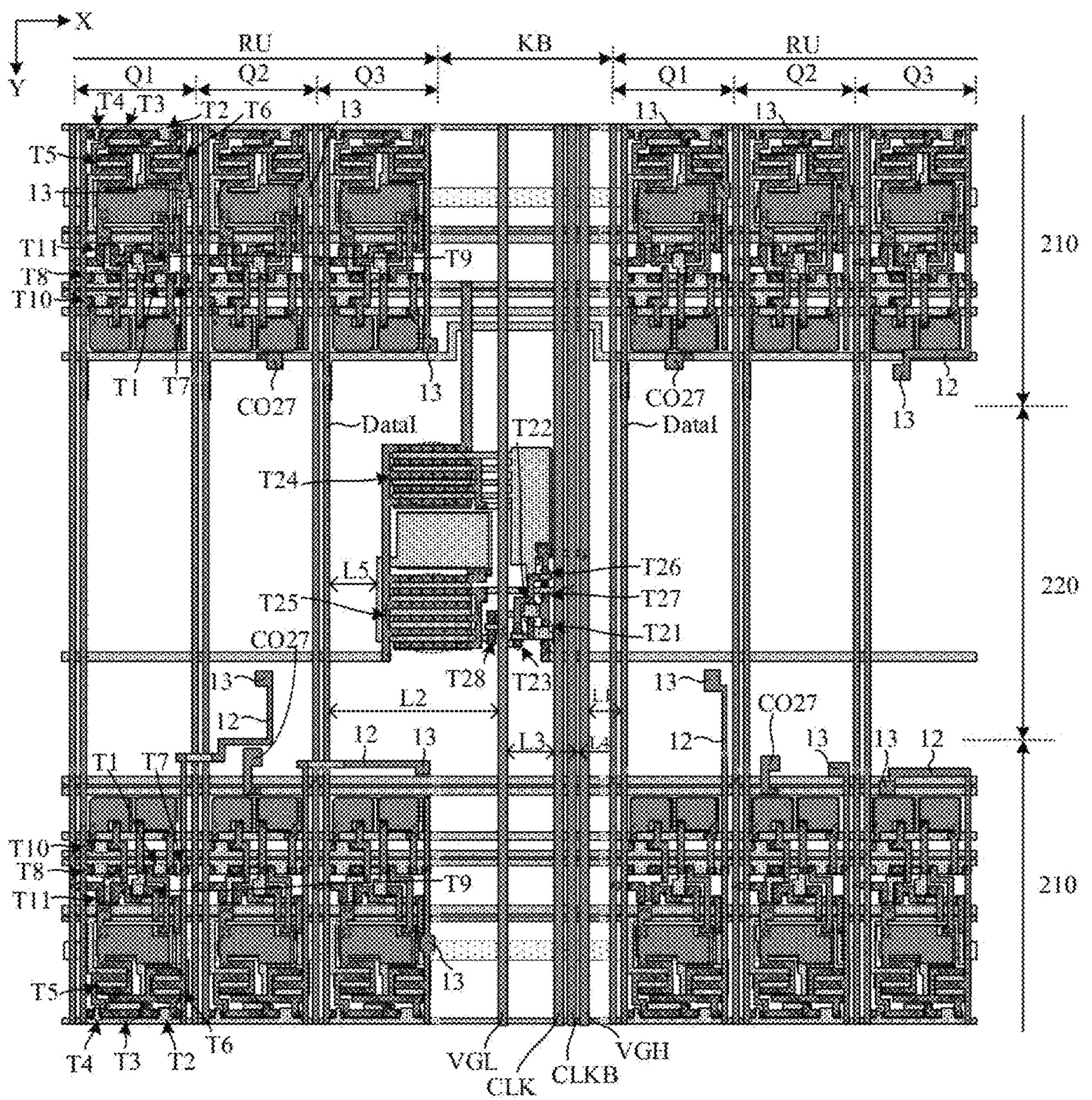
FIGS. 25 to 28 are schematic diagrams of a display substrate after formation of a pattern of a third conductive layer according to the present disclosure.
Figure 26:
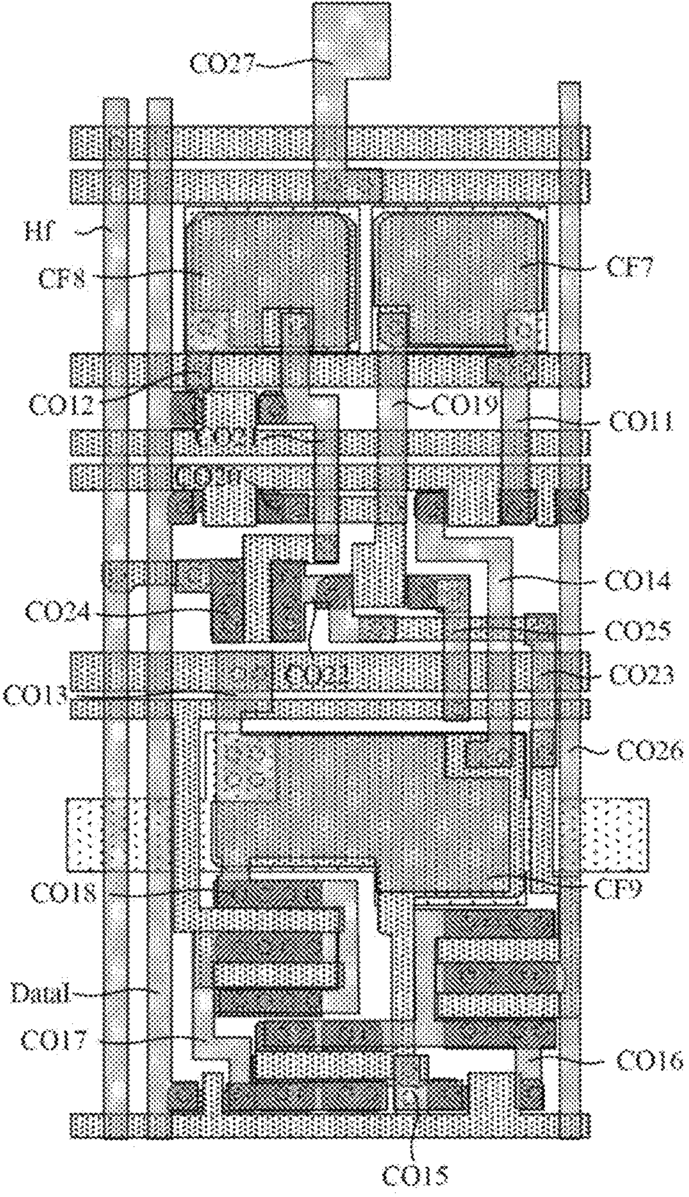
Figure 27:
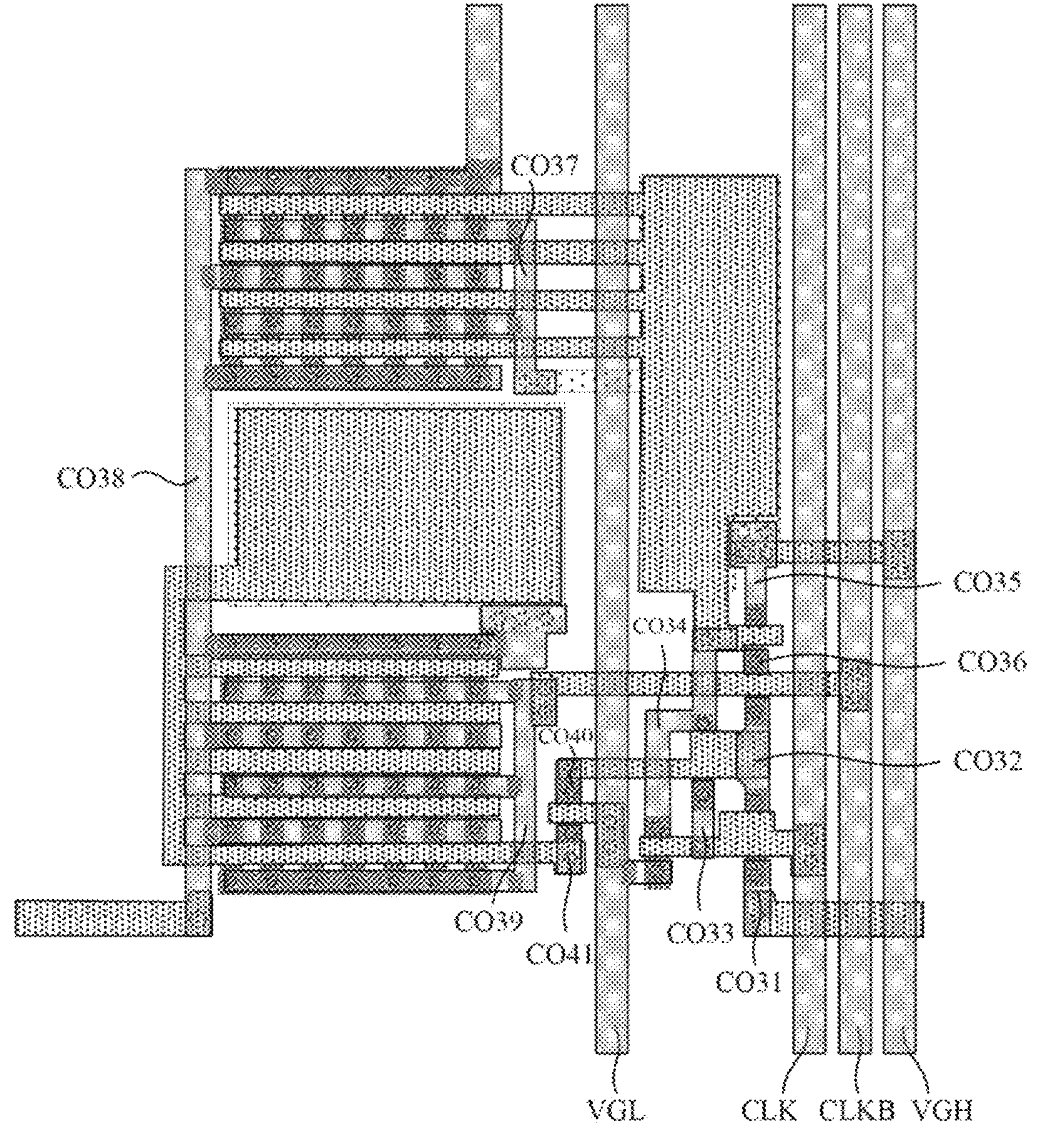
Figure 28:
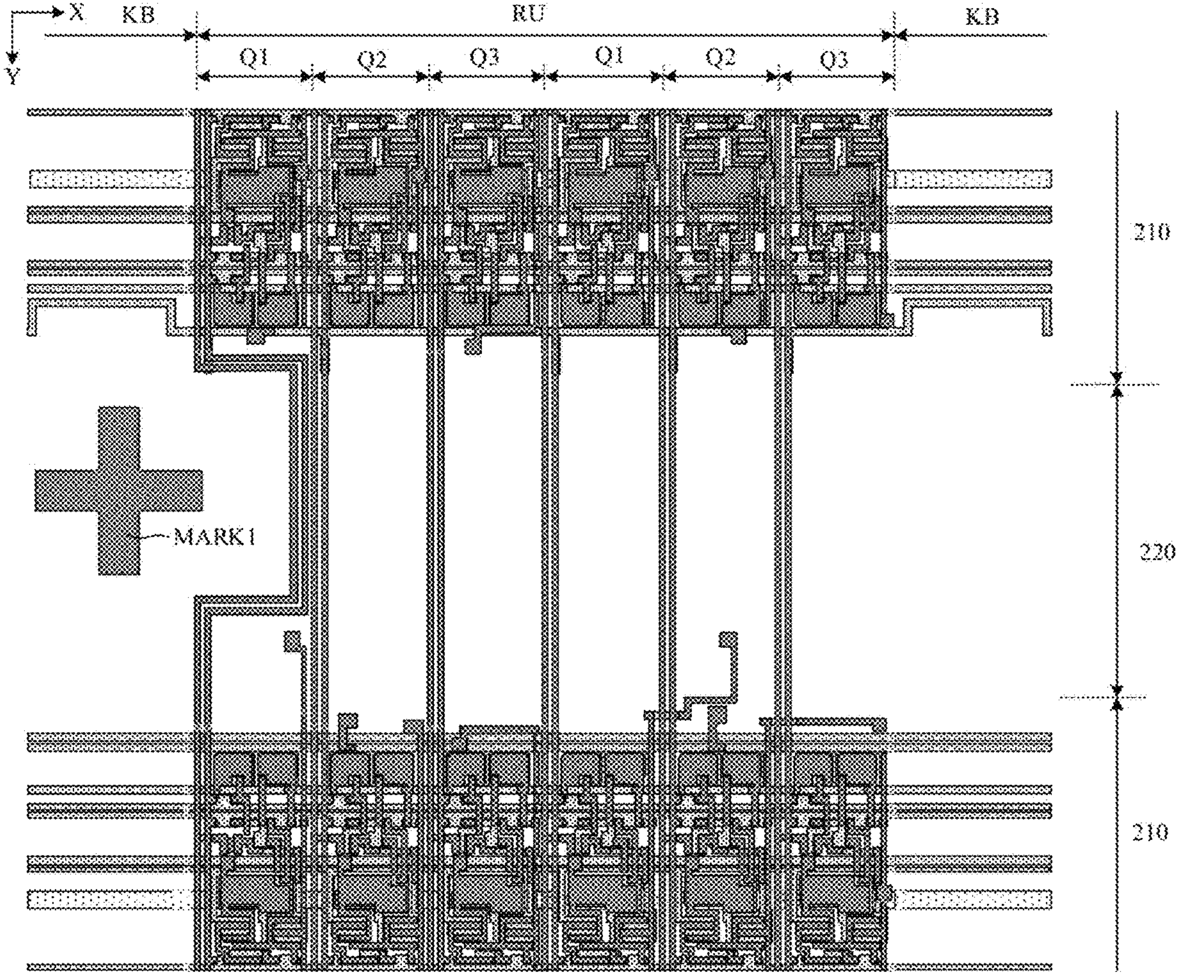

(5) Forming a pattern of a third conductive layer. In an exemplary implementation mode, the forming the pattern of the third conductive layer may include: depositing a third conductive thin film on the base substrate on which the aforementioned patterns are formed, and patterning the third conductive thin film using a patterning process, to form the pattern of the third conductive layer disposed on the third insulation layer, as shown in FIGS. 25, 26, 27, and 28, wherein FIG. 25 is a structure of a region A in FIG. 7, FIG. 26 is an enlarged view of a circuit unit in FIG. 25, FIG. 27 is an enlarged view of a gate drive circuit in FIG. 25, and FIG. 28 is a structure of a region B in FIG. 7. In an exemplary implementation mode, the third conductive layer may be referred to as a first source-drain metal (SD1) layer.

As shown in FIGS. 25 and 26, in an exemplary implementation mode, a pattern of a third conductive layer of each circuit unit at least includes a data signal line DataI, a high-frequency signal line Hf, a seventh electrode plate CF7, an eighth electrode plate CF8, a ninth electrode plate CF9, an anode connection block 13, and a plurality of connection electrodes.

In an exemplary implementation mode, the data signal line DataI may have a line shape of which a main body portion extends along the second direction Y, and may be located on a side of the circuit unit in a direction opposite to the first direction X. The data signal line DataI is connected with the first region of the fourth active layer through the seventeenth via V17 on one hand, and connected with the first region of the eighth active layer through the twenty-fifth via V25 on another hand, and connected with the first region of the tenth active layer through the twenty-ninth via V29 on yet another hand, thereby achieving that the data signal line DataI writes a data signal into the first electrode of the fourth transistor T4, the first electrode of the eighth transistor T8, and the first electrode of the tenth transistor T10, respectively.

In an exemplary implementation mode, the data signal line DataI may be multiplexed as a time-length signal line DataT. Time-length signals are provided to the first electrode of the eighth transistor T8 and the first electrode of the tenth transistor T10, respectively, using the data signal line DataI.

In an exemplary implementation mode, the high-frequency signal line Hf may have a line shape of which a main body portion extends along the second direction Y, and may be located on a side of the data signal line DataI in a direction opposite to the first direction X. On one hand, the high-frequency signal line Hf is connected with the first end of the first connection electrode CO1 through the forty-fourth via V44, and on the other hand, the high-frequency signal line Hf is connected with the high-frequency connection line Hf-C through the fortieth via V40, thereby achieving a connection between the high-frequency connection line Hf-C extending along the first direction X and the high-frequency signal line Hf extending along the second direction Y, and forming a mesh communicated structure for transmitting a high-frequency signal.

In an exemplary implementation mode, the seventh electrode plate CF7 may have a rectangular shape, an orthographic projection of the seventh electrode plate CF7 on the base substrate is at least partially overlapped with an orthographic projection of the fourth electrode plate CF4 on the base substrate, and the seventh electrode plate CF7 is connected with the first electrode plate CF1 through the thirty-third via V33. The seventh electrode plate CF7 may serve as another electrode plate of the first capacitor, and the fourth electrode plate CF4 and the seventh electrode plate CF7 constitute another first capacitor of the pixel drive circuit. Since the seventh electrode plate CF7 is connected with the first electrode plate CF1 through a via, the first electrode plate CF1 and the seventh electrode plate CF7 have a same initial signal potential, such that the first electrode plate CF1, the fourth electrode plate CF4, and the third electrode plate CF3 constitute a first capacitor with a parallel structure, the first electrode plate CF1 and the fourth electrode plate CF4 constitute a first capacitor of the pixel drive circuit, the fourth electrode plate CF4 and the seventh electrode plate CF7 constitute another first capacitor of the pixel drive circuit, and the two first capacitors are connected in parallel.

In an exemplary implementation mode, the eighth electrode plate CF8 may have a rectangular shape, an orthographic projection of the eighth electrode plate CF8 on the base substrate is at least partially overlapped with an orthographic projection of the fifth electrode plate CF5 on the base substrate, and the eighth electrode plate CF8 is connected with the second electrode plate CF2 through the thirty-fourth via V34. The eighth electrode plate CF8 may serve as another electrode plate of the second capacitor, and the fifth electrode plate CF5 and the eighth electrode plate CF8 constitute another second capacitor of the pixel drive circuit. Since the eighth electrode plate CF8 is connected with the second electrode plate CF2 through a via, the second electrode plate CF2 and the eighth electrode plate CF8 have a same initial signal potential, such that the second electrode plate CF2, the fifth electrode plate CF5, and the eighth electrode plate CF8 constitute a second capacitor with a parallel structure, the second electrode plate CF2 and the fifth electrode plate CF5 constitute a second capacitor of the pixel drive circuit, the fifth electrode plate CF5 and the eighth electrode plate CF8 constitute another second capacitor of the pixel drive circuit, and the two second capacitors are connected in parallel.

In an exemplary implementation mode, the ninth electrode plate CF9 may have a rectangular shape, an orthographic projection of the ninth electrode plate CF9 on the base substrate is at least partially overlapped with an orthographic projection of the sixth electrode plate CF6 on the base substrate, and the ninth electrode plate CF9 is connected with the third electrode plate CF3 through the thirty-fifth via V35. The ninth electrode plate CF9 may serve as another electrode plate of the storage capacitor, and the sixth electrode plate CF6 and the ninth electrode plate CF9 constitute another storage capacitor of the pixel drive circuit. Since the ninth electrode plate CF9 is connected with the third electrode plate CF3 through a via, the third electrode plate CF3 and the ninth electrode plate CF9 have a same first power supply potential, such that the third electrode plate CF3, the sixth electrode plate CF6, and the ninth electrode plate CF9 constitute a storage capacitor with a parallel structure, the third electrode plate CF3 and the sixth electrode plate CF6 constitute one storage capacitor of the pixel drive circuit, and the sixth electrode plate CF6 and the ninth electrode plate CF9 constitute another storage capacitor of the pixel drive circuit, and the two storage capacitors are connected in parallel.

In an exemplary implementation mode, a plurality of connection electrodes in each circuit unit may at least include an eleventh connection electrode CO11 to a twenty-sixth connection electrode CO26.

In an exemplary implementation mode, the eleventh connection electrode CO11 may have a strip shape extending along the second direction Y, a first end of the eleventh connection electrode CO11 is connected with the first region of the first active layer (also the first region of the seventh active layer) through the eleventh via V11, and a second end of the eleventh connection electrode CO11 is connected with the initial signal line Vint through the forty-second via V42, thereby achieving that the initial signal line Vint writes an initial signal into the first electrode of the first transistor T1 and the first electrode of the seventh transistor T7, respectively.

In an exemplary implementation mode, the eleventh connection electrode CO11 is further connected with the seventh electrode plate CF7, and since the first electrode plate CF1 and the seventh electrode plate CF7 are connected through a via, it is achieved that the initial signal line Vint writes an initial signal into the first electrode plate CF1 and the seventh electrode plate CF7 of the first capacitor.

In an exemplary implementation mode, the eleventh connection electrode CO11 and the seventh electrode plate CF7 may be of an interconnected integral structure.

In an exemplary implementation mode, the twelfth connection electrode CO12 may have a strip shape extending along the second direction Y, a first end of the twelfth connection electrode CO12 is connected with the initial signal line Vint through the forty-third via V43, and a second end of the twelfth connection electrode CO12 is connected with the eighth electrode plate CF8. Since the second electrode plate CF2 and the eighth electrode plate CF8 are connected through a via, it is achieved that the initial signal line Vint writes an initial signal into the second electrode plate CF2 and the eighth electrode plate CF8 of the second capacitor.

In an exemplary implementation mode, the twelfth connection electrode CO12 and the eighth electrode plate CF8 may be of an interconnected integral structure.

In an exemplary implementation mode, the thirteenth connection electrode CO13 may have a strip shape extending along the second direction Y, a first end of the thirteenth connection electrode CO13 is connected with the high voltage connection line VDD-C through the thirty-ninth via V39, and a second end of the thirteenth connection electrode CO13 is connected with the ninth electrode plate CF9. Since the third electrode plate CF3 and the ninth electrode plate CF9 are connected through a via, the high voltage connection line VDD-C is configured to be connected with the high voltage power supply line, thereby achieving that the high voltage power supply line writes a high voltage signal into the third electrode plate CF3 and the ninth electrode plate CF9 of the storage capacitor.

In an exemplary implementation mode, the thirteenth connection electrode CO13 and the ninth electrode plate CF9 may be of an interconnected integral structure.

In an exemplary implementation mode, the fourteenth connection electrode CO14 may have a shape of a broken line extending along the second direction Y, a first end of the fourteenth connection electrode CO14 is connected with the second region of the first active layer through the twelfth via V12, a second end of the fourteenth connection electrode CO14 is connected with the sixth electrode plate CF6 through the thirty-eighth via V38, and the fourteenth connection electrode CO14 enables the second electrode of the first transistor T1 and the sixth electrode plate CF6 to have a same potential.

In an exemplary implementation mode, the fifteenth connection electrode CO15 may have a shape of a broken line, a first end of the fifteenth connection electrode CO15 is connected with the first region of the second active layer through the thirteenth via V13, a second end of the fifteenth connection electrode CO15 is connected with the fourth connection electrode CO4 through the forty-ninth via V49, and a portion between the first end and the second end of the fifteenth connection electrode CO15 is connected with the third bottom gate electrode Gate3-B through the fiftieth via V50. In an exemplary implementation mode, since the fourth connection electrode CO4 is connected with the third top gate electrode Gate3-T and the sixth electrode plate CF6, respectively, the fifteenth connection electrode CO15 not only enables the third top gate electrode Gate3-T and the third bottom gate electrode Gate3-B to be connected with each other, but also enables the first electrode of the second transistor T2, the gate electrode of the third transistor T3, and the sixth electrode plate CF6 to have a same potential.

In an exemplary implementation mode, on one hand, the sixth electrode plate CF6 is connected with the first electrode of the second transistor T2 and the gate electrode of the third transistor T3, and on the other hand, the sixth electrode plate CF6 is connected with the second electrode of the first transistor T1, such that the fourteenth connection electrode CO14 and the fifteenth connection electrode CO15 enable the second electrode of the first transistor T1, the first electrode of the second transistor T2, the gate electrode of the third transistor T3, and the sixth electrode plate CF6 to have a same potential (i.e., a third node N3 of the pixel drive circuit).

In an exemplary implementation mode, the sixteenth connection electrode CO16 has a shape of a broken line, a first end of the sixteenth connection electrode CO16 is connected with the second region of the second active layer through the fourteenth via V14, a second end of the sixteenth connection electrode CO16 is connected with the second region of the third active layer through the sixteenth via V16, a portion between the first end and the second end of the sixteenth connection electrode CO16 is connected with the first region of the sixth active layer through the twenty-first via V21, and the sixteenth connection electrode CO16 enables the second electrode of the second transistor T2, the second electrode of the third transistor T3, and the first electrode of the sixth transistor T6 to have a same potential (i.e., a fourth node N4 of the pixel drive circuit).

In an exemplary implementation mode, the seventeenth connection electrode CO17 may have a shape of a broken line, a first end of the seventeenth connection electrode CO17 is connected with the first region of the third active layer through the fifteenth via V15, a second end of the seventeenth connection electrode CO17 is connected with the second region of the fifth active layer through the twentieth via V20, a portion between the first end and the second end of the seventeenth connection electrode CO17 is connected with the second region of the fourth active layer through the eighteenth via V18, and the seventeenth connection electrode CO17 enables the first electrode of the third transistor T3, the second electrode of the fourth transistor T4, and the second electrode of the fifth transistor T5 to have a same potential (i.e., a fifth node N5 of the pixel drive circuit).

In an exemplary implementation mode, the eighteenth connection electrode CO18 may have a shape of a broken line, a first end of the eighteenth connection electrode CO18 is connected with the first region of the fifth active layer through the nineteenth via V19, a second end of the eighteenth connection electrode CO18 is connected with the ninth electrode plate CF9, and the eighteenth connection electrode CO18 enables the first electrode of the fifth transistor T5 and the ninth electrode plate CF9 to have a same potential. Since the ninth electrode plate CF9 is connected with the thirteenth connection electrode CO13, the thirteenth connection electrode CO13 is connected with the high voltage connection line VDD-C, and the high voltage connection line VDD-C is configured to be connected with the high voltage power supply line, it is achieved that the high voltage power supply line writes a high voltage signal into a first electrode of a fifth transistor T5 of each circuit unit.

In an exemplary implementation mode, the eighteenth connection electrode CO18 and the ninth electrode plate CF9 may be of an interconnected integral structure.

In an exemplary implementation mode, the nineteenth connection electrode CO19 may have a strip shape extending along the second direction Y, a first end of the nineteenth connection electrode CO19 is connected with the second end of the seventh connection electrode CO7 through the fifty-third via V53, a second end of the nineteenth connection electrode CO19 is connected with the fourth electrode plate CF4 through the thirty-sixth via V36, and the nineteenth connection electrode CO19 enables the gate electrode of the ninth transistor T9 and the fourth electrode plate CF4 to have a same potential.

In an exemplary implementation mode, the twentieth connection electrode CO20 may have a strip shape extending along the first direction X, a first end of the twentieth connection electrode CO20 is connected with the second region of the eighth active layer through the twenty-sixth via V26, and a second end of the twentieth connection electrode CO20 is connected with the first end of the seventh connection electrode CO7 through the fifty-second via V52. Since the seventh connection electrode CO7 and the ninth gate electrode Gate9 are connected, the nineteenth connection electrode CO19 and the twentieth connection electrode CO20 enable the second electrode of the eighth transistor T8, the gate electrode of the ninth transistor T9, and the fourth electrode CF4 to have a same potential (i.e., a sixth node N6 of the pixel drive circuit).

In an exemplary implementation mode, the twenty-first connection electrode CO21 may have a strip shape extending along the second direction Y, a first end of the twenty-first connection electrode CO21 is connected with the eighth connection electrode CO8 through the fifty-fourth via V54, a second end of the twenty-first connection electrode CO21 is connected with the fifth electrode plate CF5 through the thirty-seventh via V37, and a portion between the first end and the second end of the twenty-first connection electrode CO21 is connected with the second region of the tenth active layer through the thirtieth via V30. Since the eighth connection electrode CO8 is connected with the eleventh gate electrode Gate11, the twenty-first connection electrode CO21 enables the second electrode of the tenth transistor T10, the gate electrode of the eleventh transistor T11, and the fifth electrode plate CF5 to have a same potential (i.e., a seventh node N7 of the pixel drive circuit).

In an exemplary implementation mode, the twenty-second connection electrode CO22 may have a shape of a broken line extending along the first direction X, a first end of the twenty-second connection electrode CO22 is connected with the second region of the eleventh active layer through the thirty-second via V32, a second end of the twenty-second connection electrode CO22 is connected with the first end of the second connection electrode CO2 through the forty-sixth via V46, a portion between the first end and the second end of the twenty-second connection electrode CO22 is connected with the second region of the ninth active layer through the twenty-eighth via V28, and the twenty-second connection electrode CO22 enables the second electrode of the ninth transistor T9 and the second electrode of the eleventh transistor T11 to be connected with each other.

In an exemplary implementation mode, the twenty-third connection electrode CO23 may have a strip shape extending along the second direction Y, a first end of the twenty-third connection electrode CO23 is connected with the second end of the second connection electrode CO2 through the forty-seventh via V47, and a second end of the twenty-third connection electrode CO23 is connected with the sixth connection electrode CO6 through the fifty-first via V51. Since the twenty-second connection electrode CO22 and the twenty-third connection electrode CO23 are connected through the second connection electrode CO2, and the sixth connection electrode CO6 is connected with the sixth gate electrode Gate6, the twenty-second connection electrode CO22 and the twenty-third connection electrode CO23 enable the sixth gate electrode Gate6, the second electrode of the ninth transistor T9, and the second electrode of the eleventh transistor T11 to have a same potential (i.e., a first node N1 of the pixel drive circuit).

In an exemplary implementation mode, the twenty-fourth connection electrode 24 may have an “L” shape, a first end of the twenty-fourth connection electrode 24 is connected with the first region of the eleventh active layer through the thirty-first via V31, and a second end of the twenty-fourth connection electrode 24 is connected with the second end of the first connection electrode CO1 through the forty-fifth via V45. Since the first end of the first connection electrode CO1 is connected with the high-frequency signal line Hf through a via, it is achieved that the high-frequency signal line Hf writes a high-frequency signal into the first electrode of the eleventh transistor T11.

In an exemplary implementation mode, the twenty-fifth connection electrode CO25 may have an “L” shape, a first end of the twenty-fifth connection electrode CO25 is connected with the first region of the ninth active layer through the twenty-seventh via V27, a second end of the twenty-fifth connection electrode CO25 is connected with the light emitting signal line EM through the forty-first via V41, and a portion between the first end and the second end of the twenty-fifth connection electrode CO25 is connected with the third connection electrode CO3 through the forty-eighth via V48, thereby achieving that the light emitting signal line EM writes a light emitting signal into the first electrode of the ninth transistor T9.

In an exemplary implementation mode, the twenty-sixth connection electrode CO26 may have a strip shape extending along the second direction Y, a first end of the twenty-sixth connection electrode CO26 is connected with the second region of the sixth active layer through the twenty-second via V22, and a second end of the twenty-sixth connection electrode CO26 is connected with the second region of the seventh active layer through the twenty-fourth via V24, such that the twenty-sixth connection electrode CO26 enables the second electrode of the sixth transistor T6 and the second electrode of the seventh transistor T7 to have a same potential (i.e., a second node N2 of the pixel drive circuit).

In an exemplary implementation mode, the third conductive layer may further include a twenty-seventh connection electrode CO27. The twenty-seventh connection electrode CO27 may have a strip shape extending along the second direction Y, and may be disposed in part of the circuit units. The twenty-seventh connection electrode CO27 is connected with the low voltage connection line VSS-C through the fifty-fifth via V55, and is configured to be connected with a low voltage power supply line formed subsequently.

In an exemplary implementation mode, part of the circuit units may further include a second anode connection line 12 and an anode connection block 13.

In an exemplary implementation mode, a first end of the second anode connection line 12 is configured to be connected with the first anode connection line 11 through a connection line via, and a second end of the second anode connection line 12 is configured to be directly connected with the anode connection block 13. An anode connection block 13 of the part of the circuit units is directly connected with the twenty-sixth connection electrode CO26, and is connected with the anode connection block 13 through the first anode connection line 11 and the second anode connection line 12, so as to achieve a connection between an anode connection block 13 in each circuit unit and the twenty-sixth connection electrode CO26, which is not limited here in the present disclosure.

As shown in FIGS. 25 and 27, in an exemplary implementation mode, a pattern of a third conductive layer of each gate drive circuit at least includes a first clock signal line CLK, a second clock signal line CLKB, a high voltage line VGH, a low voltage line VG, and a plurality of connection electrodes.

In an exemplary implementation mode, the first clock signal line CLK may have a line shape of which a main body portion extends along the second direction Y, and may be located on a side of the fourteenth electrode plate CF14 away from the thirteenth electrode plate CF13. The first clock signal line CLK is connected with the first gate block GK1 through the eighty-fifth via V85. Since the first gate block GK1 is connected with the twenty-first gate electrode Gate21, and the twenty-first gate electrode Gate21 and the twenty-third gate electrode Gate23 are connected, it is achieved that the first clock signal line CLK may control turn-on and turn-off of the twenty-first transistor T21 and the twenty-third transistor T23.

In an exemplary implementation mode, the second clock signal line CLKB may have a line shape of which a main body portion extends along the second direction Y, and may be located on a side of the first clock signal line CLK away from the fourteenth electrode pate CF14. The second clock signal line CLKB is connected with the second gate block GK2 through the eighty-sixth via V86. Since the second gate block GK2 is connected with the twenty-seventh gate electrode Gate27, it is achieved that the second clock signal line CLKB may control turn-on and turn-off of the twenty-seventh transistor T27.

In an exemplary implementation mode, the high voltage line VGH may have a line shape of which a main body portion extends along the second direction Y, and may be located on a side of the second clock signal line CLKB away from the fourteenth electrode plate CF14. The high voltage line VGH is connected with the second end of the third gate block GK3 through the eighty-seventh via V87.

In an exemplary implementation mode, the low voltage line VGL may have a line shape of which a main body portion extends along the second direction Y, and may be located between the thirteenth electrode plate CF13 and the fourteenth electrode plate CF14. The low voltage line VGL is connected with the fourth gate block GK4 through the eighty-eighth via V88 on one hand, and connected with the first region of the twenty-third active layer through the ninetieth via V90 on the other hand. Since the fourth gate block GK4 is connected with the twenty-eighth gate electrode Gate28, it is achieved that the low voltage line VGL may control turn-on and turn-off of the twenty-eighth transistor T28 and a low voltage signal is written into the first electrode of the twenty-third transistor T23.

In an exemplary implementation mode, an orthographic projection of the gate drive circuit on a plane of the display substrate is not overlapped with an orthographic projection of the data signal line on the plane of the display substrate.

In an exemplary implementation mode, since the first clock signal line CLK and the second clock signal line CLKB are disposed in a region where a blank column is located, the data signal line DataI may be disposed in a region where a repeat unit column is located, such that the data signal line DataI is not overlapped with the first clock signal line CLK and the second clock signal line CLKB, an orthographic projection of the first clock signal line CLK on the plane of the display substrate is not overlapped with an orthographic projection of the data signal line DataI on the plane of the display substrate, and an orthographic projection of the second clock signal line CLKB on the plane of the display substrate is not overlapped with the orthographic projection of the data signal line DataI on the plane of the display substrate.

In an exemplary implementation mode, the first clock signal line CLK may be substantially parallel to the data signal line DataI, the second clock signal line CLKB may be substantially parallel to the data signal line DataI, or an orthographic projection of the first clock signal line CLK on the plane of the display substrate may be substantially parallel to an orthographic projection of the data signal line DataI on the plane of the display substrate, and an orthographic projection of the second clock signal line CLKB on the plane of the display substrate may be substantially parallel to the orthographic projection of the data signal line DataI on the plane of the display substrate.

In an exemplary implementation mode, along the first direction X, the first clock signal line CLK and the second clock signal line CLKB may be disposed between the high voltage line VGH and the low voltage line VGL such that the data signal line DataI is located on a side of the high voltage line VGH away from the first clock signal line CLK and the data signal line DataI is located on a side of the low voltage line VGL away from the second clock signal line CLKB. The high voltage line VGH and the low voltage line VGL transmitting a constant voltage signal may play a shielding role to effectively reduce a coupling capacitance between a clock signal line and a data signal line.

In an exemplary implementation mode, there is a first distance L between an edge on a side of the high voltage line VGH close to the data signal line DataI and an edge on a side of the data signal line DataI close to the high voltage line VGH, there is a second distance L2 between an edge on a side of the low voltage line VGL close to the data signal line DataI and an edge on a side of the data signal line DataI close to the low voltage line VGL, the second distance L2 may be greater than the first distance L1.

In an exemplary implementation mode, the first distance L1 may be greater than or equal to 25 μm, and the second distance L2 may be greater than or equal to 25 μm. For example, the first distance L1 may be about 28.5 μm.

In an exemplary implementation mode, there is a third distance L3 between an edge on a side of the first clock signal line CLK close to the low voltage line VGL and an edge on a side of the low voltage line VGL close to the first clock signal line CLK, there is a fourth distance L4 between an edge on a side of the second clock signal line CLKB close to the high voltage line VGH and an edge on a side of the high voltage line VGH close to the second clock signal line CLKB, and the third distance L3 may be greater than the fourth distance L4.

In an exemplary implementation mode, a fifth distance L5 between an edge on a side of the gate drive circuit close to the data signal line DataI and an edge on a side of the data signal line DataI close to the gate drive circuit may be greater than or equal to 50 μm, for example, the fifth distance L5 may be about 55.5 μm. The fifth distance L5 may be a size in the first direction X.

In an exemplary implementation mode, a plurality of connection electrodes of each gate drive circuit may at least include a thirty-first connection electrode CO31 to a forty-first connection electrode CO41.

In an exemplary implementation mode, the thirty-first connection electrode CO31 may have a strip shape, a first end of the thirty-first connection electrode CO31 is connected with the first region of the twenty-first active layer through the sixty-first via V61, and a second end of the thirty-first connection electrode CO31 is connected with an output signal line G(n−1) of a previous level through the eighty-ninth via V89, such that an output signal of the previous level transmitted by the output signal line G(n−1) of the previous level may be written into the first electrode of the twenty-first transistor T21.

In an exemplary implementation mode, the thirty-second connection electrode CO32 may have a strip shape, a first end of the thirty-second connection electrode CO32 is connected with the second region of the twenty-first active layer through the sixty-second via V62, and a second end of the thirty-second connection electrode CO32 is connected with the second region of the twenty-seventh active layer through the seventy-fourth via V74, such that the second electrode of the twenty-first transistor T21 and the second electrode of the twenty-seventh transistor T27 are connected with each other (an eleventh node N11 of the gate drive circuit).

In an exemplary implementation mode, the thirty-third connection electrode CO33 may have a strip shape, a first end of the thirty-third connection electrode CO33 is connected with the first region of the twenty-second active layer through the sixty-third via V63, and a second end of the thirty-third connection electrode CO33 is connected with the twenty-third gate electrode Gate23 through the seventy-eighth via V78. Since the twenty-third gate electrode Gate23 is connected with the first clock signal line CLK, it is achieved that the first clock signal line CLK writes a first clock signal into the first electrode of the twenty-second transistor T22.

In an exemplary implementation mode, the thirty-fourth connection electrode CO34 may have a shape of a broken line, a first end of the thirty-fourth connection electrode CO34 is connected with the twenty-sixth gate electrode Gate26 through the eightieth via V80, a second end of the thirty-fourth connection electrode CO34 is connected with the second region of the twenty-third active layer through the sixty-sixth via V66, and a portion between the first end and the second end of the thirty-fourth connection electrode CO34 is connected with the second region of the twenty-second active layer through the sixty-fourth via V64. Since the twenty-sixth gate electrode Gate26 is connected with the fourteenth electrode plate CF14, and the fourteenth electrode plate CF14 is connected with the twenty-fourth gate electrode Gate24, the thirty-fourth connection electrode CO34 enables the second electrode of the twenty-second transistor T22, the second electrode of the twenty-third transistor T23, the gate electrode of the twenty-fourth transistor T24, the gate electrode of the twenty-sixth transistor T26, and the fourteenth electrode plate CF14 to have a same potential (a twelfth node N12 of the gate drive circuit).

In an exemplary implementation mode, the thirty-fifth connection electrode CO35 may have a strip shape, a first end of the thirty-fifth connection electrode CO35 is connected with the first region of the twenty-sixth active layer through the seventy-first via V71, and a second end of the thirty-fifth connection electrode CO35 is connected with the twelfth electrode plate CF12 through the eighty-third via V83 on one hand, and connected with the first end of the third gate block GK3 through the eighty-fourth via V84 on the other hand. Since the third gate block GK3 is connected with the high voltage line VGH, it is achieved that the high voltage line VGH writes a high voltage signal into the first electrode of the twenty-sixth transistor T26, and the twelfth electrode plate CF12 and the high voltage line VGH have a same potential.

In an exemplary implementation mode, the thirty-sixth connection electrode CO36 may have a rectangular shape. The thirty-sixth connection electrode CO36 is connected with the second region of the twenty-sixth active layer (which is also the first region of the twenty-seventh active layer) through the seventy-second via V72 (which is also the seventy-third via V73), thereby achieving a connection between the second electrode of the twenty-sixth transistor T26 and the first electrode of the twenty-seventh transistor T27 (a thirteenth node N13 of the gate drive circuit).

In an exemplary implementation mode, the thirty-seventh connection electrode CO37 may have a comb shape. On one hand, the thirty-seventh connection electrode CO37 is connected with the first region of the twenty-fourth active layer through the sixty-seventh via V67, and on the other hand, the thirty-seventh connection electrode CO37 is connected with the twelfth electrode plate CF12 through the eighty-third via V83. Since the twelfth electrode plate CF12 is connected with the high voltage line VGH, it is achieved that the high voltage line VGH writes a high voltage signal into the first electrode of the twenty-fourth transistor T24.

In an exemplary implementation mode, the thirty-eighth connection electrode CO38 may have a comb shape. On one hand, the thirty-eighth connection electrode CO38 is connected with the second region of the twenty-fourth active layer through the sixty-eighth via V68, on another hand, the thirty-eighth connection electrode CO38 is connected with the second region of the twenty-fifth active layer through the seventieth via V70, on yet another hand, the thirty-eighth connection electrode CO38 is connected with an output signal line G(n) of a present level through the ninetieth via V90, and on yet another hand, the thirty-eighth connection electrode CO38 is connected with the eleventh electrode CF11 through the eighty-second via V82, thereby achieving that the second electrode of the twenty-fourth transistor T24, the second electrode of the twenty-fifth transistor T25, and the eleventh electrode CF11 have a same potential. In an exemplary implementation mode, the thirty-eighth connection electrode CO38 may serve as an output line of the present level, an end of the thirty-eighth connection electrode CO38 away from the gate drive circuit is connected with the second scan signal line S2 (or the first scan signal line S1 and the light emitting signal line EM) through a gate line via after extending to a first circuit region.

In an exemplary implementation mode, the thirty-ninth connection electrode CO39 may have a comb shape. On one hand, the thirty-ninth connection electrode CO39 is connected with the first region of the twenty-fifth active layer through the sixty-ninth via V69, and on the other hand, the thirty-ninth connection electrode CO39 is connected with the twenty-seventh gate electrode Gate27 through the eighty-first via V81. Since the twenty-seventh gate electrode Gate27 is connected with the second clock signal line CLKB, it is achieved that the second clock signal line CLKB writes a second clock signal into the first electrode of the twenty-fifth transistor T25.

In an exemplary implementation mode, the fortieth connection electrode CO40 may have a strip shape. On one hand, the fortieth connection electrode CO40 is connected with the first region of the twenty-eighth active layer through the seventy-fifth via V75, and on the other hand, the fortieth connection electrode CO40 is connected with the twenty-second gate electrode Gate22 through the seventy-seventh via V77, such that the gate electrode of the twenty-second transistor T22 and the first electrode of the twenty-eighth transistor T28 are connected with each other (an eleventh node N11 of the gate drive circuit).

In an exemplary implementation mode, the forty-first connection electrode CO41 may have a strip shape. On one hand, the forty-first connection electrode CO41 is connected with the second region of the twenty-eighth active layer through the seventy-sixth via V76, and on the other hand, the forty-first connection electrode CO41 is connected with the twenty-fifth gate electrode Gate25 through the seventy-ninth via V79. Since the twenty-fifth gate electrode Gate25 is connected with the thirteenth electrode plate CF13, the gate electrode of the twenty-fifth transistor T25, the second electrode of the twenty-eighth transistor T28, and the thirteenth electrode plate CF13 have a same potential (a fourteenth node N14 of the gate drive circuit).

As shown in FIG. 28, in an exemplary implementation mode, the pattern of the third conductive layer of the second circuit region 220 may further include a first mark MARK1, which may be located at one side edge or both side edges of the second circuit region 220 in the first direction X. The first mark MARK1 is configured as a splicing mark, and positioning is performed through the first mark MARK1 when splicing the display substrate.

In an exemplary implementation mode, the first mark MARK1 may have a cross shape, a setting position of at least one first mark MARK1 in the second circuit region 220 may substantially correspond to a setting position of at least one blank unit KB in a first circuit region 210, i.e., the first mark MARK1 may be disposed in a region where a blank column is located, and an orthographic projection of at least one first mark MARK1 on a reference line O1 is at least partially overlapped with an orthographic projection of at least one blank unit KB on the reference line O1.

In an exemplary implementation mode, a data signal line and a high-frequency connection line adjacent to the first mark MARK1 may be provided with a bending section, which may be bent toward a direction away from the first mark MARK1, leaving corresponding space for the first mark MARK1.

In an exemplary implementation mode, the pixel drive circuit and its corresponding signal line, as well as the gate drive circuit and its corresponding signal line, all avoid the first mark MARK1. An orthographic projection of the first mark MARK1 on the base substrate is not overlapped with orthographic projections of the pixel drive circuit and the gate drive circuit on the base substrate, and the orthographic projection of the first mark MARK1 on the base substrate is not overlapped with orthographic projections of the first scan signal line, the second scan signal line, the light emitting signal line, the high-frequency signal line, the initial signal line, the data signal line, the first clock signal line, the second clock signal line, the high voltage line, and the low voltage line, etc. on the base substrate.

(6) Forming patterns of a fourth insulation layer and a first planarization layer. In an exemplary implementation mode, the forming the patterns of the fourth insulation layer and the first planarization layer may include: first coating a first planarization thin film on the base substrate on which the aforementioned patterns are formed, patterning the first planarization thin film using a patterning process, then depositing a fourth insulation thin film, patterning the fourth insulation thin film using a patterning process, to form a first planarization layer covering the third conductive layer pattern and a fourth insulation layer disposed on a side of the first planarization layer away from the base substrate, wherein a plurality of vias are disposed on the fourth insulation layer and the first planarization layer, as shown in FIGS. 29, 30, and 31, wherein FIG. 29 is a structure of a region A in FIG. 7, FIG. 30 is an enlarged view of a circuit unit in FIG. 29, and FIG. 31 is a structure of a region B in FIG. 7.

Figure 29:
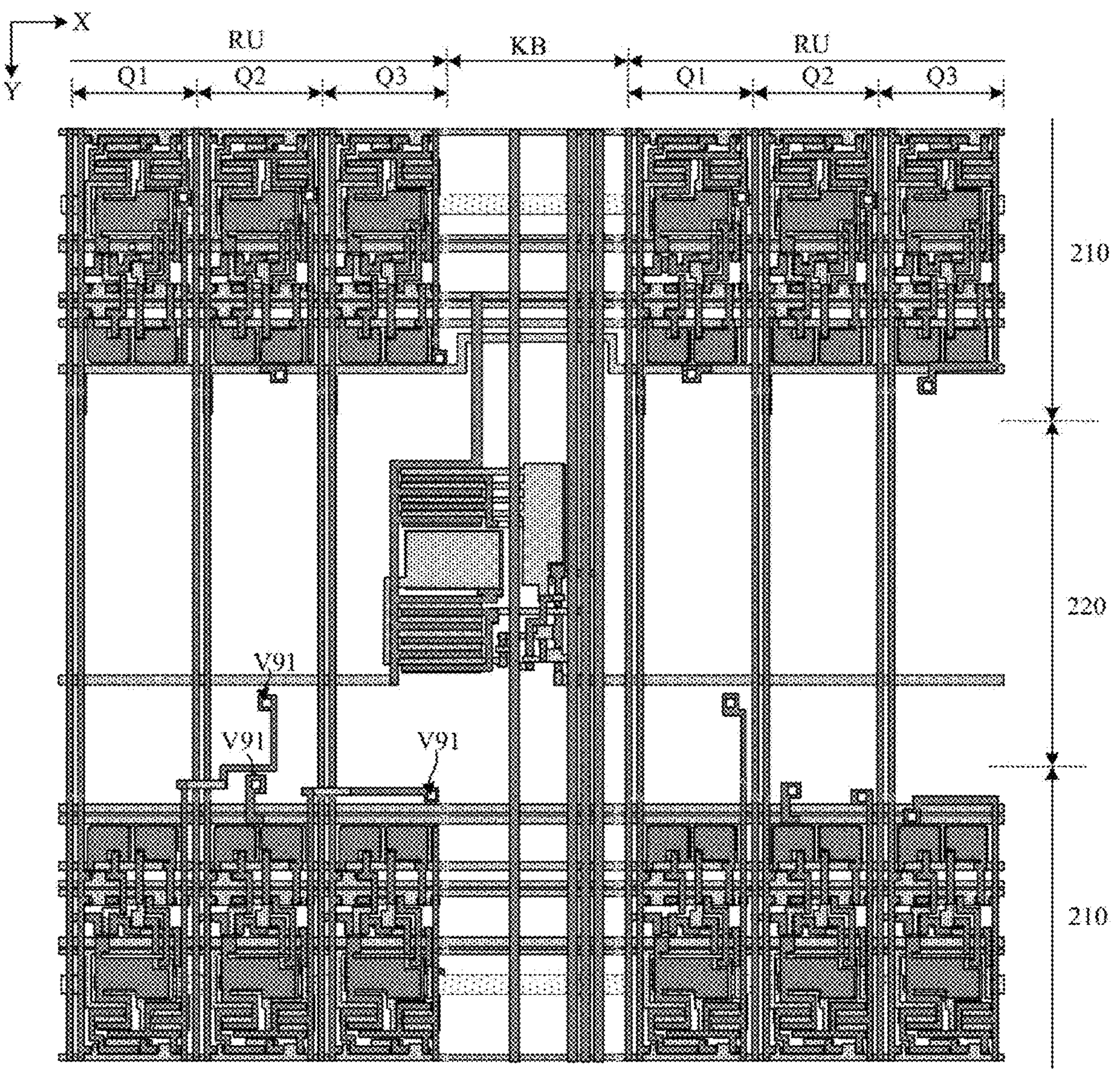
FIGS. 29 to 31 are schematic diagrams of a display substrate after formation of a pattern of a first planarization layer according to the present disclosure.
Figure 30:
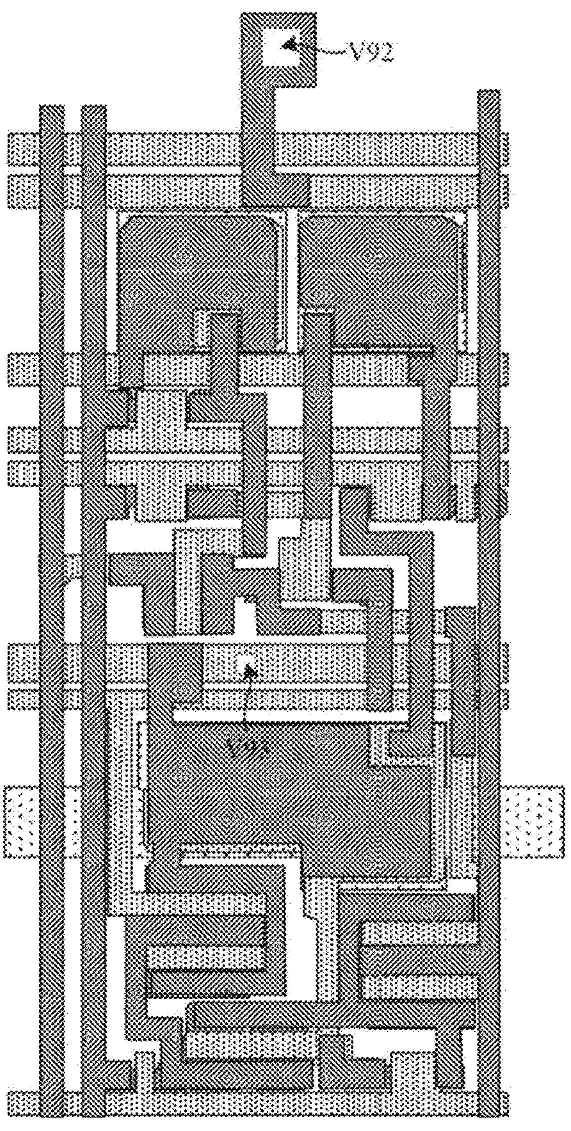
Figure 31:
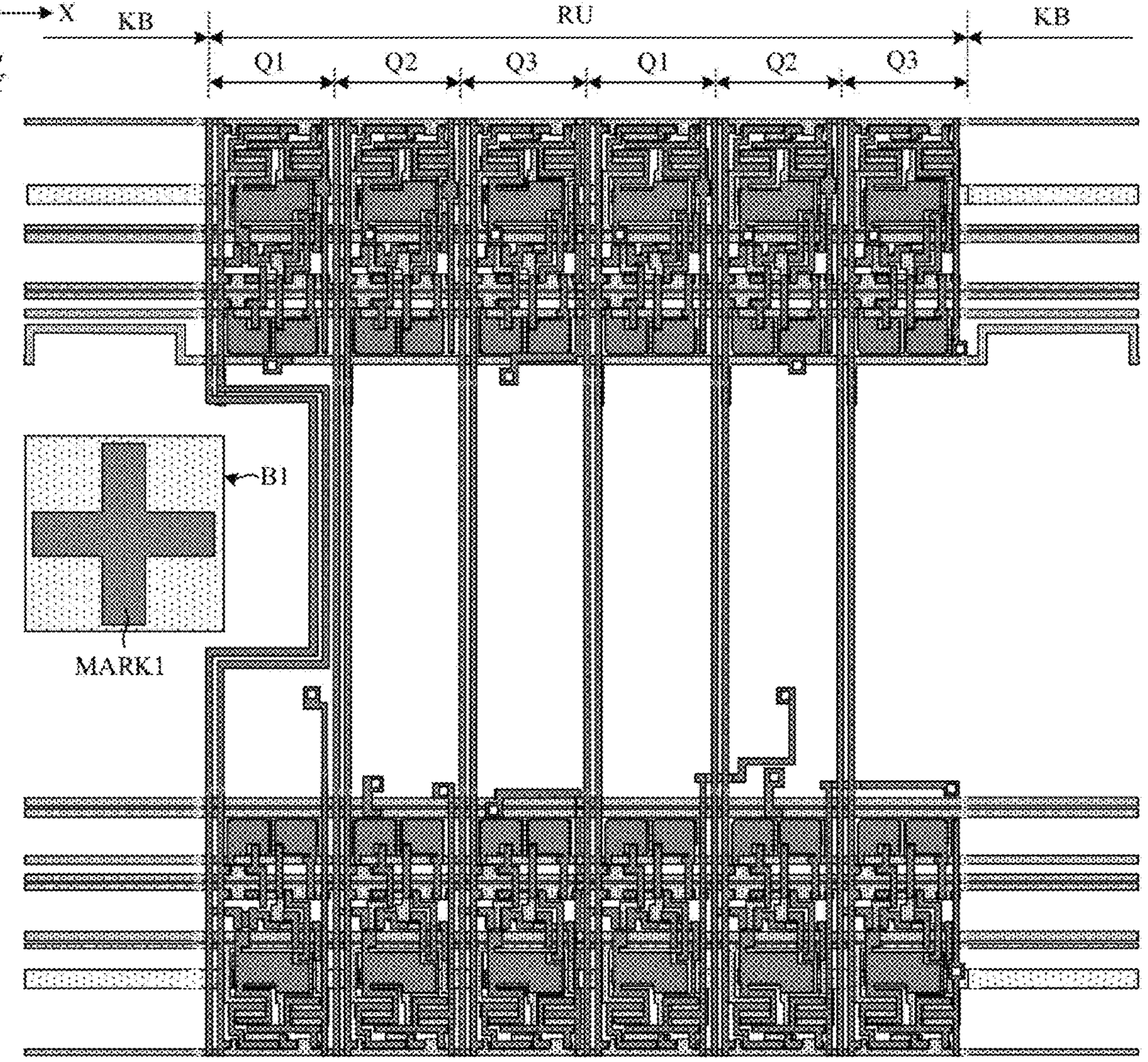

As shown in FIGS. 29 and 30, in an exemplary implementation mode, a plurality of vias of each circuit unit may at least include a ninety-first via V91.

In an exemplary implementation mode, an orthographic projection of the ninety-first via V91 on the base substrate is within a range of an orthographic projection of the anode connection block 13 on the base substrate, the fourth insulation thin film and the first planarization thin film in the ninety-first via V91 are removed to expose a surface of the anode connection block 13, and the ninety-first via V91 is configured such that an anode connection electrode formed subsequently is connected with the anode connection block 13 through the via.

In an exemplary implementation mode, part of the circuit units may further include a ninety-second via V92. An orthographic projection of the ninety-second via V92 on the base substrate is within a range of an orthographic projection of the twenty-seventh connection electrode CO27 on the base substrate, the fourth insulation thin film and the first planarization thin film in the ninety-second via V92 are removed to expose a surface of the twenty-seventh connection electrode CO27, and the ninety-second via V92 is configured such that a low voltage power supply line formed subsequently is connected with the twenty-seventh connection electrode CO27 through the via.

In an exemplary implementation mode, part of the circuit units may further include a ninety-third via V93. An orthographic projection of the ninety-third via V93 on the base substrate is within a range of an orthographic projection of the thirteenth connection electrode CO13 on the base substrate, the fourth insulation thin film and the first planarization thin film in the ninety-third via V93 are removed to expose a surface of the thirteenth connection electrode CO13, and the ninety-third via V93 is configured such that a high voltage power supply line formed subsequently is connected with the thirteenth connection electrode CO13 through the via.

In an exemplary implementation mode, no via is disposed on the fourth insulation layer and the first planarization layer in a region where the gate drive circuit is located.

As shown in FIG. 31, in an exemplary implementation mode, a first mark hole B1 is disposed on the first planarization layer in a region where the first mark MARK1 is located.

In an exemplary implementation mode, in a process of forming the first planarization layer using a patterning process, a region where the first mark MARK1 is located is provided with a first mark hole B1, and the first planarization layer in the first mark hole B1 is removed, to expose the first mark MARK1. The first mark hole B1 may have a rectangular shape, and an orthographic projection of the first mark hole B1 on the base substrate may include an orthographic projection of the first mark MARK1 on the base substrate. In a process of forming the fourth insulation layer, a region where the first mark hole B1 is located is covered by the fourth insulation layer such that the fourth insulation layer covers the first mark MARK1, i.e., the first mark MARK1 is only covered with the fourth insulation layer (also referred to as a first passivation layer) to protect the first mark MARK1.

Figure 32:
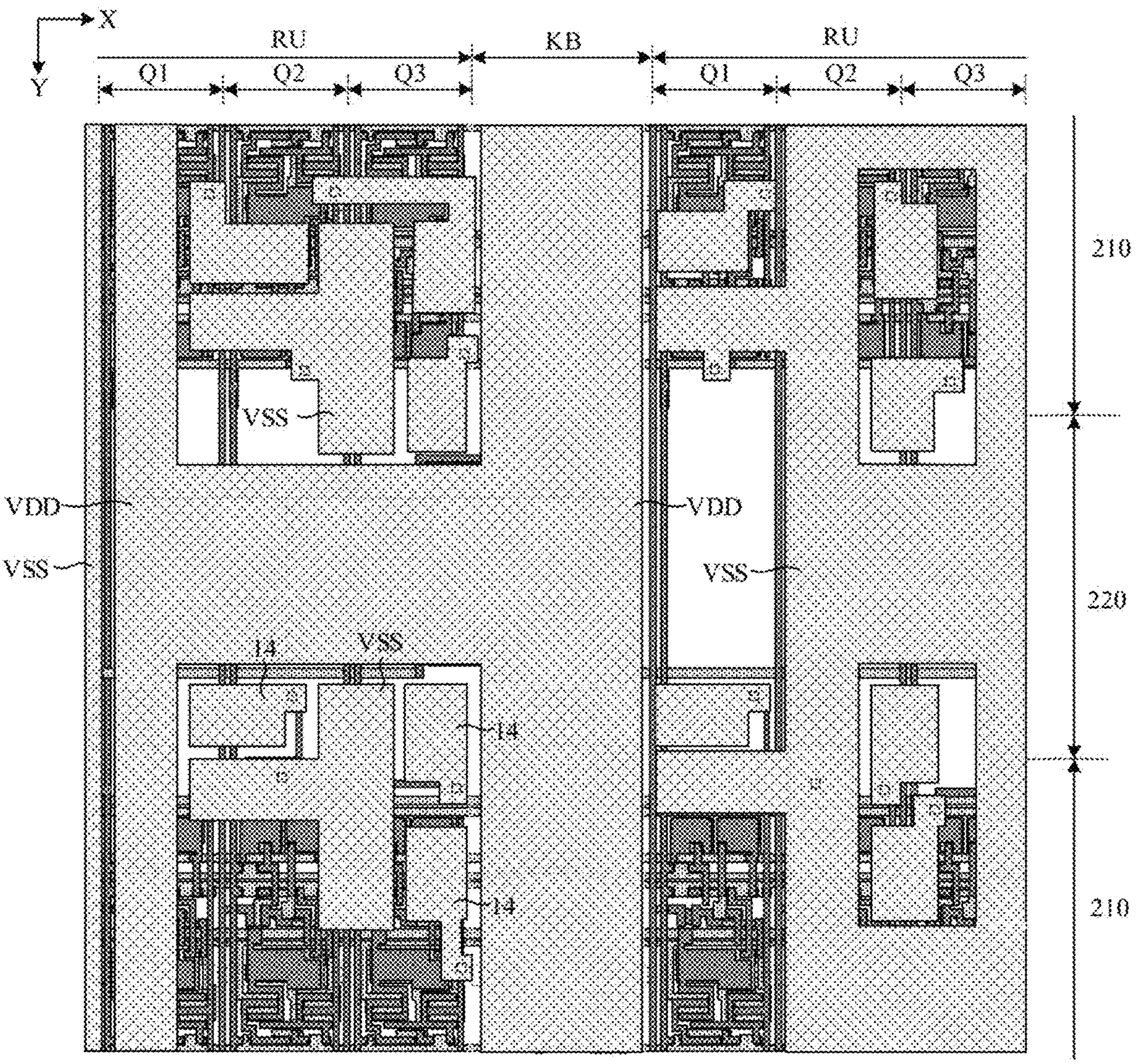
FIGS. 32 and 33 are schematic diagrams of a display substrate after formation of a pattern of a fourth conductive layer according to the present disclosure.
Figure 33:
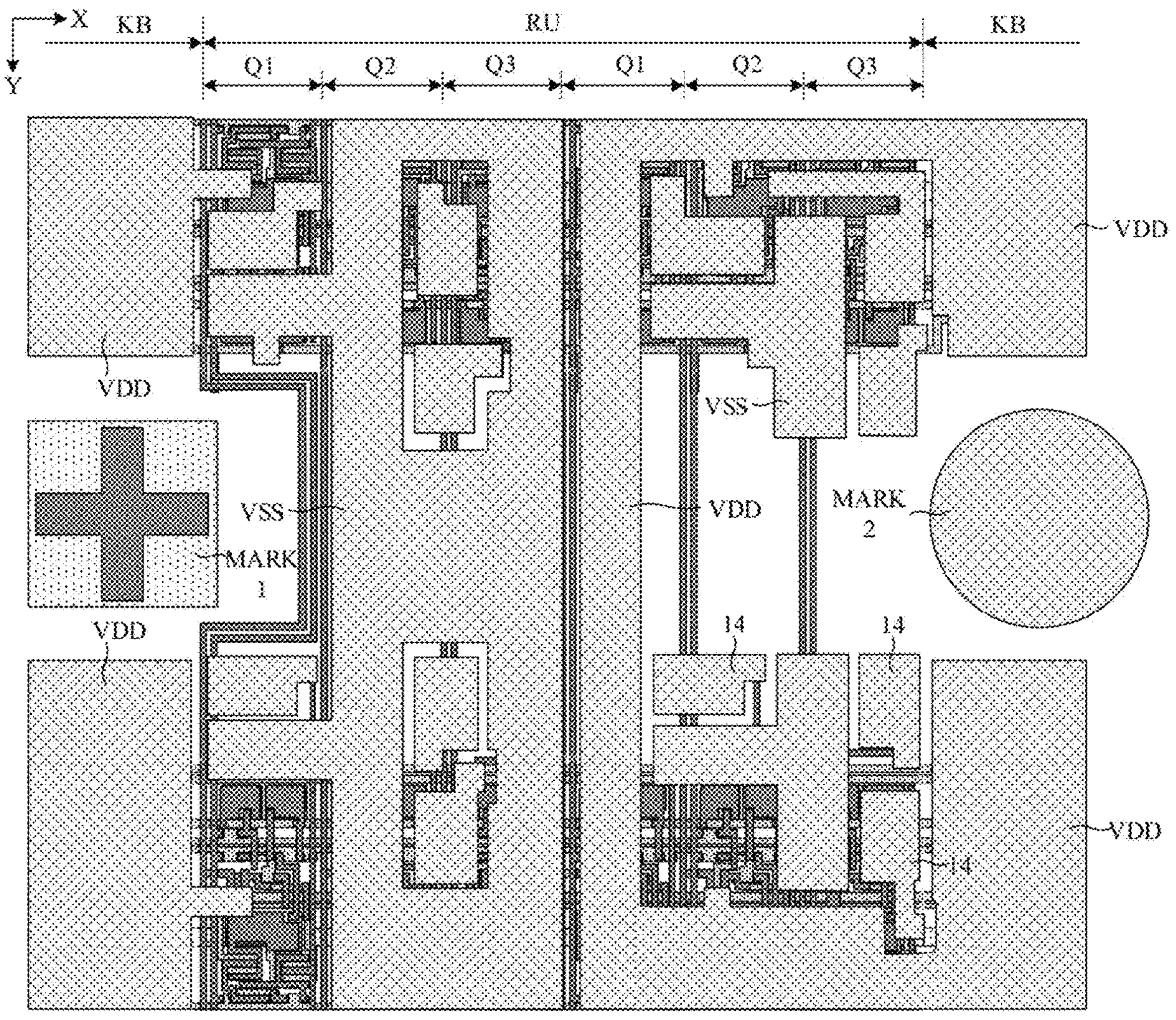

(7) Forming a pattern of a fourth conductive layer. In an exemplary implementation mode, the forming the pattern of the fourth conductive layer may include depositing a fourth conductive thin film on the base substrate on which the aforementioned patterns are formed, and patterning the fourth conductive thin film using a patterning process, to form the pattern of the fourth conductive layer disposed on the fourth insulation layer, as shown in FIGS. 32 and 33, wherein FIG. 32 is a structure of a region A in FIG. 7, and FIG. 33 is a structure of a region B in FIG. 7. In an exemplary implementation mode, the fourth conductive layer may be referred to as a second source-drain metal (SD2) layer.

As shown in FIG. 32, in an exemplary implementation mode, a pattern of a fourth conductive layer of each circuit unit may at least include an anode connection electrode 14, a high voltage power supply line VDD which may be referred to as a first power supply line, and a low voltage power supply line VSS which may be referred to as a second power supply line.

In an exemplary implementation mode, the anode connection electrode 14 may have a rectangular shape, the anode connection electrode 14 is connected with the anode connection block 13 through the ninety-first via V91, and the anode connection electrode 14 is configured such that the anode connection electrode 14 is bonded and connected with a first electrode of a light emitting diode. Since the anode connection block 13 is connected with the twenty-sixth connection electrode CO26, and the twenty-sixth connection electrode CO26 is connected with the second region of the sixth active layer and the second region of the seventh active layer, respectively, a connection of the anode connection electrode 14 with the second electrode of the sixth transistor T6 and the second electrode of the seventh transistor T7 is achieved, and the pixel drive circuit may drive the light emitting diode to emit light.

In an exemplary implementation mode, the high voltage power supply line VDD may have a line shape extending along the second direction Y, and the high voltage power supply line VDD is connected with the thirteenth connection electrode CO13 through the ninety-third via V93 in part of the circuit units. Since the thirteenth connection electrode CO13 is connected with the high voltage connection line VDD-C through a via, the high voltage connection line VDD-C extending along the first direction X and the high voltage power supply line VDD extending along the second direction Y form a mesh communicated structure, which may minimize a resistance of a power supply transmission line, reduce voltage drop of a power supply voltage, effectively improve uniformity of the power supply voltage in the display substrate, effectively improve uniformity in a signal plane, effectively improve display uniformity, and improve display performance and display quality.

In an exemplary implementation mode, a portion of the low voltage power supply line VSS may be in a line shape extending along the second direction Y, the other portion of the low voltage power supply line VSS may be in a "T" shape, and the low voltage power supply line VSS is connected with the twenty-seventh connection electrode CO27 through the ninety-second via V92. Since the twenty-seventh connection electrode CO27 is connected with the low voltage connection line VSS-C through a via, the low voltage connection line VSS-C extending along the first direction X and the low voltage power supply line VSS extending along the second direction Y form a mesh communicated structure, which may minimize a resistance of a power supply transmission line, reduce voltage drop of a power supply voltage, effectively improve uniformity of the power supply voltage in the display substrate, effectively improve uniformity in a signal plane, effectively improve display uniformity, and improve display performance and display quality.

As shown in FIG. 33, in an exemplary implementation mode, the pattern of the fourth conductive layer of the second circuit region 220 may further include a second mark MARK2, which may be located at one side edge or both side edges of the second circuit region 220 in the first direction X and located on a side of the first mark MARK1 close to the gate drive circuit. The second mark MARK2 is configured as a bonding mark, and positioning is performed through the second mark MARK2 when the light emitting diode is bonded and connected.

In an exemplary implementation mode, the second mark MARK2 may have a circular shape, and a setting position of at least one second mark MARK2 in the second circuit region 220 may substantially correspond to a setting position of at least one blank unit KB in a first circuit region 210, that is, the second mark MARK2 may be disposed in a region where a blank column is located.

In an exemplary implementation mode, the pixel drive circuit and its corresponding signal line, as well as the gate drive circuit and its corresponding signal line, all avoid the second mark MARK2. An orthographic projection of the second mark MARK2 on the base substrate is not overlapped with orthographic projections of the pixel drive circuit and the gate drive circuit on the base substrate, and the orthographic projection of the second mark MARK2 on the base substrate is not overlapped with orthographic projections of the first scan signal line, the second scan signal line, the light emitting signal line, the high-frequency signal line, the initial signal line, the data signal line, the first clock signal line, the second clock signal line, the high voltage line, and the low voltage line, etc. on the base substrate.

(8) Forming patterns of a fifth insulation layer and a second planarization layer. In an exemplary implementation mode, the forming the patterns of the fifth insulation layer and the second planarization layer may include: first depositing a fifth insulation thin film on the base substrate on which the aforementioned patterns are formed, patterning the fifth insulation thin film using a patterning process to form a fifth insulation layer covering the pattern of the fourth conductive layer, then coating a second planarization thin film, and patterning the second planarization thin film using a patterning process, to form a second planarization layer disposed on a side of the fifth insulation layer away from the base substrate, wherein a plurality of vias are disposed on the fifth insulation layer and the second planarization layer, as shown in FIGS. 34 and 35, wherein FIG. 34 is a structure of a region A in FIG. 7, and FIG. 35 is a structure of a region B in FIG. 7.

Figure 34:
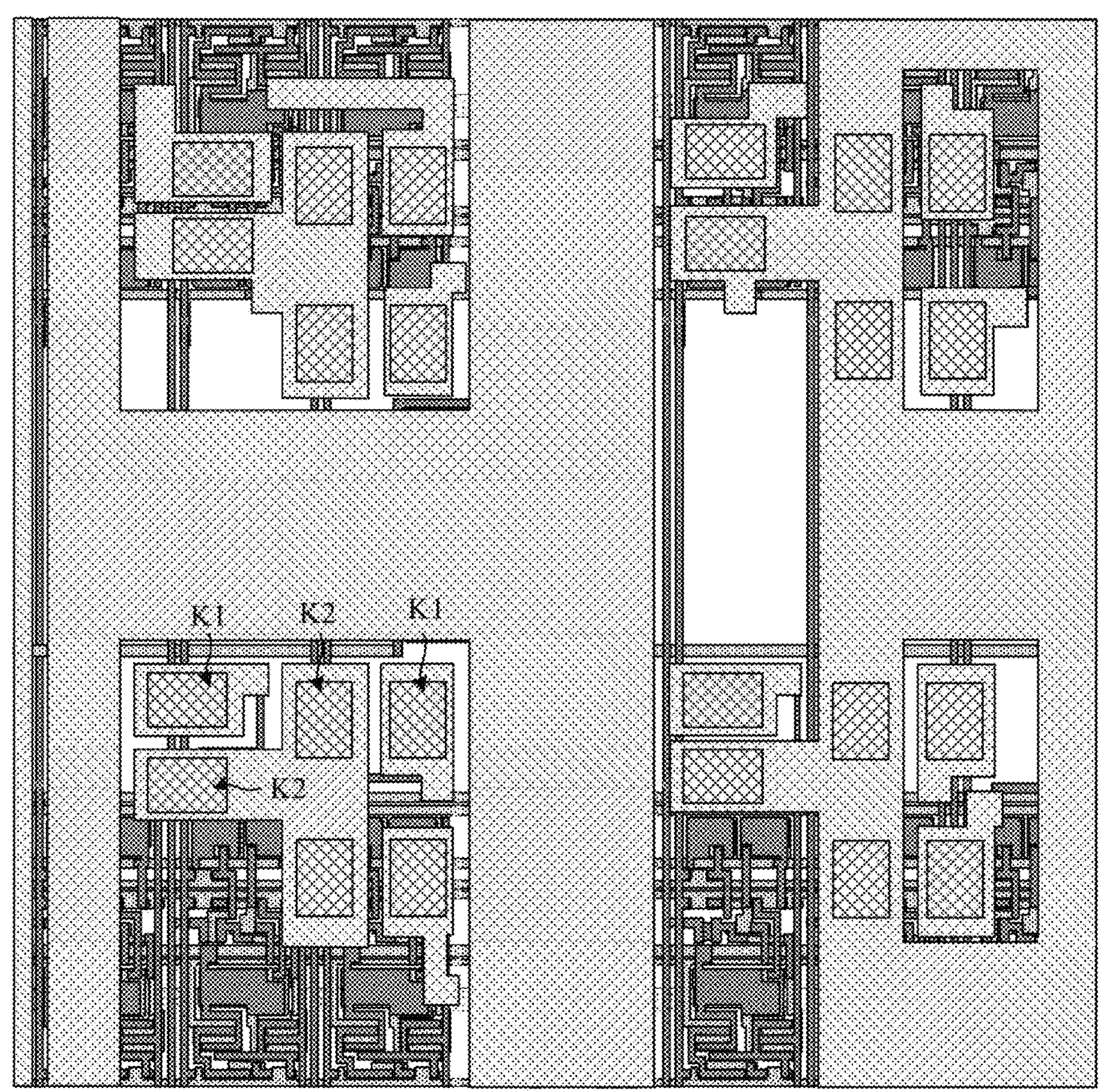
FIGS. 34 and 35 are schematic diagrams of a display substrate after formation of a pattern of a second planarization layer according to the present disclosure.
Figure 35:
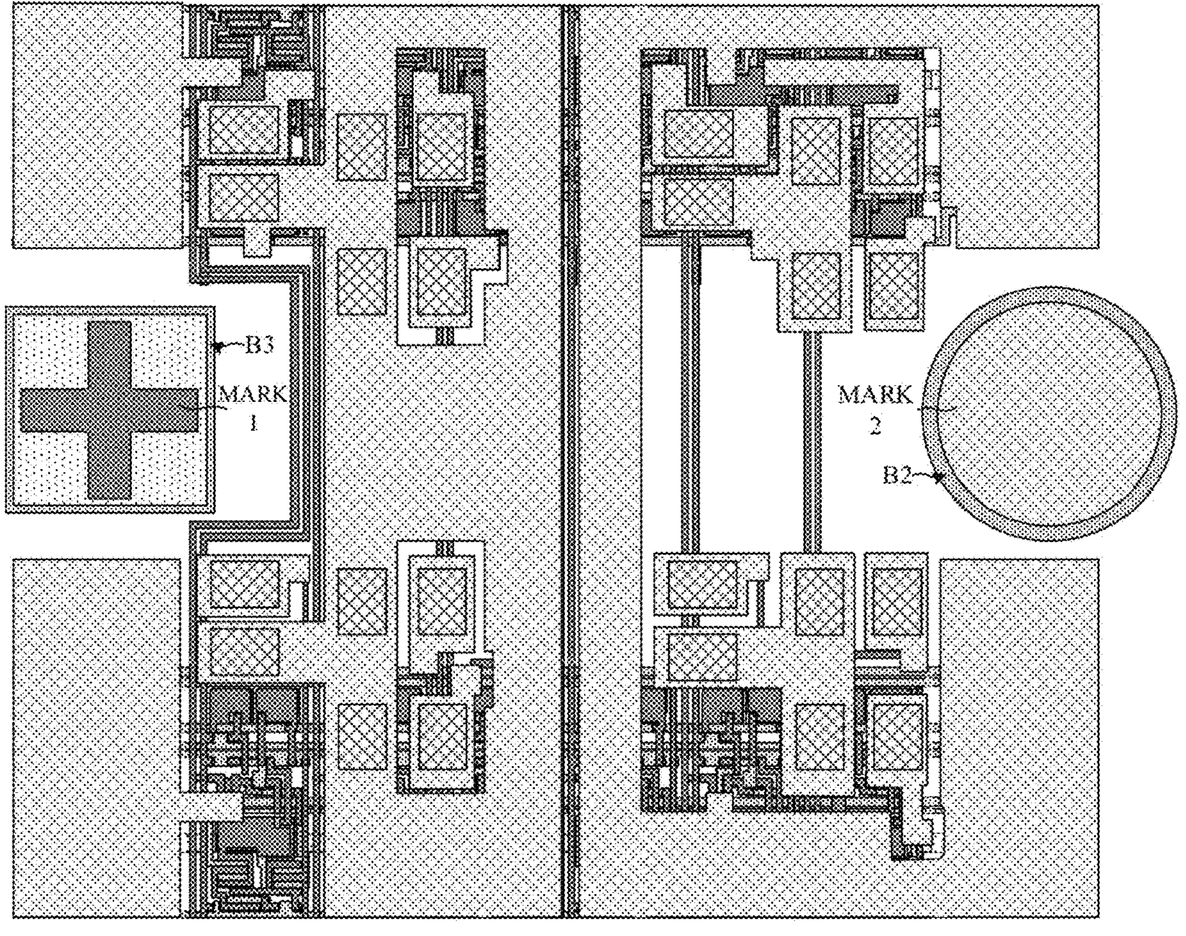

As shown in FIG. 34, in an exemplary implementation mode, a first bonding hole K1 and a second bonding hole K2 are disposed on the fifth insulation layer and the second planarization layer in each circuit unit.

In an exemplary implementation mode, the first bonding hole K1 may have a rectangular shape, an orthographic projection of the first bonding hole K1 on the base substrate is within a range of an orthographic projection of the anode connection electrode 14 on the base substrate, and the second planarization thin film and the fifth insulation thin film in the first bonding hole K1 are removed to expose a surface of the anode connection electrode 14. A region of the anode connection electrode 14 exposed by the first bonding hole K1 may serve as an anode pad, and the first bonding hole K1 is configured such that a first electrode of the light emitting diode is bonded and connected with the anode connection electrode 14 through the bonding hole.

In an exemplary implementation mode, the second bonding hole K2 may have a rectangular shape, an orthographic projection of the second bonding hole K2 on the base substrate is within a range of an orthographic projection of the low voltage power supply line VSS on the base substrate, and the second planarization thin film and the fifth insulation thin film in the second bonding hole K2 are removed to expose a surface of the low voltage power supply line VSS. A region of the low voltage power supply line VSS exposed by the second bonding hole K2 may serve as a cathode pad, and the second bonding hole K2 is configured such that a second electrode of the light emitting diode is bonded and connected with the low voltage power supply line VSS through the bonding hole.

As shown in FIG. 35, in an exemplary implementation mode, a second mark hole B2 and a third mark hole B3 are disposed on the second planarization layer in a region where the first mark MARK1 and the second mark MARK2 are located.

In an exemplary implementation mode, in a process of forming the fifth insulation layer, the fifth insulation layer covers the second mark MARK2 on one hand and covers the fourth insulation layer located on the first mark MARK1 on the other hand. In a process of forming the second planarization layer through the patterning process, a second mark hole B2 is disposed in a region where the second mark MARK2 is located, and a third mark hole B3 is disposed in a region where the first mark MARK1 is located. The second planarization layer in the second mark MARK2 and the third mark hole B3 is removed, to expose the fifth insulation layer covering the first mark MARK1 and the second mark MARK2, respectively. In an exemplary implementation mode, the first mark MARK1 is covered with the fourth insulation layer and the fifth insulation layer, respectively, and the second mark MARK2 is covered with the fifth insulation layer (also referred to as a second passivation layer) to protect the first mark MARK1 and the second mark MARK2.

In an exemplary implementation mode, the second mark hole B2 may have a circular shape, and an orthographic projection of the second mark hole B2 on the base substrate may contain an orthographic projection of the second mark MARK2 on the base substrate.

In an exemplary implementation mode, the third mark hole B3 may have a rectangular shape, and an orthographic projection of the third mark hole B3 on the base substrate may contain an orthographic projection of the first mark MARK1 on the base substrate.

So far, a drive structure layer according to a present exemplary embodiment is prepared on the base substrate. In a plane parallel to the display substrate, the drive structure layer may include multiple circuit units, each of the circuit units may include a pixel drive circuit, and a first scan signal line, a second scan signal line, a light emitting signal line, an initial signal line, a high-frequency signal line, a data signal line, and a high voltage power supply line which are connected with the pixel drive circuit. In a plane perpendicular to the display substrate, the drive structure layer may include a first conductive layer, a first insulation layer, a semiconductor layer, a second insulation layer, a second conductive layer, a third insulation layer, a third conductive layer, a first planarization layer, a fourth insulation layer, a fourth conductive layer, a fifth insulation layer and a second planarization layer which are disposed sequentially on the base substrate.

In an exemplary implementation mode, the base substrate may be a flexible base substrate, or may be a rigid base substrate. The rigid base substrate may include, but is not limited to, one or more of glass and quartz. The flexible base substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In an exemplary implementation mode, the first conductive layer, the second conductive layer, the third conductive layer, and the fourth conductive layer may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, the third insulation layer, the fourth insulation layer, and the fifth insulation layer may be made of any one or more of Silicon Oxide (SiOx), Silicon Nitride (SiNx), and Silicon Oxynitride (SiON), and may be a single layer, a multi-layer, or a composite layer. The first planarization layer and the second planarization layer may be made of an organic material, such as resin. The semiconductor layer may be made of one or more materials, such as amorphous Indium Gallium Zinc Oxide (a-IGZO), Zinc Oxynitride (ZnON), Indium Zinc Tin Oxide (IZTO), amorphous Silicon (a-Si), polycrystalline Silicon (p-Si), hexathiophene, and polythiophene. That is, the present disclosure is applicable to a transistor manufactured based on an oxide technology, a silicon technology, and an organic matter technology. For example, a material of the semiconductor layer may be polycrystalline Silicon (p-Si).

In an exemplary implementation mode, a subsequent preparation process may include: firstly adding a bonding material (such as solder paste) into a plurality of first bonding holes and a plurality of second bonding holes using a glue dispenser, then bonding and connecting first electrodes of a plurality of light emitting diodes with an anode connection electrode through a first bonding hole through a transfer crystal fixing process, then bonding and connecting second electrodes of the plurality of light emitting diodes with a low voltage power supply line through a second bonding hole, and completing a connection between a light emitting diode and a corresponding pixel drive circuit. Subsequently, a covering thin film is coated on the base substrate on which the aforementioned structure is formed, to form a covering layer that covers the plurality of light emitting diodes. In an exemplary implementation mode, the plurality of light emitting diodes and the covering layer may constitute a light emitting structure layer.

As may be seen from a structure and preparation process of the display substrate described above, according to the display substrate provided by the exemplary embodiment of the present disclosure, by disposing a first clock signal line and a second clock signal line in a region where a blank column is located, orthographic projections of the first clock signal line and the second clock signal line on a plane of the display substrate are not overlapped with an orthographic projection of a data signal line on the plane of the display substrate, which effectively avoids generation of an overlapping capacitance between a clock signal line and the data signal line. The overlapping capacitance between two signal lines may be substantially about 0, thereby effectively avoiding occurrence of data voltage jump on the data signal line, and improving display quality. According to the exemplary embodiment of the present disclosure, a high voltage line and a low voltage line are disposed outside the first clock signal line and the second clock signal line, which is equivalent to that a shielding line is disposed between a clock signal line and the data signal line, which effectively reduces an inter-side capacitance between the clock signal line and the data signal line. For a clock signal line and a data signal line having a width of 10 μm and a length of 715 μm, when a distance between two signal lines is 5 μm, a side capacitance between the two signal lines is about 2.8 fF. When a high voltage line or a low voltage line serving as a shielding line is disposed between two signal lines, an inter-side capacitance between the two signal lines is about $3.3*10^{-5}$ fF.

In the present disclosure, a position of the gate drive circuit is disposed, which not only effectively reduces RC delay and increases charging time, but also avoids a wiring pads and an anti-static circuit on both sides of the display substrate, and effectively avoids mutual interference between anti-static circuits of the gate drive circuit. In the present disclosure, by adopting the first capacitor, the second capacitor, and the storage capacitor with a parallel structure, space occupied by the first capacitor, the second capacitor, and the storage capacitor is reduced to a maximum extent on a premise of ensuring a capacity of a capacitor, which is beneficial to achieving high-resolution display. In the present disclosure, the high voltage power supply line and the low voltage power supply line with a mesh communicated structure are formed, which may reduce a resistance of a power transmission line to a maximum extent, reduce voltage drop of a power supply voltage, effectively improve uniformity of the power supply voltage in the display substrate, effectively improve uniformity in a signal plane, effectively improve display uniformity, and improve display performance and display quality. The preparation process in the present disclosure may be compatible well with an existing preparation process, is simple in process implementation, is easy to implement, and has a high production efficiency, a low production cost, and a high yield.

It should be noted that structures and preparation processes shown in exemplary embodiments of the present disclosure are merely exemplary descriptions, and corresponding structures may be changed and patterning processes may be increased or decreased according to actual needs, which are not specifically limited here in the embodiments of the present disclosure.

The display substrate provided by the exemplary embodiment of the present disclosure may be applied to any LED drive pixel circuit, including P-type Pulse Amplitude Modulation (PAM), P-type PAM+Pulse Width Modulation (PWM), N-type PAM, N-type PAM+PWM, LTPO-type PAM, and PAM+PWM circuits, and the like.

Figure 36:
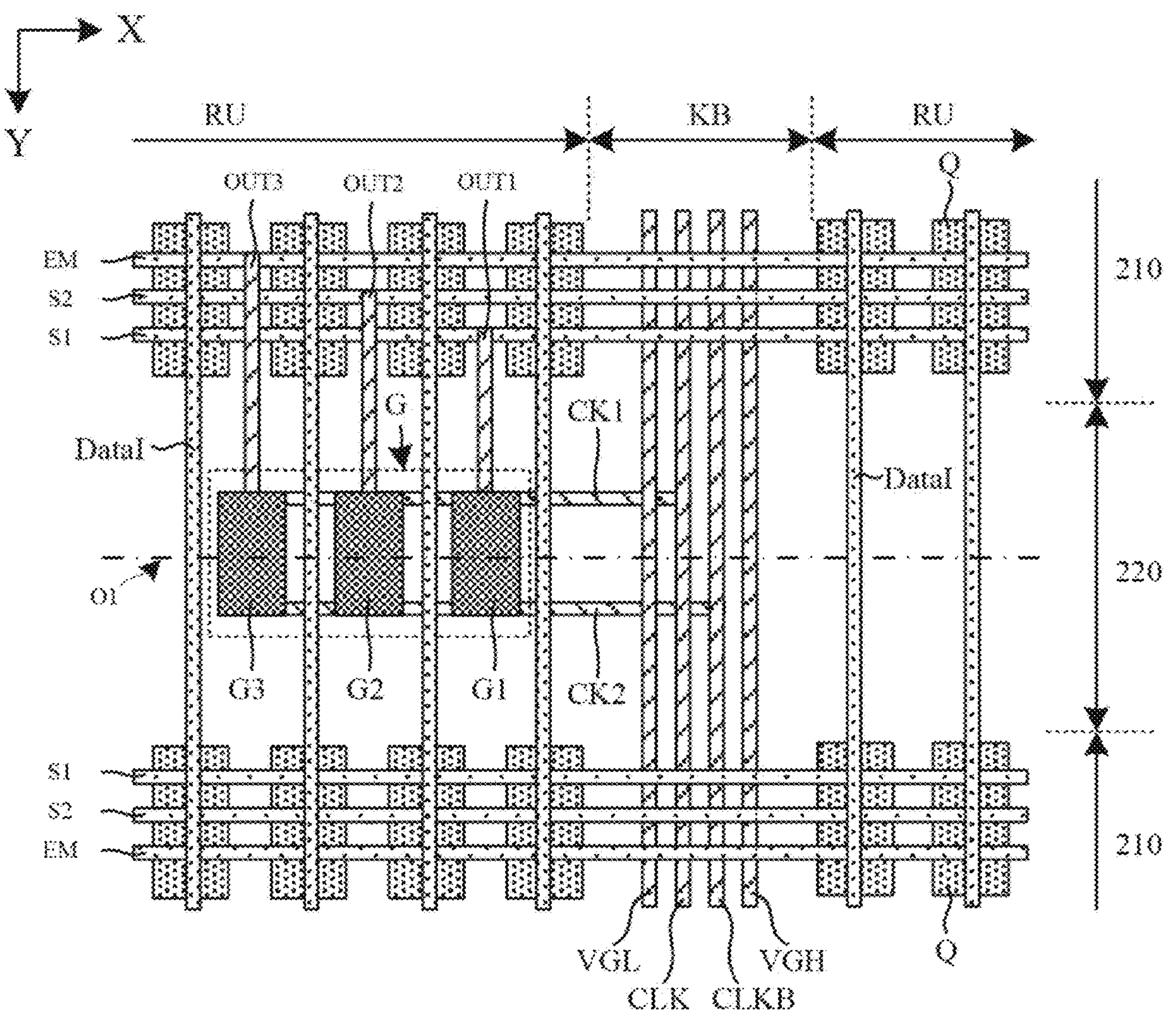
FIG. 36 is a schematic diagram of another gate drive circuit trace according to an exemplary embodiment of the present disclosure.

FIG. 36 is a schematic diagram of another gate drive circuit trace according to an exemplary embodiment of the present disclosure. As shown in FIG. 36, a pixel drive circuit in a circuit unit Q is connected with a data signal line and a drive signal line, and a gate drive circuit in a gate unit G is connected with a first clock signal line, a second clock signal line, a high voltage line, and a low voltage line.

In an exemplary implementation mode, the first clock signal line CLK, the second clock signal line CLKB, the high voltage line VGH, and the low voltage line VGL may have a line shape extending along the second direction Y, and the data signal line DataI may have a line shape extending along the second direction Y. Orthographic projections of the first clock signal line CLK and the second clock signal line CLKB on the plane of the display substrate are not overlapped with an orthographic projection of the data signal line DataI on the plane of the display substrate, and the first clock signal line CLK and the second clock signal line CLKB may be substantially parallel to the data signal line DataI.

In an exemplary implementation mode, a drive signal line of a unit row in a first circuit region 210 may at least include a first scan signal line S1, a second scan signal line S2, and a light emitting signal line EM, and the gate drive circuit in the gate unit G may at least include a first GOA circuit G1 connected with the first scan signal line S1 through a first output line OUT1, a second GOA circuit G2 connected with the second scan signal line S2 through a second output line OUT2, and an EOA circuit G3 connected with the light emitting signal line EM through a third output line OUT3.

In an exemplary implementation mode, the first GOA circuit G1, the second GOA circuit G2, and the EOA circuit G3 in one gate unit G may be disposed sequentially along the first direction X and are respectively connected with the first clock signal line CLK through a first clock connection line CK1, and connected with the second clock signal line CLKB through a second clock connection line CK2.

In an exemplary implementation mode, orthographic projections of the first GOA circuit G1, the second GOA circuit G2, and/or the EOA circuit G3 on a reference line O1 are at least partially overlapped with an orthographic projection of at least one pixel drive circuit on the reference line O1.

In an exemplary implementation mode, orthographic projections of the first GOA circuit G1, the second GOA circuit G2, and/or the EOA circuit G3 on the plane of the display substrate are not overlapped with an orthographic projection of the data signal line DataI on the plane of the display substrate.

In an exemplary implementation mode, orthographic projections of the first GOA circuit G1, the second GOA circuit G2, and/or the EOA circuit G3 on the plane of the display substrate are not overlapped with an orthographic projection of the data signal line DataI on the plane of the display substrate.

In an exemplary implementation mode, the first clock connection line CK1 and the second clock connection line CK2 may have a line shape extending along the first direction X, and orthographic projections of the first clock connection line CK1 and the second clock connection line CK2 on the plane of the display substrate are at least partially overlapped with an orthographic projection of the data signal line DataI on the plane of the display substrate.

In an exemplary implementation mode, since the first clock connection line CK1 and the second clock connection line CK2 transmit clock signals, there is an overlapping capacitance between a clock signal line and a data signal line of the present embodiment. If a voltage of the clock signal line changes to VGH/VGL, a coupling capacitance of the clock signal line and the data signal line is $C_{ck\_cp}$, a load capacitance of the data signal line is $C_{data}$, then voltage jump of the data signal line affected by coupling of the clock signal line is $\Delta V_{data}$.

$$\Delta V_{data} = \frac{C_{ck\_cp}}{C_{data} + C_{ck\_cp}} * (VGH - VGL)$$

After satisfying a Gamma curve, when the voltage jump $\Delta V_{data}$ is less than a voltage level Vstep of two adjacent gray scales, there will be no gray scale difference caused by the voltage jump. That is, a following formula is satisfied.

$$\Delta V_{data} = \frac{C_{ck\_cp}}{C_{data} + C_{ck\_cp}} * (VGH - VGL) < Vstep$$

In an exemplary implementation mode, Vstep is usually about 2 mV to 3 mV, and a difference of VGH-VGL is usually about 20 V, then the coupling capacitor $C_{ck\_cp}$ should be less than $C_{data}$/10 fF.

An exemplary embodiment of the present disclosure proposes a solution for splitting gate units to be suitable for scenarios such as limited space in a second circuit region. Although there is an overlapping capacitance between a clock signal line and a data signal line in the solution, as long as a setting requirement that the coupling capacitance $C_{ck\_cp}$ is less than $C_{data}$/10 fF is satisfied, data voltage jump on the data signal line may be effectively avoided, and display quality may be ensured.

An embodiment of the present disclosure also provides a preparation method of a display substrate to prepare the aforementioned display substrate. In an exemplary implementation mode, the display substrate includes a plurality of first circuit regions and a plurality of second circuit regions alternately disposed along a second direction, a first circuit region includes a plurality of repeat units and a plurality of blank units alternately disposed along a first direction, a repeat unit includes a plurality of circuit units, a second circuit region includes at least one gate unit, the first direction and the second direction intersect; and the preparation method may include forming a pixel drive circuit, and a data signal line and a drive signal line connected with the pixel drive circuit in a circuit unit, and forming at least one gate drive circuit and a clock signal line connected with the gate drive circuit in the gate unit, wherein the gate drive circuit is connected with a drive signal line in an adjacent circuit unit, and an orthographic projection of the data signal line on a plane of the display substrate is not overlapped with an orthographic projection of the clock signal line on the plane of the display substrate.

An exemplary embodiment of the present disclosure also provides a display apparatus, which includes the display substrate of the foregoing embodiments. The display apparatus may be any product or component with a display function, such as a mobile phone, a tablet computer, a television, a display, a laptop computer, a digital photo frame, or a navigator.

The drawings of the present disclosure only involve structures involved in the present disclosure, and other structures may be referred to conventional designs. The embodiments of the present disclosure and features in the embodiments may be combined with each other to obtain new embodiments if there is no conflict. Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising a plurality of first circuit regions and a plurality of second circuit regions alternately disposed along a second direction, wherein:

a first circuit region comprises a plurality of repeat units and a plurality of blank units alternately disposed along a first direction, the first direction and the second direction intersect; a repeat unit comprises a plurality of circuit units, wherein a circuit unit comprises a pixel drive circuit, and a data signal line and a drive signal line connected with the pixel drive circuit; a second circuit region comprises at least one gate unit, the gate unit comprises at least one gate drive circuit connected with a drive signal line in an adjacent circuit unit, and an orthographic projection of the gate drive circuit on a plane of the display substrate is not overlapped with an orthographic projection of the data signal line on the plane of the display substrate;

at least one second circuit region has a reference line that is a straight line bisecting the second circuit region in the second direction and extending along the first direction; and an orthographic projection of at least one gate drive circuit on the reference line is at least partially overlapped with an orthographic projection of at least one blank unit on the reference line; and at least one gate drive circuit is further connected with a clock signal line, a high voltage line, and a low voltage line; in the first direction, the clock signal line is disposed between the high voltage line and the low voltage line, and an orthographic projection of the clock signal line on the plane of the display substrate is not overlapped with the orthographic projection of the data signal line on the plane of the display substrate.

2. The display substrate according to claim 1, wherein in the first direction, the data signal line is disposed on a side of the high voltage line away from the clock signal line, or the data signal line is disposed on a side of the low voltage line away from the clock signal line.

3. The display substrate according to claim 2, wherein in the first direction, there is a first distance between an edge on a side of the high voltage line close to the data signal line and an edge on a side of the data signal line close to the high voltage line, and there is a second distance between an edge on a side of the low voltage line close to the data signal line and an edge on a side of the data signal line close to the low voltage line, and the second distance is greater than the first distance.

4. The display substrate according to claim 3, wherein the first distance is greater than or equal to 25 μm, and the second distance is greater than or equal to 25 μm.

5. The display substrate according to claim 2, wherein on a plane perpendicular to the display substrate, the display substrate comprises a first gate metal layer, a second gate metal layer, a first source-drain metal layer, and a second source-drain metal layer that are sequentially disposed on a base substrate, the drive signal line is disposed in the second gate metal layer, and the data signal line and the clock signal line are disposed in the first source-drain metal layer.

6. The display substrate according to claim 1, wherein the clock signal line comprises a first clock signal line and a second clock signal line, the second clock signal line is disposed on a side of the first clock signal line away from the low voltage line; there is a third distance between an edge on a side of the first clock signal line close to the low voltage line and an edge on a side of the low voltage line close to the first clock signal line, and there is a fourth distance between an edge on a side of the second clock signal line close to the high voltage line and an edge on a side of the high voltage line close to the second clock signal line, and the third distance is greater than the fourth distance.

7. The display substrate according to claim 1, wherein at least one drive signal line is connected with one gate drive circuit, the gate drive circuit is disposed in a first midline region of the second circuit region, and is connected with a first midpoint region of the drive signal line through an output line; the first midline region is a region containing a first midline, the first midpoint region is a region containing a first midpoint, widths of the first midline region and the first midpoint region in the first direction are 1% to 10% of a width of the display substrate, the first midline is a straight line bisecting the second circuit region in the first direction and extending along the second direction, the first midpoint is a point bisecting the drive signal line in the first direction, and the width of the display substrate is a size of the display substrate in the first direction.

8. The display substrate according to claim 7, wherein on a plane perpendicular to the display substrate, the display substrate comprises a first gate metal layer, a second gate metal layer, a first source-drain metal layer, and a second source-drain metal layer that are sequentially disposed on a base substrate, the drive signal line is disposed in the second gate metal layer, and the data signal line and the clock signal line are disposed in the first source-drain metal layer.

9. The display substrate according to claim 1, wherein at least one drive signal line is respectively connected with a first gate drive circuit and a second gate drive circuit, the first gate drive circuit is disposed in a second midline region of the second circuit region and connected with a second midpoint region of the drive signal line through an output line, the second gate drive circuit is disposed in a third midline region of the second circuit region and connected with a third midpoint region of the drive signal line through an output line; the second midline region is a region containing a second midline, the third midline region is a region containing a third midline, the second midpoint region is a region containing a second midpoint, the third midpoint region is a region containing a third midpoint, and widths of the second midline region, the third midline region, the second midpoint region, and the third midpoint region in the first direction X are 1% to 10% of a width of the display substrate; the second circuit region comprises a first midline bisecting the second circuit region in the first direction and extending along the second direction, the first midline divides the second circuit region into a first region and a second region, the second midline is a straight line bisecting the first region in the first direction and extending along the second direction, and the third midline is a straight line bisecting the second region in the first direction and extending along the second direction; the drive signal line comprises a first midpoint bisecting the drive signal line in the first direction, the first midpoint divides the drive signal line into a first line segment and a second line segment, the second midpoint is a point bisecting the first line segment in the first direction, and the third midpoint is a point bisecting the second line segment in the first direction.

10. The display substrate according to claim 1, wherein at least one second circuit region has the reference line that is the straight line bisecting the second circuit region in the second direction and extending along the first direction, and pixel drive circuits in first circuit regions on both sides of the second circuit region in the second direction are mirror-symmetrical with respect to the reference line.

11. The display substrate according to claim 1, wherein at least one second circuit region further comprises at least one first mark, and an orthographic projection of at least one first mark on the reference line is at least partially overlapped with an orthographic projection of at least one blank unit on the reference line.

12. The display substrate according to claim 1, wherein at least one second circuit region further comprises at least one second mark, and an orthographic projection of at least one second mark on the reference line is at least partially overlapped with an orthographic projection of at least one blank unit on the reference line.

13. The display substrate according to claim 1, wherein on a plane perpendicular to the display substrate, the display substrate comprises a first gate metal layer, a second gate metal layer, a first source-drain metal layer, and a second source-drain metal layer that are sequentially disposed on a base substrate, the drive signal line is disposed in the second gate metal layer, and the data signal line and the clock signal line are disposed in the first source-drain metal layer.

14. The display substrate according to claim 13, wherein at least one second circuit region further comprises at least one first mark and at least one second mark, the first mark is disposed in the first source-drain metal layer, and the second mark is disposed in the second source-drain metal layer.

15. The display substrate according to claim 14, wherein the display substrate further comprises a first planarization layer and a first passivation layer, the first planarization layer is disposed on a side of the first source-drain metal layer away from the base substrate, and the first passivation layer is disposed on a side of the first planarization layer away from the base substrate, and the second source-drain metal layer is disposed on a side of the first passivation layer away from the base substrate; the first planarization layer is provided with a first mark hole exposing the first mark, an orthographic projection of the first mark hole on a plane of the base substrate contains an orthographic projection of the first mark on the plane of the base substrate, and the first passivation layer covers the first mark in the first mark hole.

16. The display substrate according to claim 14, wherein the display substrate further comprises a second passivation layer and a second planarization layer, the second passivation layer is disposed on a side of the second source-drain metal layer away from the base substrate, and the second planarization layer is disposed on a side of the second passivation layer away from the base substrate; the second planarization layer is provided with a second mark hole and a third mark hole, the second mark hole exposes the second passivation layer covering the second mark, an orthographic projection of the second mark hole on the plane of the base substrate contains an orthographic projection of the second mark on the plane of the base substrate, the third mark hole exposes the second passivation layer covering the first mark, and an orthographic projection of the third mark hole on the plane of the base substrate contains an orthographic projection of the first mark on the plane of the base substrate.

17. A display apparatus, comprising the display substrate according to claim 1.

18. A preparation method of a display substrate, wherein the display substrate comprises a plurality of first circuit regions and a plurality of second circuit regions alternately disposed along a second direction, a first circuit region comprises a plurality of repeat units and a plurality of blank units alternately disposed along a first direction, a repeat unit comprises a plurality of circuit units, a second circuit region comprises at least one gate unit, the first direction and the second direction intersect; the preparation method comprises:

forming a pixel drive circuit, and a data signal line and a drive signal line connected with the pixel drive circuit in a circuit unit, and forming at least one gate drive circuit and a clock signal line connected with the gate drive circuit in the gate unit, wherein the gate drive circuit is connected with a drive signal line in an adjacent circuit unit, and an orthographic projection of the data signal line on a plane of the display substrate is not overlapped with an orthographic projection of the clock signal line on the plane of the display substrate, wherein at least one second circuit region has a reference line that is a straight line bisecting the second circuit region in the second direction and extending along the first direction; and an orthographic projection of at least one gate drive circuit on the reference line is at least partially overlapped with an orthographic projection of at least one blank unit on the reference line; and wherein at least one gate drive circuit is further connected with a clock signal line, a high voltage line, and a low voltage line; in the first direction, the clock signal line is disposed between the high voltage line and the low voltage line, and an orthographic projection of the clock signal line on the plane of the display substrate is not overlapped with the orthographic projection of the data signal line on the plane of the display substrate.

* * * * *